United States Patent
Xie et al.

(10) Patent No.: US 12,268,031 B2
(45) Date of Patent: Apr. 1, 2025

(54) BACKSIDE POWER RAILS AND POWER DISTRIBUTION NETWORK FOR DENSITY SCALING

(71) Applicant: International Business Machines Corporation, Armonk, NY (US)

(72) Inventors: Ruilong Xie, Niskayuna, NY (US); Kisik Choi, Watervliet, NY (US); Somnath Ghosh, Clifton Park, NY (US); Sagarika Mukesh, Albany, NY (US); Albert Chu, Nashua, NH (US); Albert M. Young, Fishkill, NY (US); Balasubramanian S. Pranatharthiharan, Santa Clara, CA (US); Huiming Bu, Glenmont, NY (US); Kai Zhao, Albany, NY (US); John Christopher Arnold, North Chatham, NY (US); Brent A. Anderson, Jericho, VT (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 531 days.

(21) Appl. No.: 17/562,331

(22) Filed: Dec. 27, 2021

(65) Prior Publication Data
US 2023/0207553 A1 Jun. 29, 2023

(51) Int. Cl.
*H10D 89/10* (2025.01)
*H01L 21/762* (2006.01)
(Continued)

(52) U.S. Cl.
CPC ....... *H10D 89/10* (2025.01); *H01L 21/76229* (2013.01); *H10D 30/6735* (2025.01);
(Continued)

(58) Field of Classification Search
CPC ......... H01L 21/823475; H01L 27/1251; H01L 29/42392; H01L 23/5286; H01L 29/41725;
(Continued)

(56) References Cited

U.S. PATENT DOCUMENTS 9,379,042 B2 6/2016 Park et al.
9,570,395 B1 2/2017 Sengupta et al.
(Continued)

FOREIGN PATENT DOCUMENTS

CN 113299628 A 8/2021
DE 10 2020 114 939 A1 11/2021
(Continued)

OTHER PUBLICATIONS

J. Ryckaert et al.., "Extending the Roadmap Beyond 3nm through System Scaling Boosters: A Case Study on Buried Power Rail and Backside Power Delivery," Electron Devices Technology and Manufacturing Conference (EDTM), 2019, pp. 50-52.
(Continued)

*Primary Examiner* — Andres Munoz
*Assistant Examiner* — Ashley Nicole Blackwell
(74) *Attorney, Agent, or Firm* — Samuel Waldbaum; Ryan, Mason & Lewis, LLP

(57) ABSTRACT

A device comprises a first interconnect structure, a second interconnect structure, a first cell comprising a first transistor, a second cell comprising a second transistor, a first contact connecting a source/drain element of the first transistor to the first interconnect structure, and second contact connecting a source/drain element of the second transistor to the second interconnect structure. The first cell is disposed adjacent to the second cell with the first transistor disposed
(Continued)

adjacent to the second transistor. The first and second cells are disposed between the first and second interconnect structures.

12 Claims, 34 Drawing Sheets

(51) Int. Cl.
*H10D 30/67* (2025.01)
*H10D 62/10* (2025.01)
*H10D 84/01* (2025.01)
*H10D 84/03* (2025.01)
*H10D 84/85* (2025.01)
*H10D 86/40* (2025.01)
*H10D 86/60* (2025.01)

(52) U.S. Cl.
CPC ....... *H10D 62/121* (2025.01); *H10D 84/0149* (2025.01); *H10D 84/038* (2025.01); *H10D 84/85* (2025.01); *H10D 86/471* (2025.01); *H10D 86/60* (2025.01)

(58) Field of Classification Search
CPC ....... H01L 29/66439; H01L 21/823871; H01L 29/78696; H01L 21/76229; H10D 89/10; H10D 30/6735; H10D 62/121; H10D 84/0149; H10D 84/038; H10D 84/85; H10D 86/471; H10D 86/60
See application file for complete search history.

(56) References Cited

U.S. PATENT DOCUMENTS

| | | | |
|---|---|---|---|
| 10,586,765 B2 | 3/2020 | Smith et al. | |
| 10,636,739 B2 | 4/2020 | Beyne et al. | |
| 10,700,207 B2 | 6/2020 | Chen et al. | |
| 10,734,224 B2 | 8/2020 | Smith et al. | |
| 11,830,854 B2 | 11/2023 | Chuang et al. | |
| 12,040,407 B2 | 7/2024 | Chang et al. | |
| 2016/0163585 A1* | 6/2016 | Xie | H01L 21/76802 257/368 |
| 2020/0075574 A1 | 3/2020 | Smith et al. | |
| 2020/0091149 A1* | 3/2020 | Lee | B82Y 10/00 |
| 2020/0105671 A1 | 4/2020 | Lai et al. | |
| 2020/0266169 A1 | 8/2020 | Kang et al. | |
| 2020/0373240 A1 | 11/2020 | Vadi | |
| 2021/0118798 A1 | 4/2021 | Liebmann et al. | |
| 2021/0376155 A1 | 12/2021 | Chang et al. | |
| 2022/0037519 A1* | 2/2022 | Hsu | H01L 29/66439 |
| 2022/0140128 A1 | 5/2022 | Morrow et al. | |
| 2022/0157786 A1 | 5/2022 | Chuang et al. | |
| 2022/0238442 A1 | 7/2022 | Sio et al. | |
| 2022/0254811 A1 | 8/2022 | Iida et al. | |
| 2023/0246016 A1 | 8/2023 | Sio et al. | |
| 2024/0030189 A1* | 1/2024 | Chuang | H01L 24/80 |

FOREIGN PATENT DOCUMENTS

| | | |
|---|---|---|
| DE | 10 2020 122 828 A1 | 12/2021 |
| DE | 10 2021 112 652 A1 | 7/2022 |
| DE | 10 2020 121 728 A1 | 8/2022 |
| JP | 6399887 B2 | 10/2018 |
| WO | 2017052630 A1 | 3/2017 |
| WO | 2021090471 A1 | 5/2021 |
| WO | PCT/IB2022/061284 | 3/2023 |

OTHER PUBLICATIONS

R. Mathur et al., "Buried Bitline for sub-5nm SRAM Design," 2020 IEEE International Electron Devices Meeting (IEDM), 2020, pp. 20.2.1-20.2.4.
A. Gupta et al., "Buried Power Rail Scaling and Metal Assessment for the 3 nm Node and Beyond," in IEEE International Electron Devices Meeting, 2020, 3 pages.
A. Gupta et al., "High-Aspect-Ratio Ruthenium Lines for Buried Power Rail," IEEE International Interconnect Technology Conference (IITC), Jun. 4-7, 2018, pp. 4-6.
D. Prasad et al., "Buried Power Rails and Back-side Power Grids: Arm CPU Power Delivery Network Design Beyond 5nm," 2019 IEEE International Electron Devices Meeting (IEDM), Dec. 7-11, 2019, pp. 19.1.1-19.1.4.
V. Moroz et al., "Can We Ever Get to a 100 nm Tall Library? Power Rail Design for 1nm Technology Node," 2020 IEEE Symposium on VLSI Technology, Jun. 16-19, 2020, 2 pages.
A. Gupta et al., "Buried Power Rail Integration with Si FinFETs for CMOS Scaling beyond the 5 nm Node," 2020 IEEE Symposium on VLSI Technology, Jun. 16-19, 2020, 2 pages.
A. Mallik et al., "Economics of Semiconductor Scaling—A Cost Analysis for Advanced Technology Node," 2019 Symposium on VLSI Technology Digest of Technical Papers, Jun. 9-14, 2019, pp. T202-T203.
E. Beyne, "The 3-D Interconnect Technology Landscape," IEEE Design & Test, vol. 33, No. 3, May/Jun. 2016, pp. 8-20.
B. Chava et al., "Backside Power Delivery as a Scaling Knob for Future Systems," SPIE Advanced Lithography, vol. 10962, Mar. 20, 2019, 6 pages.
Counterpart German Patent Application No. 11 2022 005 536.7, Office Action with English language translation dated Aug. 9, 2024, 18 pages.
M. Eckstein, "Roadmap of Logic Technology, Part 1-CMOS: On the Way to the 1-nm Process Node," https://www.elektronikpraxis.de/cmos-auf-dem-weg-zum-1-nm-prozessknoten-a-1f78556120315c6756cd30558a924839/, Oct. 14, 2021, 9 pages.

* cited by examiner

400

400

BACKSIDE POWER RAILS AND POWER DISTRIBUTION NETWORK FOR DENSITY SCALING

BACKGROUND

This disclosure relates generally to techniques for density scaling of semiconductor integrated circuits and, in particular, techniques for reducing cell-to-cell spacing and cell height of standard cells such as standard CMOS (complementary metal-oxide semiconductor) cells. Typically, complex logic designs are constructed using standing cells, built up from standard cells. As such, the continued scaling of logic is achieved by decreasing the size of standard cells. Continued innovations in semiconductor process technologies are enabling higher integration densities and device scaling. As the semiconductor industry moves towards the 7-nm technology node and beyond, non-planar semiconductor field-effect transistor (FET) device structures such as nanosheet FET devices, nanowire FET devices, vertical FET devices, Fin-type FET devices, etc., have enabled FET devices to be scaled to smaller dimensions (smaller footprint) while providing increased device width (or FET channel width) and thus, increased drive current, per given footprint area. While the scaling of FET devices and other structural-level scaling boosters allows for cell height reduction of standard cells, such reduction in cell height leads to a decrease in the number of pin access points for connection to power and signal wiring of a back-end-of-line (BEOL) interconnect structure, which, in turn, can limit block-level area scaling due to poor routeability.

Power is supplied to a semiconductor chip by a power delivery network, which includes a network of vias and are wiring connected to positive power supply (VDD) and negative power supply (VS S) terminals of the chip for delivering power to the integrated circuitry on the semiconductor chip. In some conventional semiconductor integrated circuit designs, VDD and VSS power rails, which are part of the power delivery network, are implemented in lower layers (e.g., Mint and M1 layers) of a back-end-of-line (BEOL) interconnect structure. Such designs provide scaling challenges with respect to, e.g., reducing cell-to-cell spacing because a sufficient amount lateral cell spacing (e.g., N-N spacing, or P-P spacing) must be present between FET devices of adjacent cells to prevent shorting of the adjacent source/drain contacts of the adjacent FET devices of adjacent cells, which are connected to the power rails in lower layer of the BEOL interconnect structure. Therefore, higher density integrated designs suffer from congestion in the BEOL circuit interconnect design, which can create reliability issues.

In some conventional semiconductor integrated circuit designs, buried power rails are utilized as a structural scaling booster to reduce standard cell height for increased integration density. For example, buried power rails (e.g., buried VDD rails and buried VSS rails) can be fabricated as part of the front-end-of-line (FEOL) to free up space for signal tracks in the Mint and M1 layers of the BEOL interconnect structure (and thereby allow for reduced cell height), and to provide lower resistive local distribution of power in highly integrated designs which suffer from increased BEOL resistance with pitch scaling. However, integrating buried power rails within the FEOL process module to achieve higher density scaling is challenging for various reasons.

For example, in some conventional schemes, buried power rails are formed as part of a FEOL process module by etching trenches in a semiconductor substrate in cell boundary regions between adjacent cells, and filling the trenches with liner and metallic material to form high aspect ratio buried power rails (BPRs) in the front-side of the semiconductor substrate. Such schemes result in the formation of relatively thin buried power rails, e.g., 5 nanometers (nm), in instances where the cell-to-cell spacing is 50 nm or less, which results in buried power rails with relatively high resistance. Moreover, such conventional designs further involve forming frontside via contacts to the buried power rails (VBPRs) to connect the buried power rails to frontside source/drain contacts which are formed as part of a middle-of-the-line (MOL) process module. As such, these designs provide scaling challenges with respect to, e.g., reducing cell height and cell-to-cell spacing because a sufficient amount lateral cell spacing (e.g., N-N spacing, and P-P spacing) must be present between adjacent FET devices of adjacent cells to provide sufficient room for the via contacts which connect frontside source/drain contacts to the buried power rails, while preventing such via contacts shorting to source/drain contacts of adjacent FET devices of adjacent cells. As such, VBPRs comprise high aspect ratio via contacts (e.g., narrow and tall), which provide relatively high resistance connections between the frontside source/drain contacts and BPRs. Furthermore, conventional designs which implement FEOL buried power rails with front-side power delivery from higher metal levels of BEOL interconnect structure require additional frontside via contacts to be formed as part of the MOL module to provide connections from the buried power rails to the BEOL interconnect structure.

Furthermore, some conventional semiconductor integrated circuit designs utilize buried power rails in conjunction with power delivery provided by a backside power distribution network. While such conventional designs allow for backside processing to increase the size of the buried power rails, such designs still utilize frontside via contacts to connect the buried power rails to the to connect the buried power rails to frontside MOL source/drain contacts which are formed as part of a middle-of-the-line (MOL) process module. As such, these designs provide scaling challenges with respect to, e.g., reducing cell height and cell-to-cell spacing because a sufficient amount lateral cell spacing (e.g., N-N spacing, and P-P spacing) must be present between adjacent FET devices of adjacent cells to provide sufficient room for the via contacts which connect frontside source/drain contacts to the buried power rails, while preventing such via contacts from shorting to the source/drain contacts of adjacent FET devices of adjacent cells.

SUMMARY

Exemplary embodiments will now be described in further detail with regard semiconductor integrated circuit devices which are configured to reduce cell-to-cell spacing and cell height of standard cells such as standard CMOS cells, and methods for fabricating such semiconductor devices.

For example, an exemplary embodiment comprises a device which comprise a first interconnect structure, a second interconnect structure, a first cell comprising a first transistor, a second cell comprising a second transistor; a first contact connecting a source/drain element of the first transistor to the first interconnect structure, and second contact connecting a source/drain element of the second transistor to the second interconnect structure. The first cell is disposed adjacent to the second cell with the first transistor disposed adjacent to the second transistor. The first and second cells are disposed between the first and second interconnect structures.

Advantageously, the implementation of the second interconnect structure and the connection of first contact to the first interconnect structure and the second contact to the second interconnect structure avoids potential short circuit connections between the first and second contacts as the cell-to-cell spacing between the adjacent first and second transistors is reduced.

Another exemplary embodiment comprises a device, which comprises a first cell comprising a first transistor, a second cell comprising a second transistor, and an isolation structure. The first and second cells are disposed adjacent to each other with the first and second transistors disposed adjacent to each other. The isolation structure is disposed in a cell boundary region between the first and second cells. The isolation structure comprises a first portion disposed above first and second active channel structures of the respective first and second transistors, and a second portion disposed between the first and second active channel structures. The first portion of the isolation structure comprises a first width which is substantially equal to a spacing between the first and second active channel structures. The second portion of the isolation structure comprises a second width which is less than the first width. A space between the second portion of the isolation structure and each of the first and second active channel structures defines a gate extension length of the first and second transistors.

Advantageously, the implementation of the isolation structure disposed in the cell boundary region between the first and second cells allows for reduction in the cell-to-cell spacing between the first and second cells. In some embodiments, the isolation structure is formed using a self-aligned process which allows precise control of the thickness and alignment of the dielectric isolation between the adjacent first and second active channel structures of the first and second transistors of the first and second cells, as well as precise control of gate extensions of the first and second transistors. The implementation of the isolation structure disposed in the cell boundary region between the first and second cells allows for a relaxed tolerance of a late gate cut process that may be implemented to isolate metal gate electrodes between adjacent cells without affecting the well-defined cell-to-cell spacing that exists between the adjacent first and second cells by virtue of the lower narrower portion of the self-aligned isolation structure.

Another exemplary embodiment comprises a device which comprises a first cell comprising a first transistor, and a second cell comprising a second transistor. The first and second cells are disposed adjacent to each other. The first and second transistors comprise a forksheet field-effect transistor pair with an insulating wall disposed between the first and second transistors. The insulating wall is aligned to a cell boundary between the first and second cells. A width of the insulating wall defines a cell-to-cell spacing between the first and second cells.

Advantageously, the implementation of the forksheet field-effect transistor pair with the insulating wall aligned to the cell boundary between the first and second cells allows for reduction in the cell-to-cell spacing between the first and second cells. In some embodiments, the insulating wall is formed using a self-aligned process which allows precise control of the thickness and alignment of the insulating wall, and thus, precise control of the dielectric isolation in the cell boundary region between the forksheet field-effect transistor pair. The implementation of the insulating wall disposed in the cell boundary region between the first and second cells allows for a relaxed tolerance of a late gate cut process that may be implemented to isolate metal gate electrodes between adjacent cells without affecting the well-defined cell-to-cell spacing that exists between the adjacent first and second cells by virtue of the insulating wall of the forksheet field-effect transistor pair aligned to the cell boundary between the first and second cells.

Another exemplary embodiment comprises a method for fabricating a semiconductor device. First and second cells are formed on a substrate. The first cell comprises a first transistor, and the second cell comprises a second transistor. The first and second cells are disposed adjacent each other with the first and second transistors disposed adjacent to each other. A first contact is formed which connects to a source/drain element of the first transistor. A first interconnect structure is formed which is connected to the first contact. The substrate is etched to form an opening that exposes a backside of a source/drain element of the second transistor. A second contact is formed in the opening which connects to the source/drain element of the second transistor. A second interconnect structure is formed which is connected to the second contact.

Another exemplary embodiment comprises a method for fabricating a semiconductor device. First and second nanosheet channel structures of respective first and second transistors are formed on a substrate. The first and second nanosheet channel structures are disposed adjacent to each other and separated by a space that defines a cell-to-cell spacing between first and second cells which comprise the respective first and second transistors. Conformal sacrificial spacer layers are formed on adjacent sidewalls of the first and second nanosheet channel structures. A dielectric isolation structure is formed between the conformal sacrificial spacer layers on the sidewalls of the first and second nanosheet channel structures. The conformal sacrificial spacer layers on the sidewalls of the first and second nanosheet channel structures are selectively etched away to form spaces between the dielectric isolation structure and the sidewalls of the first and second nanosheet channel structures, wherein the spaces define a gate extension length of the first and second transistors. The spaces are filled with metallic material to form first and second metal gate structures of the respective first and second transistors.

Other embodiments will be described in the following detailed description of embodiments, which is to be read in conjunction with the accompanying figures.

BRIEF DESCRIPTION OF THE DRAWINGS

FIGS. 2-8 schematically illustrate a method for fabricating the semiconductor integrated circuit device of FIGS. 1A and 1B, according to an embodiment of the invention, wherein:

FIG. 2 is a schematic cross-sectional side view of an initial device structure of the semiconductor integrated circuit device at an initial stage of fabrication comprising a semiconductor substrate, an insulating layer, and a nanosheet stack structure formed on the insulating layer, according to an exemplary embodiment of the disclosure;

FIG. 7 is a schematic cross-sectional side view of a next intermediate structure of the semiconductor integrated circuit device, which is constructed by forming a first interconnect structure (e.g., a BEOL interconnect structure) on a frontside of the intermediate device structure of FIGS. 6A, 6B, and 6C, according to an exemplary embodiment of the disclosure; and FIG. 8 is a schematic cross-sectional side view of a next intermediate structure of the semiconductor integrated circuit device, which is constructed by performing a backside process module to form backside source/drain contacts and a second interconnect structure comprising a full backside power delivery structure on a backside of the intermediate device structure of FIG. 7, according to an exemplary embodiment of the disclosure.

FIGS. 11-16C schematically illustrate a method for fabricating the semiconductor integrated circuit device of FIGS. 10A and 10B, according to an exemplary embodiment of the disclosure, wherein:

FIG. 11 is a schematic cross-sectional side view of intermediate device structure of the semiconductor integrated circuit device at an intermediate stage of fabrication, which comprises a semiconductor substrate, an insulating layer, a plurality of patterned nanosheet stack structures disposed on the insulating layer, and hard mask layers disposed on top of the patterned nanosheet stack structures, according to an exemplary embodiment of the disclosure;

FIG. 12 is a schematic cross-sectional side view of a next intermediate structure of the semiconductor integrated circuit device, which is constructed by forming sacrificial spacer layers on sidewalls of the patterned nanosheet stack structures, according to an exemplary embodiment of the disclosure;

FIG. 13 is a schematic cross-sectional side view of a next intermediate structure of the semiconductor integrated circuit device, which is constructed by forming self-aligned dielectric isolation elements between the patterned nanosheet stack structures, according to an exemplary embodiment of the disclosure;

FIGS. 16A, 16B, and 16C are schematic views of a next intermediate structure of the semiconductor integrated circuit device, which is constructed by performing a late gate cut process to form upper gate cut elements on the self-aligned dielectric isolation elements to isolate metal gate structures of the transistor devices in adjacent cells, according to an exemplary embodiment of the disclosure.

FIGS. 18-20 schematically illustrate a method for fabricating the semiconductor integrated circuit device of FIGS. 17A and 17B, according to an exemplary embodiment of the disclosure, wherein:

FIG. 18 is a schematic cross-sectional side view of an intermediate structure of the semiconductor integrated circuit device at an intermediate stage of fabrication, which comprises a semiconductor substrate, an insulating layer, a plurality of patterned nanosheet stack structures disposed on the insulating layer, and hard mask layers disposed on top of the patterned nanosheet stack structures, according to an exemplary embodiment of the disclosure;

FIG. 19 is a schematic cross-sectional side view of a next intermediate structure of the semiconductor integrated circuit device, which is constructed by forming sacrificial spacer layers on sidewalls of the patterned nanosheet stack structures, and further patterning the nanosheet stack structures to form nanosheet channel structures for transistor pairs of forksheet transistors, according to an exemplary embodiment of the disclosure; and FIG. 20 is a schematic cross-sectional side view of a next intermediate structure of the semiconductor integrated circuit device, which is constructed by forming self-aligned dielectric isolation elements between the patterned nanosheet stack structures, according to an exemplary embodiment of the disclosure.

DETAILED DESCRIPTION

Figure 1A:
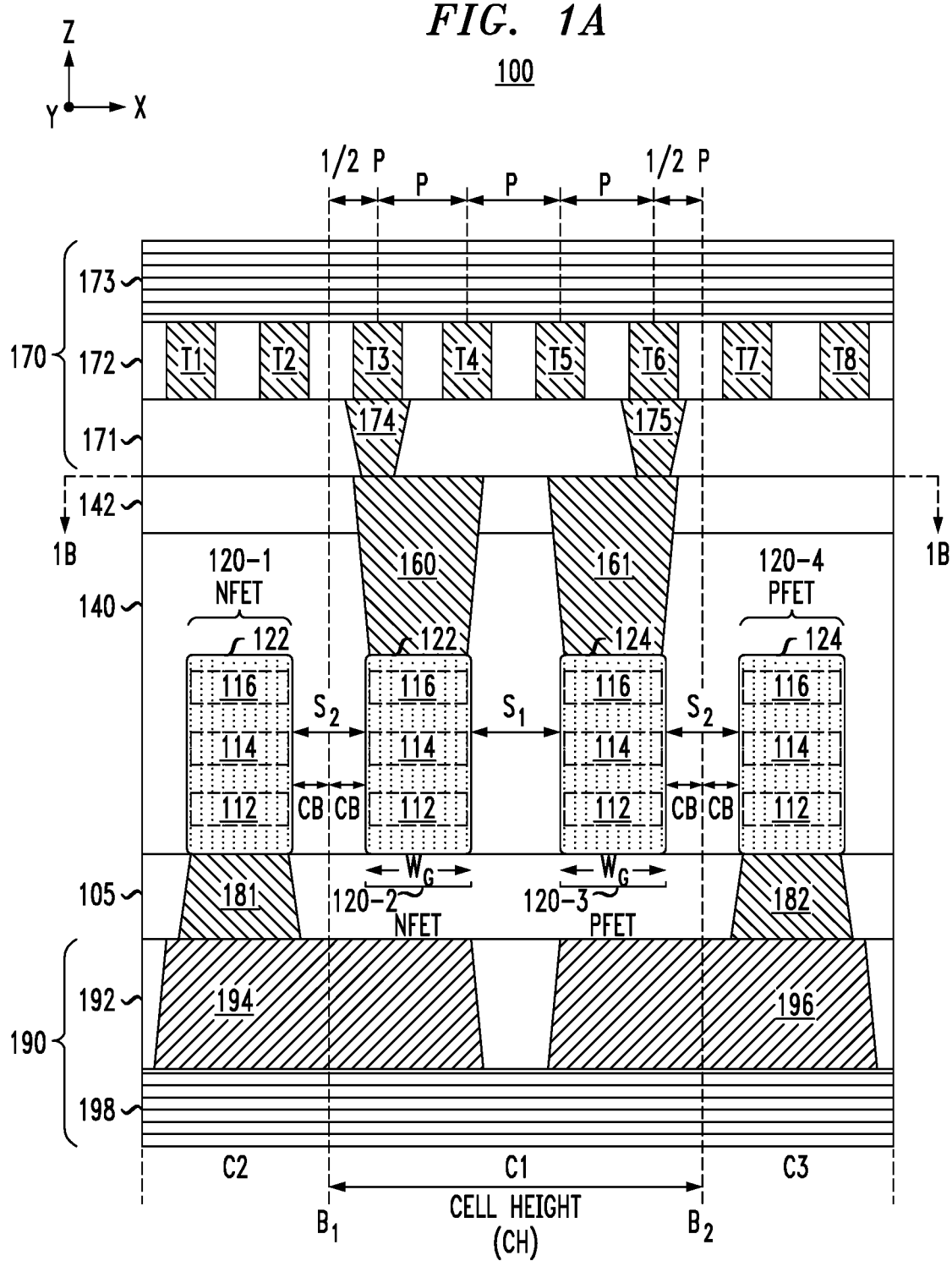
FIGS. 1A and 1B are schematic views of a semiconductor integrated circuit device which implements backside power rails and a backside power distribution network to enable density scaling, according to an exemplary embodiment of the disclosure.

Exemplary embodiments will now be described in further detail with regard semiconductor integrated circuit devices which comprise a backside power distribution network, backside power rails, and backside source/drain contacts, to reduce cell-to-cell spacing and cell height of standard cells such as standard CMOS cells, and methods for fabricating such semiconductor devices. For illustrative purposes, exemplary embodiments of the invention will be discussed in the context of complementary transistor structures comprising nanosheet FET devices. It is to be understood, however, that the exemplary embodiments discussed herein are readily applicable to various types of gate-all-around (GAA) FET devices such nanowire FETs, and other types of GAA FET devices having gate structures that are formed around all sides of active channel layers. Moreover, the exemplary techniques disclosed herein can be implemented with fin-type FET (FinFET) devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the same or similar reference numbers are used throughout the drawings to denote the same or similar features, elements, or structures, and thus, a detailed explanation of the same or similar features, elements, or structures will not be repeated for each of the drawings. Further, the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. The word "over" as used herein to describe forming a feature (e.g., a layer) "over" a side or surface, means that the feature (e.g., the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
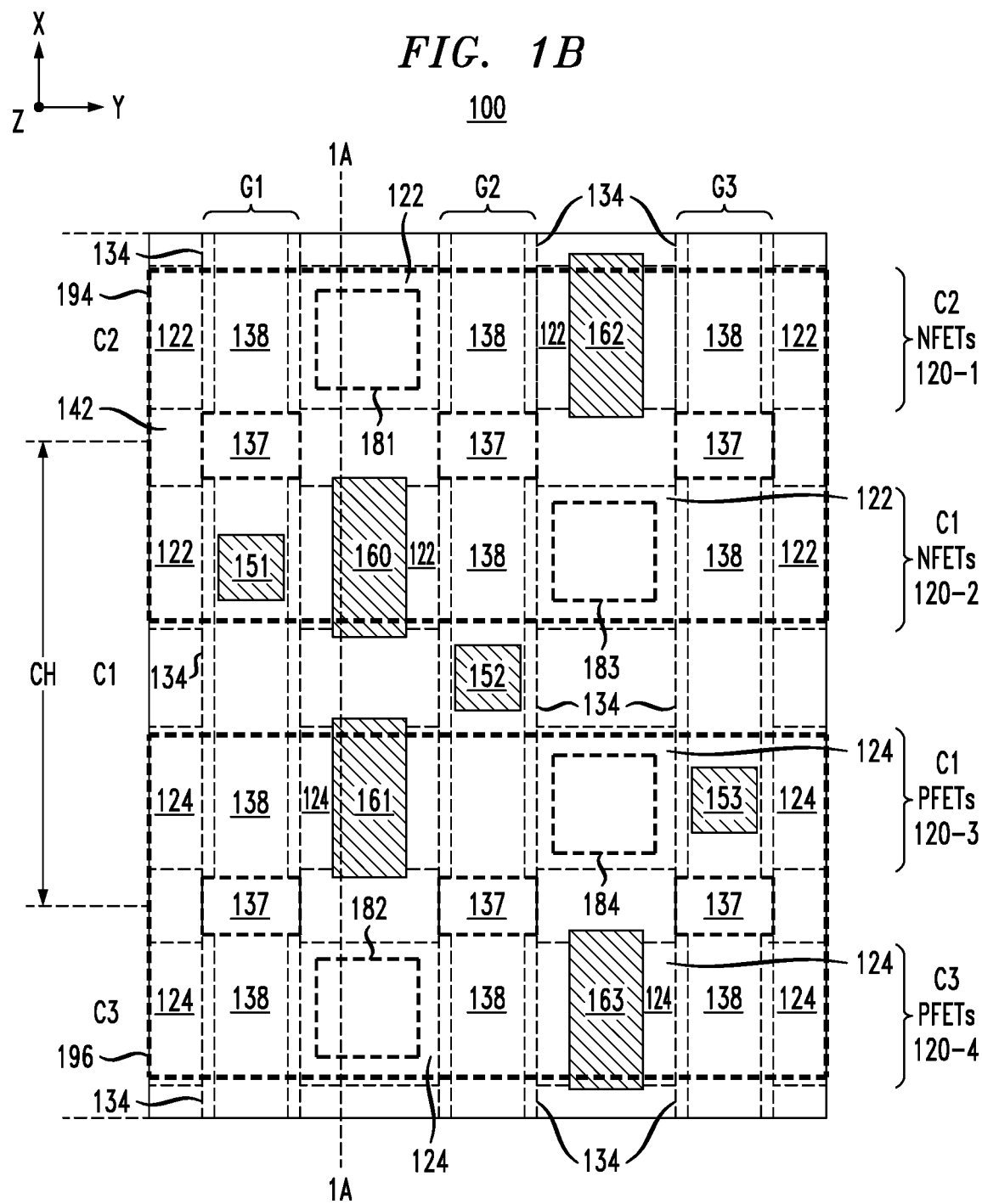

FIGS. 1A and 1B are schematic views of a semiconductor integrated circuit device 100 which implements backside power rails and a backside power distribution network to enable density scaling, according to an exemplary embodiment of the disclosure. More specifically, FIG. 1A is schematic cross-sectional side view (X-Z plane) of the semiconductor integrated circuit device 100 along line 1A-1A of FIG. 1B, and FIG. 1B is a schematic top plan view of the semiconductor device along line 1B-1B in FIG. 1A. The semiconductor integrated circuit device 100 comprises a plurality of cells including a first cell C1, a second cell C2, and a third cell C3. For ease of illustration, FIGS. 1A and 1B show a full cell height CH the first cell C1, and half the cell heights of the second and third cells C2 and C3. The first cell C1 is disposed between the second and third cells C2 and C3. In the exemplary embodiments discussed herein, the cells C1, C2, and C3, comprise CMOS cells.

The cells C1, C2, and C3 comprise a plurality of nanosheet FET devices 120-1, 120-2, 120-3, and 120-4, which are disposed on an insulating substrate layer 105 (e.g., buried oxide (BOX) layer 105). In some embodiments, the nanosheet FET devices 120-1 and 120-2 comprise N-type nanosheet FET devices (NFET devices), and the nanosheet FET devices 120-3 and 120-4 comprise P-type nanosheet FET devices (PFET devices). More specifically, in the exemplary embodiment shown in FIGS. 1A and 1B, the second cell C2 comprises a plurality of NFET devices 120-1 (with adjacent PFET devices of the cell C2 not shown), the first cell C1 comprises a plurality of NFET devices 120-2 and a plurality of PFET devices 120-3, and the third cell C3 comprises a plurality of PFET devices 120-4 (with adjacent NFET devices of the cell C3 not shown). The NFET devices 120-1 and 120-2 comprise source/drain elements 122, and the PFET devices 120-3 and 120-4 comprises source/drain elements 124.

As further shown in FIG. 1B, the semiconductor integrated circuit device 100 comprises a plurality of gate structures G1, G2, and G3 which extend in an X-direction across the cells C1, C2, and C3. In some embodiments, the gate structures G1, G2, and G3 comprise replacement metal gate (RMG) structures, e.g., high-k metal gate (HKMG) structures, which are encapsulated by gate sidewall spacers 134, gate cut elements 137, and gate capping layers 138. In an exemplary embodiment as shown in FIG. 1B, the NFET devices 120-2 of the first cell C1 share a common metal gate structure with adjacent ones of the PFET devices 120-3. The gate structures G1, G2, and G3 of the different cells C1, C2, and C3 are isolated by the gate cut elements 137 which are formed in the cell boundary regions between adjacent cells.

In an exemplary embodiment, the nanosheet FET devices 120-1, 120-2, 120-3, and 120-4 each comprise a stacked nanosheet channel structure comprising three active nanosheet channel layers 112, 114, and 116 (see FIG. 1A). In particular, the NFET devices 120-1 and 120-2 each comprise a stacked nanosheet channel structure which is encapsulated by a respective metal gate structure, and connected to source/drain elements 122 on opposite sides of the gate structures G1, G2, and G3. Similarly, the PFET devices 120-3 and 120-4 each comprise a stacked nanosheet channel structure which is encapsulated by a respective metal gate structure, and disposed between source/drain elements 124 on opposite sides of the gate structures G1, G2, and G3.

As further shown in FIGS. 1A and 1B, a frontside of the semiconductor integrated circuit device 100 comprises a first insulating layer 140, a second insulating layer 142, frontside gate contacts 151, 152, and 153, frontside source/drain contacts 160, 161, 162, and 163, and a BEOL interconnect structure 170. The BEOL interconnect structure 170 comprise multiple levels of wiring, and via structures which connect the wiring between different wiring levels. For example, as shown in FIG. 1A, the BEOL interconnect structure 170 comprises dielectric layers 171 and 172 which comprise a first metallization level, and additional BEOL metallization levels 173 disposed over the first level of metallization.

More specifically, the dielectric layer 171 comprises a plurality of via contacts 174 and 175 formed therein, and the dielectric layer 172 comprises a first metallization level M1 (or initial metallization level sometimes denoted M0 or Mint) which comprises a plurality of metal tracks T1, T2, T3, T4, T5, T6, T7, and T8 which have a given pitch P. In some embodiments, the metal tracks T1-T8 provide local interconnects that distribute signals to, from, and between the nanosheet FET devices 120-1, 120-2, 120-3, and 120-4, while some upper metal levels 173 of the BEOL interconnect structure 170 comprise semi-global and global wiring. As shown in FIG. 1A, the via contacts 174 and 175 connect the respective frontside source/drain contacts 160 and 161 to the respective metal tracks T3 and T6 the first metallization level. Although not specifically shown, the dielectric layer 171 comprises other via contacts that connect the gate contacts 151, 152, and 153, and the source/drain contacts 162 and 163 to metal tracks of the first metallization level.

As further shown in FIGS. 1A and 1B, a backside of the semiconductor integrated circuit device 100 comprises backside source/drain contacts 181, 182, 183, and 184 (which are formed in the insulating substrate layer 105), and a full backside power delivery structure 190. The backside power delivery structure 190 comprises a backside dielectric layer 192 formed on the insulating substrate layer 105, a plurality of backside power rails 194 and 196 formed in the backside dielectric layer 192, and a backside power distribution network 198. In the exemplary embodiment of FIGS. 1A and 1B, the backside source/drain contacts 181 and 183 connect source/drain elements 122 of NFET devices of the cells C1 and C2 to the backside power rail 194, and the backside source/drain contacts 182 and 184 connect source/drain elements 124 of PFET devices of the cells C1 and C3 to the backside power rail 194.

The backside power distribution network 198 comprises one or more levels wiring that are configured to distribute positive power supply voltage (e.g., VDD) and negative power supply voltage (e.g., VSS, ground (GND)=0V) to the backside power rails 194 and 196. For example, in an exemplary embodiment, the backside power distribution network 198 connects negative supply voltage (VSS) to the backside power rail 194, and connects positive supply voltage (VDD) to the backside power rail 196. In this configuration, the backside source/drain contacts 181 and 184 (which are connected to the backside power rail 194) connect some source/drain elements 122 of some NFET devices in the first and second cells C1 and C2 to VSS (or ground), and the backside source/drain contacts 182 and 184 connect some source/drain elements 124 of some PFET devices in the first and third cells C1 and C3 to VDD.

It is to be understood that the exemplary layout of the CMOS cells C1, C2, and C3, and the configuration of the frontside and backside source/drain contacts, etc., as shown in FIGS. 1A and 1B is presented for illustration purposes. The layout of the CMOS cells C1, C2, and C3, and the configuration of the frontside and backside source/drain contacts will vary depending on the type of standard CMOS cells that are implemented for a given circuit configuration, and the type of semiconductor technology used (e.g., nanosheet FET devices, FinFET devices, etc.). For example, the CMOS cells C1, C2, and C3 may comprise standard cells which comprise groups of transistors and interconnect structures which provide Boolean logic functions (e.g., AND, NAND, OR, NOR, XOR, etc.), storage functions (e.g., latches, flip-flops, etc.), or more complex standard cells (macro cells) such as adders, multiplexers, memory, etc.

FIGS. 1A and 1B illustrates an exemplary embodiment in which the cells C1, C2, and C3 comprise a 4-track cell height (CH). It is to be noted that the term "cell height" of a standard cell as used herein denotes a number of parallel tracks (e.g., metal tracks) which are disposed between a first cell boundary and a second cell boundary, wherein a distance between the first and second cell boundaries defines the cell height of a standard cell. For example, as shown in FIG. 1A, vertical dashed lines are shown to delineate a first cell boundary $B_1$ between the cells C1 and C2, and a second cell boundary $B_2$ between the cells C1 and C3. With regard to the metal tracks T3, T4, T5, and T6 with pitch P, the cell height (CH) of the first cell is ½P+P+P+½P=4P (e.g., 4 metal tracks).

As further shown in FIG. 1A, another way to define the cell height (CH) of the first cell C1 is CH=2CB+$S_1$+2$W_G$, where $S_1$ denotes an N-to-P spacing between the NFET device 120-2 and the PFET device 120-3 of the cell C1, where CB denotes a cell boundary space which is ½$S_2$ (where $S_2$ denotes a cell-to-cell spacing between adjacent cells), and where $W_G$ denotes a gate width of the NFET device 120-2 and the PFET device 120-3 of the cell C1 (wherein it is assumed that the gate widths $W_G$ of the NFET device and PFET devices are equal). The cell-to-cell spacing $S_2$ between the adjacent cells C1 and C2 represents an N-to-N spacing between the stacked nanosheet channel layers of the NFET device devices 120-1 and 120-2, and the cell-to-cell spacing $S_2$ between the adjacent cells C1 and C3 represents a P-to-P spacing between the stacked nanosheet channel layers of the PFET device devices 120-3 and 120-4.

The exemplary device architecture shown in FIGS. 1A and 1B enables a reduction in the cell-to-cell spacing $S_2$ between the adjacent cells for higher density integration while avoiding potential shorts between source/drain contacts FET devices in adjacent cells. A reduction in the cell-to-cell spacing $S_2$ between the adjacent cells results in smaller cell boundary spacing CB between cells and, thus, a reduction in the cell height of the cells. Indeed, as shown in FIG. 1A, a source/drain element 122 of the NFET device 120-1 of the cell C2 is connected to the backside power delivery structure 190 through the backside source/drain contact 181, while a source/drain element 122 of the adjacent NFET device 120-2 of the adjacent cell C1 is connected to the frontside BEOL interconnect structure 170 through the frontside contact 160. In addition, a source/drain element 124 of the PFET device 120-4 of the cell C3 is connected to the backside power delivery structure 190 through the backside source/drain contact 182, while a source/drain element 124 of the adjacent PFET device 120-3 of the adjacent cell C1 is connected to the frontside BEOL interconnect structure 170 through the frontside contact 161. This configuration allows scaling of the cell-to-cell spacing $S_2$ while preventing shorts of the source/drain contacts of adjacent transistors of adjacent cells.

The exemplary device architecture shown in FIGS. 1A and 1B provides various advantages over the conventional structures discussed above. For example, as noted above, conventional designs which utilize a BEOL interconnect structure for both signal and power delivery suffer from congestion and poor routeability due to the congestion the MOL source/drain contacts that connect the FEOL source/drain elements to the BEOL interconnect structure. In addition, scaling the cell-to-cell spacing between adjacent cells is limited in that a sufficient amount of cell-to-cell spacing is needed to prevent shorting of the frontside source/drain contacts that are connected to source/drain elements of adjacent transistors of the adjacent cells.

Further, as noted above, some conventional designs utilize frontside buried power rails that are formed in a semiconductor substrate below the transistors of the cells, wherein contact to the buried power rails is achieved by laterally extending a frontside source/drain contact, and connecting the extended portion of the frontside source/drain contact to the buried power rail with a FEOL via which extends down between the adjacent transistors to the buried power rail. For example, in a conventional device configuration comprising the cell architecture in FIG. 1A, the backside power rails 194 and 196 would relatively narrow power rails disposed within a semiconductor substrate, and the backside source/drain contacts 181 and 182 would not be utilized.

Instead, the source/drain element 122 of the NFET device 120-1 of the cell C2 would be connected to a buried power rail by forming a frontside MOL source/drain contact in the ILD layers 140 and 142 with an extended portion that overlaps a portion of the spacing $S_2$ between the cells C1 and C1, and a via contact would connect the extended portion of the MOL source/drain contact with the buried power rail. In this instance, the via contact would be disposed in the space $S_2$ between the cells C2 and C1. Similarly, the source/drain element 124 of the PFET device 120-4 of the cell C3 would be connected to a buried power rail by forming a frontside MOL source/drain contact in the ILD layers 140 and 142 with an extended portion that overlaps a portion of the spacing $S_2$ between the cells C1 and C3, and a via contact would connect the extended portion of the MOL source/drain contact with the buried power rail. In this instance, the via contact would be disposed in the space $S_2$ between the cells C3 and C1. The need to form via contacts in the spaces $S_2$ between adjacent cells places a significant restriction on the cell-to-cell scaling. In addition, the use of the extended portions of the frontside source/drain contacts and corresponding via contacts can result is contact shorting and increased parasitic coupling between adjacent FET devices in adjacent cells, as the cell-to-cell spacing is reduced.

Figure 2:
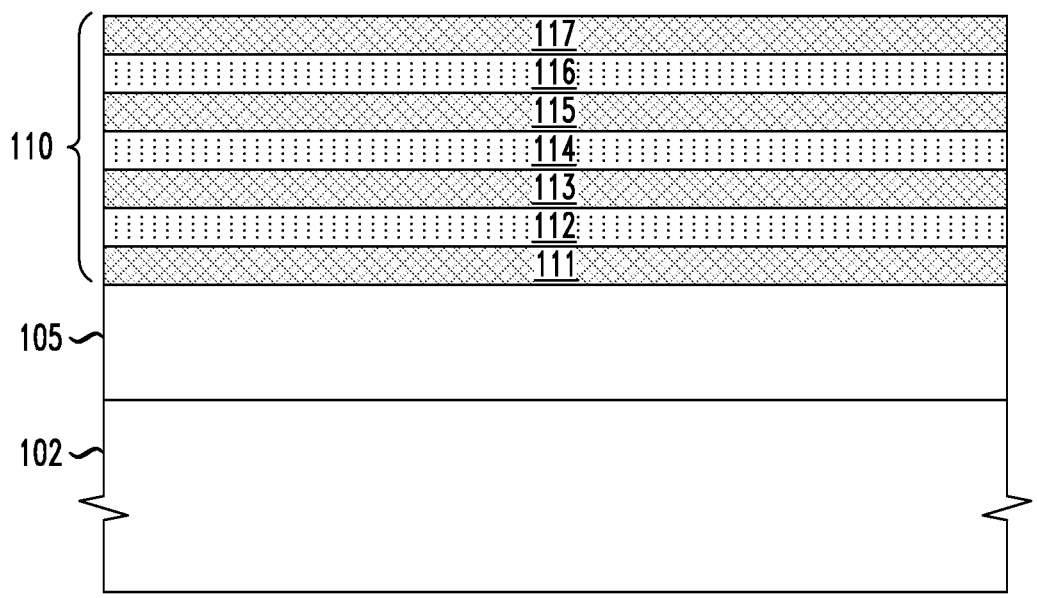

FIGS. 2-8 schematically illustrate a method for fabricating a semiconductor integrated circuit device which comprises backside power rails and a backside power distribution network, according to an exemplary embodiment of the disclosure. In particular, for illustrative purposes, FIGS. 2-8 schematically illustrate a method for fabricating the semiconductor integrated circuit device 100 of FIGS. 1A and 1B. To begin, FIG. 2 is a schematic cross-sectional side view (X-Z plane) of an initial device structure of the semiconductor integrated circuit device at an initial stage of fabrication comprising a semiconductor substrate 102, an insulating layer 105, and a nanosheet stack structure 110 formed on the insulating layer 105. The nanosheet stack structure 110 comprises a stack of epitaxial semiconductor layers 111, 112, 113, 114, 115, 116, and 117, which is subsequently patterned to form a plurality of nanosheet FET devices. In particular, the nanosheet stack structure 110 comprises sacrificial nanosheet layers 111, 113, 115, and 117, and active nanosheet channel layers 112, 114, and 116, wherein each active nanosheet channel layer 112, 114, and 116 is disposed between sacrificial nanosheet layers in the nanosheet stack structure 110.

While the semiconductor substrate 102 is illustrated as a generic substrate layer, it is to be understood that the semiconductor substrate 102 may comprise one of different types of semiconductor substrate structures and materials. For example, in some embodiments, the semiconductor substrate 102 is a bulk semiconductor substrate (e.g., wafer) that is formed of crystalline semiconductor material including, but not limited to, silicon (Si), germanium (Ge), or other types of semiconductor substrate materials that are commonly used in bulk semiconductor fabrication processes such as a silicon-germanium alloy, compound semiconductor materials (e.g., III-V), etc. It is to be noted that in each drawing, the X-Y plane represents a plane that is parallel to the plane of the semiconductor substrate 102 (e.g., wafer) being processed.

In some embodiments, in some embodiments, the semiconductor substrate 102 is a semiconductor-on-insulator (SOI) substrate, wherein the insulating layer 105 is a buried oxide (BOX) layer of the SOI substrate. For example, in some embodiments, the SOI substrate 102 may comprise a layer of single crystalline silicon separated from a bulk substrate by a thin BOX layer 105. In some embodiments, the first sacrificial semiconductor layer 111 (or sacrificial nanosheet layer 111) is formed by converting the single crystalline silicon layer on the BOX layer 104 to an SiGe layer. More specifically, in some embodiment, the conversion process can be done by thinning the single crystalline silicon layer, followed by growing epitaxy SiGe over the single crystalline silicon layer, followed by SiGe condensation to covert the thin Si/SiGe layer to SiGe layer capped with SiO2. Finally, the SiO2 is removed and remaining SiGe layer becomes the first sacrificial layer 111.

The epitaxial semiconductor layers of the nanosheet stack structure 110 are sequentially grown. For example, the active nanosheet channel layer 112 is epitaxially grown on the sacrificial nanosheet layer 111, the sacrificial nanosheet layer 113 is epitaxially grown on the active nanosheet channel layer 112, the active nanosheet channel layer 114 is epitaxially grown on the sacrificial nanosheet layer 113, the sacrificial nanosheet layer 115 is epitaxially grown on the active nanosheet channel layer 114, the active nanosheet channel layer 116 is epitaxially grown on the sacrificial nanosheet layer 115, and the sacrificial nanosheet layer 117 is epitaxially grown on the active nanosheet channel layer 116.

In some embodiments, the epitaxial semiconductor layers of the nanosheet stack structure 110 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RTCVD), low-energy plasma deposition (LEPD), ultra-high vacuum chemical vapor deposition (UHVCVD), atmospheric pressure chemical vapor deposition (APCVD), or other known epitaxial growth techniques which are suitable for the given process flow.

The types of materials that are utilized to form the epitaxial semiconductor layers 111-117 of the nanosheet stack 110 will depend on various factors such as the type of nanosheet FET devices (p-type, or n-type), and the desired level of etch selectivity between the semiconductor layers, as well as provide sufficient lattice matching between the materials of the semiconductor layers to ensure proper (e.g., defect-free) epitaxial growth of the crystalline semiconductor layers. For example, in some embodiments, the active nanosheet channel layers 112, 114, and 116 of the nanosheet stack structure 110 are formed of epitaxial silicon (or crystalline Si).

When the active nanosheet channel layers 112, 114, and 116 are formed of crystalline Si, the sacrificial nanosheet layers 111, 113, 115, and 117 (which serve as sacrificial layers that are subsequently etched away to release the active nanosheet channel layers 112, 114, and 116), can be formed of an epitaxial silicon-germanium (SiGe) alloy. This allows the epitaxial SiGe material of the sacrificial nanosheet layers 111, 113, 115, and 117 to be etched selective to the epitaxial Si material of the active nanosheet channel layers 112, 114, and 116 in a subsequent process step to "release" the active nanosheet channel layers 112, 114, and 116. In other embodiments, the active nanosheet channel layers 112, 114, and 116 can be formed of an epitaxial SiGe material with a desired Ge concentration (optimized for device performance), and the sacrificial nanosheet layers 111, 113, 115, and 117 can be formed of a sacrificial semiconductor material (e.g., Si) that can be etched selective to the active nanosheet channel layers 112, 114, and 116. While the nanosheet stack structure 110 is shown to include three active nanosheet channel layers 112, 114, and 116, in other embodiments of the invention, the nanosheet stack structure 110 can be fabricated with more than three active nanosheet channel layers.

The thickness of the sacrificial nanosheet layers 111, 113, and 115 of the nanosheet stack structure 110 defines a spacing size (or channel spacing) above and below the active nanosheet channel layers 112, 114, and 116 in which high-k dielectric material and work function metal is subsequently formed. The spacing size and the type of work function material(s) disposed in the spaces above and below the active nanosheet channel layers 112, 114, and 116 defines, in part, the threshold voltage (Vt) of the nanosheet FET devices. In some embodiments, the thickness of the sacrificial nanosheet layers 111, 113, 115, and 117 is in a range of about 6 nm to about 20 nm.

Figure 3A:
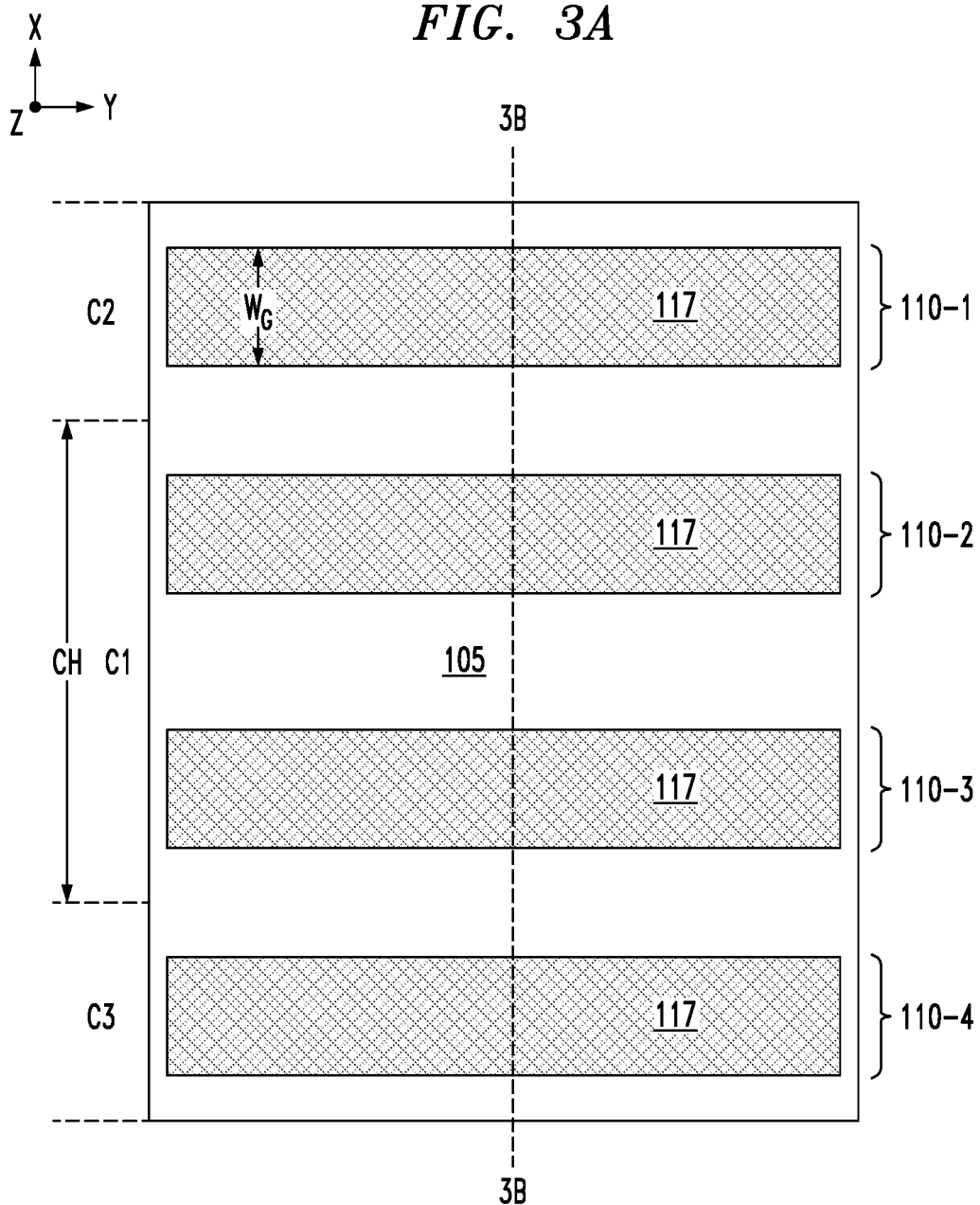
FIGS. 3A and 3B are schematic views of a next intermediate structure of the semiconductor integrated circuit device, which is constructed by patterning the nanosheet stack structure of FIG. 2 to form patterned nanosheet stack structures, according to an exemplary embodiment of the disclosure.
Figure 3B:
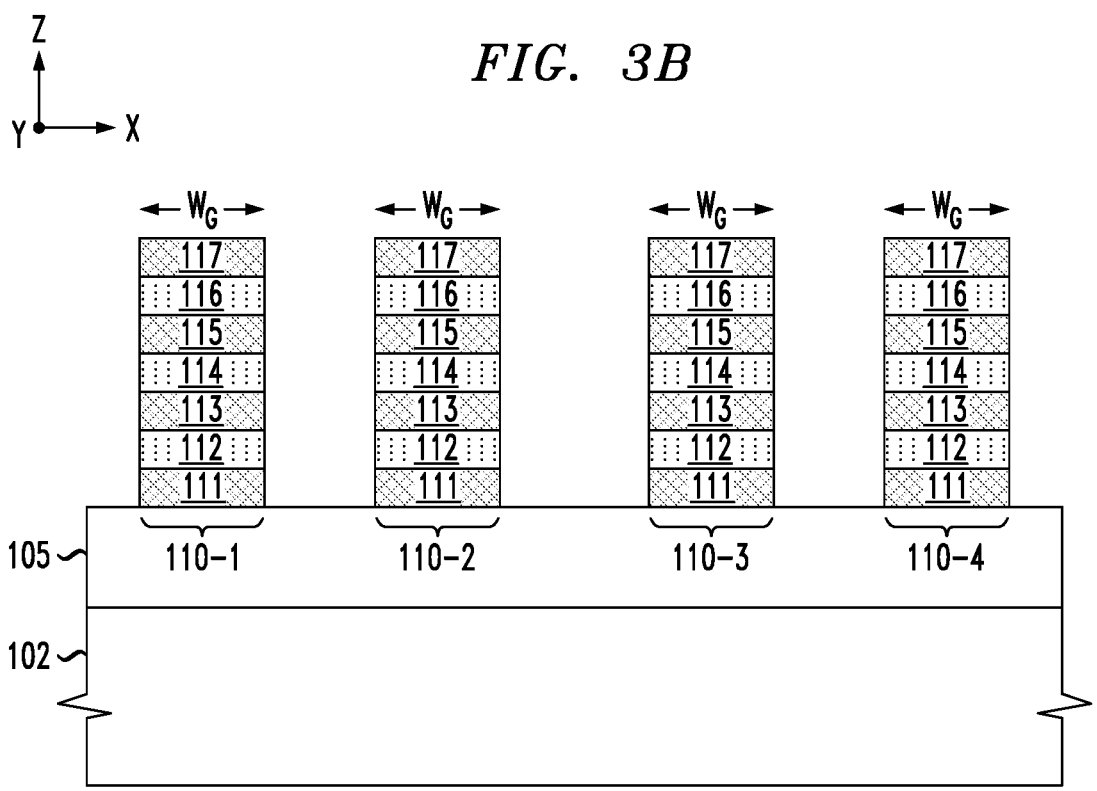

Next, FIGS. 3A and 3B are schematic views of a next intermediate structure of the semiconductor integrated circuit device, which is constructed by patterning the nanosheet stack structure 110 of FIG. 2 to form patterned nanosheet stack structures, according to an exemplary embodiment of the disclosure. More specifically, FIGS. 3A and 3B schematically illustrate a next stage of the fabrication process in which the nanosheet stack structure 110 of FIG. 2 is patterned to form a plurality of patterned nanosheet stack structures 110-1, 110-2, 110-3, and 110-4 which define the gate width $W_G$ of the complementary transistors within the cells. FIG. 3A is a schematic top plan view (X-Y plane) of the intermediate semiconductor structure, and FIG. 3B is a schematic cross-sectional side view (X-Z plane) of the intermediate semiconductor structure along line 3B-3B shown in FIG. 3A.

In some embodiments, a patterning process is performed by forming an etch mask (e.g., a lithographic mask or hard mask) on the nanosheet stack structure 110 (FIG. 2), wherein the etch mask comprises an image of the patterned nanosheet stack structure 110-1, 110-2, 110-3, and 110-4. The nanosheet stack structure 110 is then etched using sequence of one or more dry etch processes (e.g., reactive ion etching (RIE)) to etch down through the layers of the nanosheet stack structure 110 down to the embedded insulating layer 105 (or BOX layer 105) to form the patterned nanosheet stack structures the patterned nanosheet stack structure 110-1, 110-2, 110-3, and 110-4. The etch mask can be formed using any suitable patterning process including, but not limited to, a photolithography process, or a multi-patterning process such as a sidewall image transfer (SIT) process, a self-aligned double patterning (SADP) process, a self-aligned quadruple pattering (SAQP), etc. The etching can be performed using one or more sequential dry etch processes with etch chemistries that are suitable to etch the materials of epitaxial semiconductor layers of the nanosheet stack structure 110.

Figure 4A:
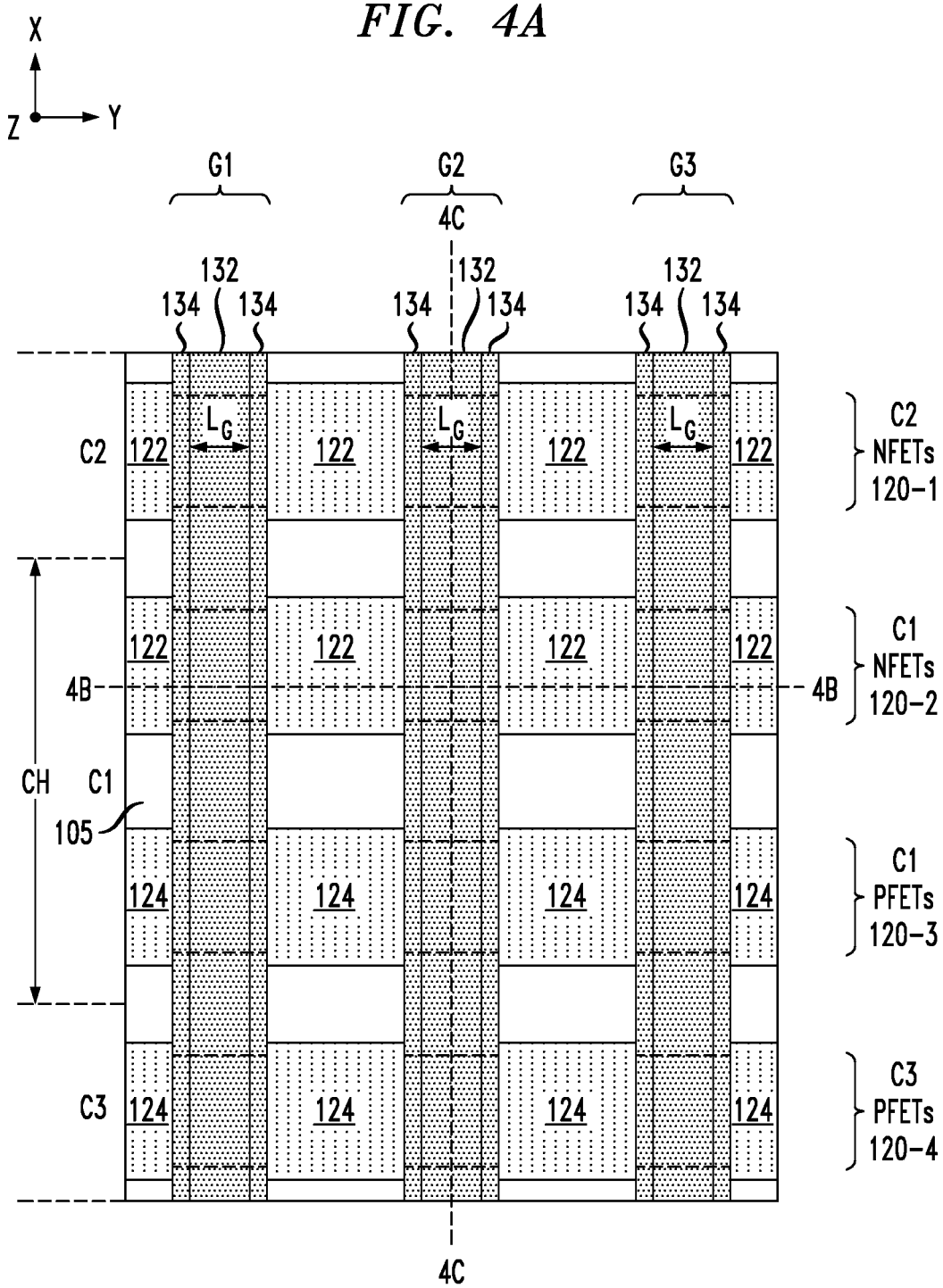
FIGS. 4A, 4B, and 4C are schematic views of a next intermediate structure of the semiconductor integrated circuit device, which is constructed by forming dummy gate structures, and forming source/drain elements of transistor devices, according to an exemplary embodiment of the disclosure.
Figure 4B:
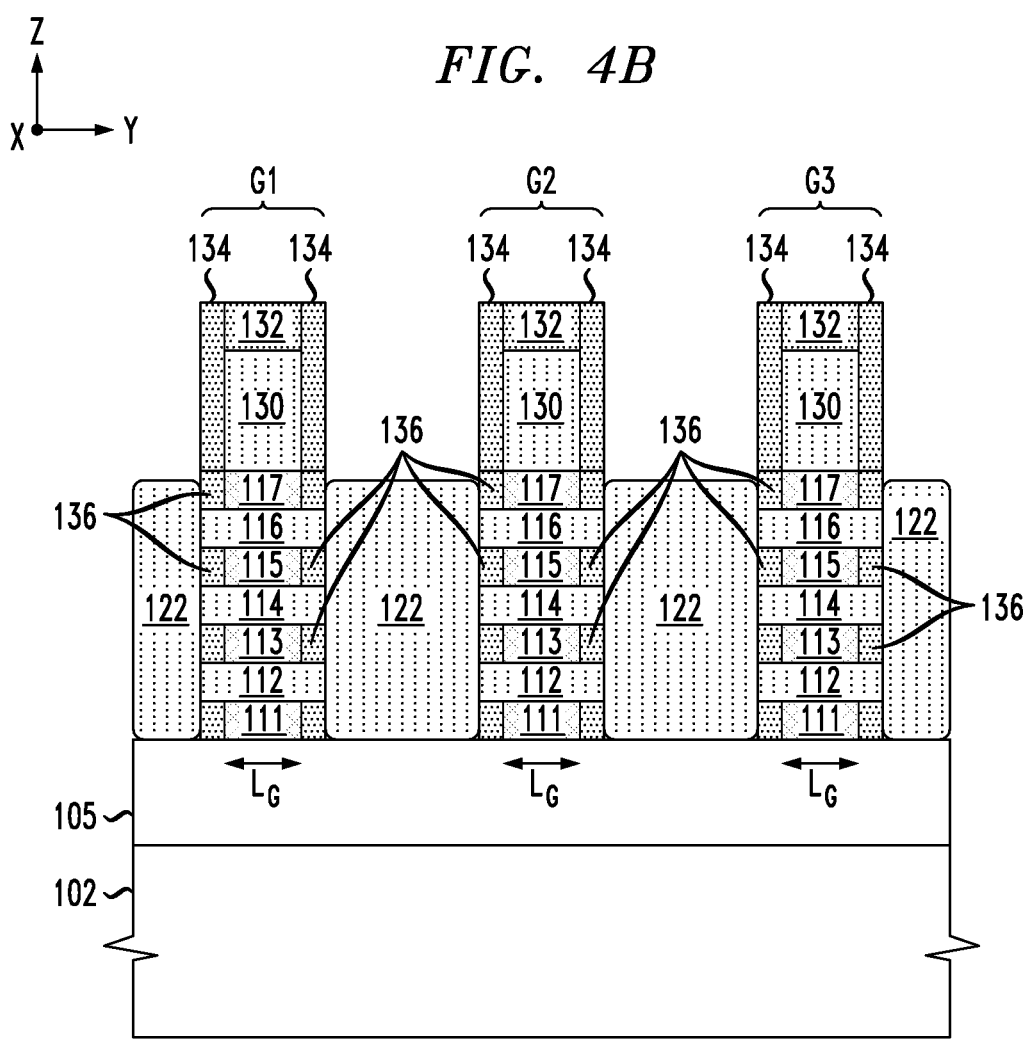
Figure 4C:
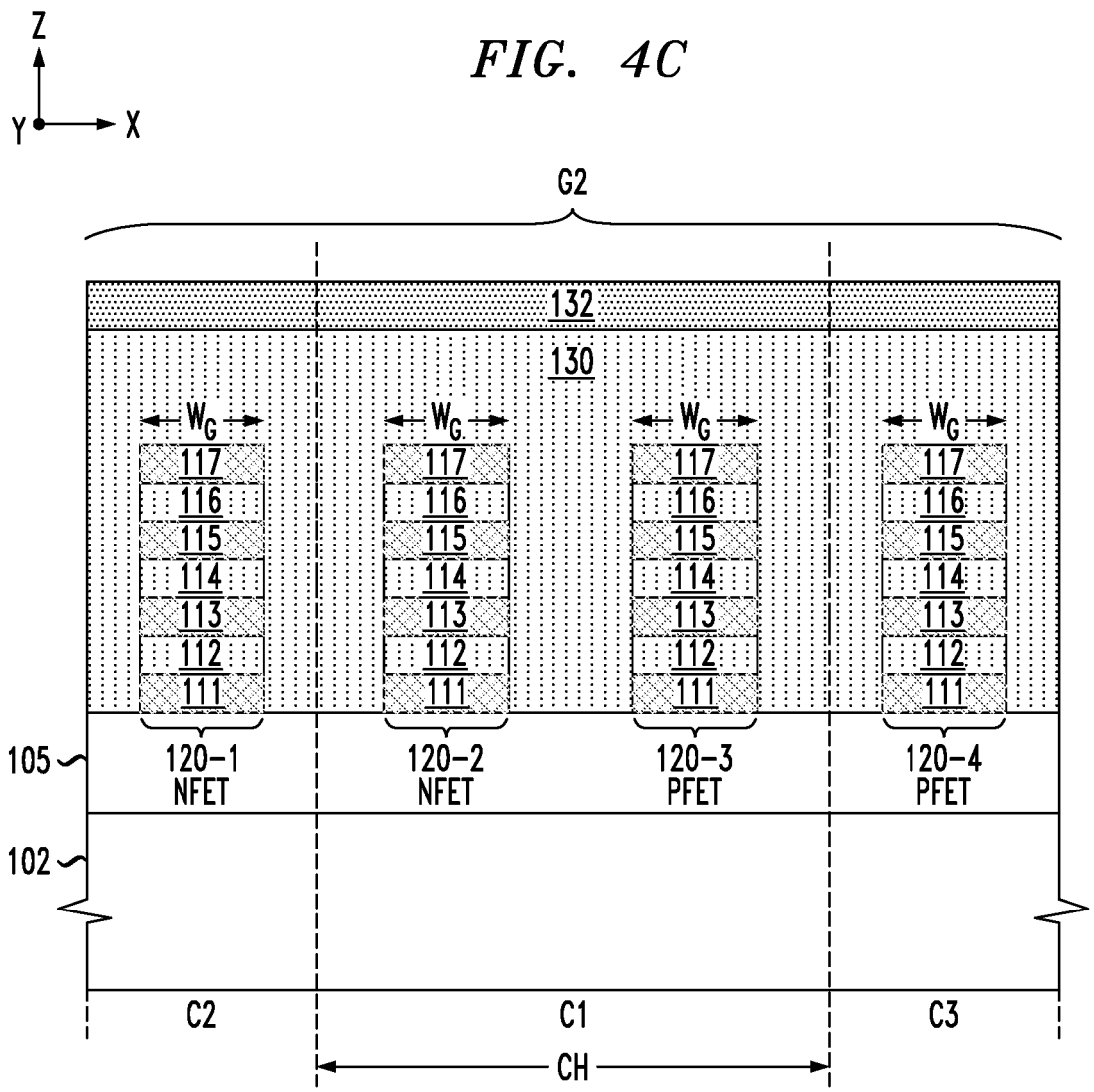

Next, FIGS. 4A, 4B, and 4C are schematic views of a next intermediate structure of the semiconductor integrated circuit device, which is constructed by forming dummy gate structures, and forming source/drain elements of the FET devices, according to an exemplary embodiment of the disclosure. In particular, FIG. 4A is a schematic top plan view (X-Y plane) of the intermediate device structure, FIG. 4B is a schematic cross-sectional side view (Y-Z plane) of the intermediate device structure along line 4B-4B shown in FIG. 4A, and FIG. 4C is a schematic cross-sectional side view (X-Z plane) of the resulting semiconductor structure along line 4C-4C shown in FIG. 4A.

In particular, as schematically shown in FIG. 4A, a plurality of gate structures G1, G2, and G3 are formed across the cells. During the gate formation process, the patterned nanosheet stack structures 110-1, 110-2, 110-3, and 110-4 (as shown in FIG. 3A) are further patterned (in the Y-direction) to form individual nanosheet stack structures for the individual NFET devices 120-1 and 120-2 in the cells C1 and C2, and to form individual nanosheet stack structures for the individual PFET devices 120-3 and 120-4 in the cells C1 and C3. The additional patterning of the nanosheet stack structures 110-1, 110-2, 110-3, and 110-4 defines a gate length $L_G$ of the complementary transistors within the cells, as shown in FIGS. 4A and 4B.

As shown in FIGS. 4A, 4B, and 4C, the gate structures G1, G2, and G3 comprise dummy gates 130 (e.g., conformal oxide layer and a dummy gate electrode layer (e.g., sacrificial polysilicon or amorphous silicon material). In addition, the gate structures G1, G2, and G3 comprise gate capping layers 132, gate sidewall spacers 134, and embedded sidewall spacers 136. In some embodiments, the dummy gate 130 comprises a conformal dummy gate oxide layer and a dummy gate electrode layer (e.g., a sacrificial polysilicon material or amorphous silicon material). As explained in further detail below, the dummy gates 130 are subsequently removed as part of a replacement metal gate (RMG) process and replaced with a high-k gate dielectric material and metallic material to form high-k metal gate structures for the nanosheet FET devices.

The intermediate device structure shown in FIGS. 4A, 4B, and 4C is fabricated using methods that are well-known to those of ordinary skill in the art. For example, a thin conformal layer of silicon oxide is deposited over the entire surface of the semiconductor structure shown in FIGS. 3A and 3B, and a layer of polysilicon (or alternatively, amorphous silicon) is blanket deposited over the conformal layer of silicon oxide, and then planarized using known techniques. A hard mask layer is formed on the planarized surface of the polysilicon layer by depositing a layer of dielectric material or multiple layers of dielectric materials (e.g., SiN, SiOCN, SiBCN). The hard mask layer is then patterned to form the gate capping layers 132, which define an image of the gate structures G1, G2, and G3. The gate capping layers 132 are then utilized as an etch hard mask to anisotropically etch (e.g., RIE) the sacrificial polysilicon and oxide layers down to the BOX layer 105 (selective to the epitaxial materials of the patterned nanosheet stack structures 110-1, 110-2, 110-3, and 110-4) to thereby form the dummy gates 130.

The gate sidewall spacers 134 are then formed by depositing a conformal layer of dielectric material over the entire surface of the semiconductor structure. The conformal layer of dielectric material can be formed of SiN, SiBCN, SiCON, or any other type of low-k dielectric material that is commonly used to form insulating gate sidewall spacers of FET devices, and deposited using known techniques such as atomic layer deposition (ALD), CVD and PVD. The conformal layer of dielectric material is then patterned by performing an anisotropic dry etch process, such as RIE, to etch down the conformal layer of dielectric material in a vertical direction (Z-direction). This etch process is performed selective to the semiconductor materials of the patterned nanosheet stack structures 110-1, 110-2, 110-3, and 110-4. The etch process results in the formation of the gate sidewall spacers 134, which surround the dummy gates 130 and the gate capping layers 132, as shown in FIGS. 4A-4C. The gate sidewall spacers 134 define gate regions of the nanosheet FET devices. After forming the gate sidewall spacers 134, an anisotropic dry etch process (e.g., RIE) is performed to etch down the exposed portions of the nanosheet stack structures 110-1, 110-2, 110-3, and 110-4 in the source/drain regions adjacent to the gate structures down to the upper surface of the BOX layer 105. As shown FIG. 4A, the etch process results in the formation of the individual nanosheet channel structures of the PFET and NFET devices.

Next, the exposed sidewall surfaces of the sacrificial nanosheet layers 111, 113, 115, and 117 of the individual nanosheet channel structures of the NFET and PFET devices are laterally recessed using a timed etch process so that the exposed ends of the sacrificial nanosheet layers 111, 113, 115, and 117 are recessed to a depth which is defined by the thickness of the gate sidewall spacers 134. In some embodiments, the lateral etch process can be performed using an isotropic wet etch process with an etch solution that is suitable to etch the semiconductor material (e.g., SiGe) of the sacrificial nanosheet layers 111, 113, 115, 117 selective to the semiconductor material (e.g., Si) of the active nanosheet channel layers 112, 114, and 116, and other exposed elements (e.g., gate capping layer 132 and gate sidewall spacers 134). In some embodiments, an isotropic dry plasma etch process can be performed to laterally etch the exposed sidewall surfaces of the sacrificial nanosheet layers 111, 113, 115, and 117 selective to the active nanosheet channel layers 112, 114, and 116, and other exposed elements.

A next phase of the fabrication process comprises forming the embedded gate sidewall spacers 136 within the recesses in the sidewalls of the nanosheet channel structures of the NFET and PFET devices. In some embodiments, the embedded gate sidewall spacers 136 are formed of the same dielectric material used to form the gate sidewall spacers 134. For example, the embedded gate sidewall spacers 136 can be formed of SiN, SiBCN, SiCO, SiBCN, SiCON, or any other type of dielectric material (e.g., a low-k dielectric material having a k of less than 5, wherein k is the relative dielectric constant) which is used to form the gate sidewall spacers 134 of the gate structures G1, G2, and G3. In some embodiments, the embedded gate sidewall spacers 136 are formed by depositing a conformal layer of dielectric material until the recesses are filled with dielectric material, followed by an etch back to remove the excess dielectric material from the gate structure and the substrate. The dielectric material is deposited using a highly conformal deposition process, such as ALD, to ensure that the recesses are sufficiently filled with dielectric material. The conformal layer of dielectric material can be etched back using an isotropic (wet or dry) etch process to remove the excess dielectric material, while leaving the dielectric material in the recesses to form the embedded gate sidewall spacers 136. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HFEG), hydrochloric acid (HCl), or any combination thereof.

Following formation of the embedded gate sidewall spacers 136, the source/drain elements 122 of the NFET devices 120-1 and 120-2 are epitaxially grown on the exposed sidewall surfaces of the active nanosheet channel layers 112, 114, and 116 of the NFET devices using a first epitaxy process, and the source/drain elements 124 of the PFET devices 120-3 and 120-4 are epitaxially grown on the exposed sidewall surfaces of the active nanosheet channel layers 112, 114, and 116 of the PFET devices using a second epitaxy process, separate from the first epitaxy process. For the first epitaxy processes, the exposed sidewall surfaces of the active nanosheet channel layers 112, 114, and 116 of the NFET devices 120-1 and 120-2 provide a surface area to seed the epitaxial growth of the source/drain elements 122. For the second epitaxy process, the exposed sidewall surfaces of the active nanosheet channel layers 112, 114, and 116 of the PFET devices 120-3 and 120-4 provide a surface area to seed the epitaxial growth of the source/drain elements 124. If the source/drain elements 122 of the NFET devices are formed prior to formation of the source/drain elements 124 of the PFET devices, the source/drain elements 122 are covered by a conformal dielectric liner layer and a patterned organic layer to protect the source/drain elements 122 from the epitaxy process used to form the source/drain elements 124 of the PFET devices, and vice versa.

In some embodiments, as shown in FIG. 4A, the epitaxial growth of the source/drain elements 122 on the exposed ends of the active nanosheet channel layers 112, 114 and 116 of the NFET devices 120-1 and 120-1 is performed so that the epitaxial material merges (in the X and Z-directions) to form merged source/drain elements 122 between adjacent gate structures (e.g., between adjacent gates G1 and G2, and between adjacent gates G2 and G3). Similarly, the epitaxial growth of the source/drain elements 124 on the exposed ends of the active nanosheet channel layers 112, 114 and 116 of the PFET devices 120-3 and 120-4 is performed so that the epitaxial material merges (in the X and Z-directions) to form merged source/drain elements 124 between adjacent gate structures. In other embodiments, the epitaxial growth of the source/drain elements 122 and 124 is performed to form separate, non-merged source/drain elements between adjacent gate structures.

The source/drain elements 122 and 124 can be epitaxially grown using known methods such as CVD, MOCVD, LPCVD, MBE, VPE, LPE, MOMBE, RTCVD, LEPD, UHVCVD, APCVD, or other known epitaxial growth techniques which are suitable for the given process flow. The types of epitaxial semiconductor materials that are utilized to form the source/drain elements of the transistors will depend on, e.g., the type of the transistor (e.g., N-type or P-type), and the epitaxial material of the active nanosheet channel layers 112, 114, and 116. For example, for PFET devices, when the active nanosheet channel layers 112, 114, and 116 are formed of epitaxial Si, the source/drain elements 124 can be formed of an epitaxial SiGe material (with a relatively high Ge concentration), or a boron-doped SiGe (B:SiGe) epitaxial material, or other suitable epitaxial materials. On the other hand, for NFET devices, when the active nanosheet channel layers 112, 114, and 116 are formed of epitaxial Si, the source/drain elements 122 can be formed of carbon-doped silicon (Si:C) epitaxial material, or phosphorus-doped silicon (Si:P) epitaxial material, or other suitable epitaxial materials.

The source/drain elements 122 and 124 can be doped using known techniques. For example, in some embodiments, the source/drain elements 122 and 124 are "in-situ" doped during the epitaxial growth process by adding a dopant gas to the source deposition gas (i.e., the Si-containing and/or Ge-containing source gas). Exemplary dopant gases may include a boron (B) or gallium (Ga) containing gas for P-type FETs, or a phosphorus (P) or arsenic (As) containing gas (e.g., such as $PH_3$ or $AsH_3$) for N-type FETs, wherein the concentration of impurity in the gas phase determines its concentration in the epitaxially grown semiconductor material. In other embodiments, an "ex-situ" process may be performed to add dopants into the source/drain elements 122 and 124. For example, an "ex-situ" process can be performed by ion implantation, gas phase doping, plasma doping, plasma immersion ion implantation, cluster doping, infusion doping, liquid phase doping, solid phase doping, or any suitable combination of those techniques.

In some embodiments, a conformal layer of dielectric material is deposited to form protective liners which cover the source/drain elements 122 and 124. For example, the protective liners can be formed of a dielectric material such as, e.g., SiOC, SiCN, SiN, SiBCN, which has etch selectivity to the dielectric materials of the gate capping layers 132 and the gate sidewall spacers 134.

Figure 5A:
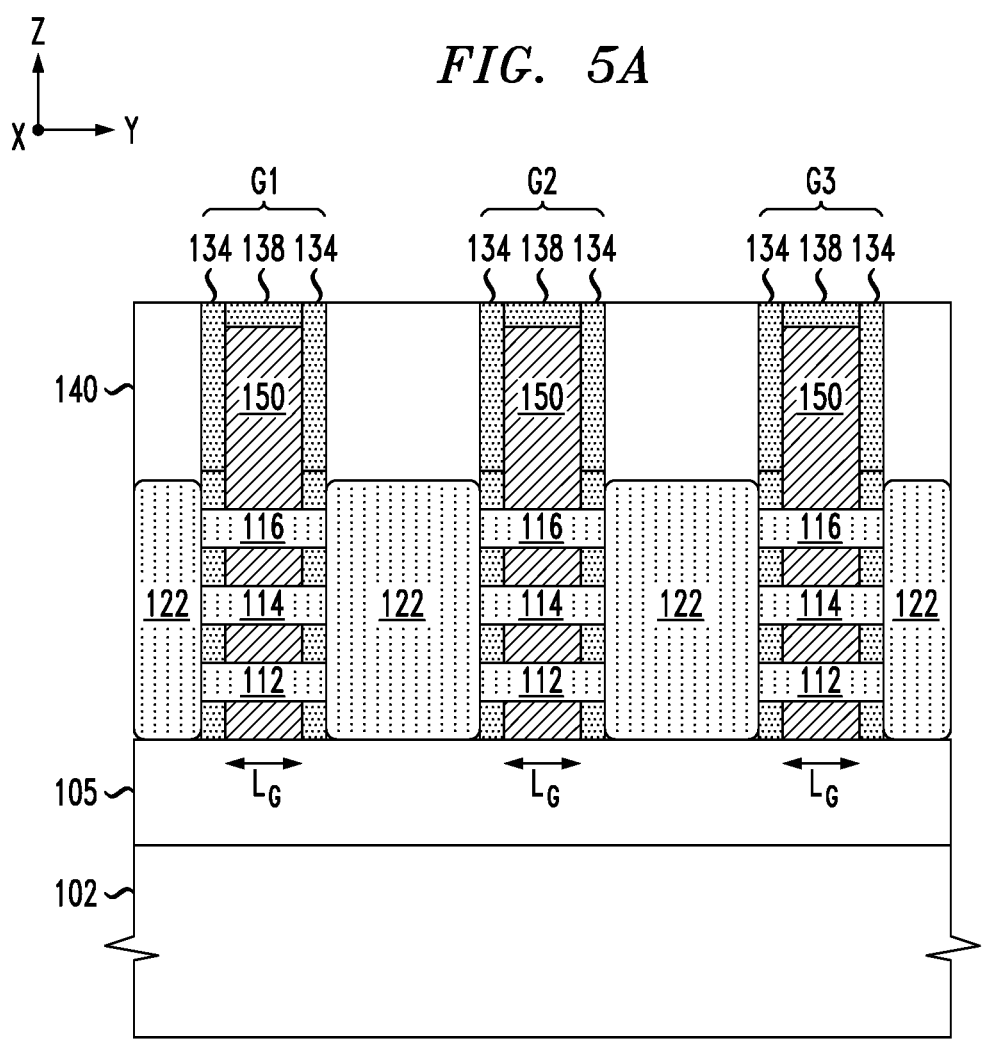
FIGS. 5A and 5B are schematic views of a next intermediate structure of the semiconductor integrated circuit device, which is constructed by forming an interlayer dielectric layer, performing a gate cut process, and performing replacement metal gate process, according to an exemplary embodiment of the disclosure.
Figure 5B:
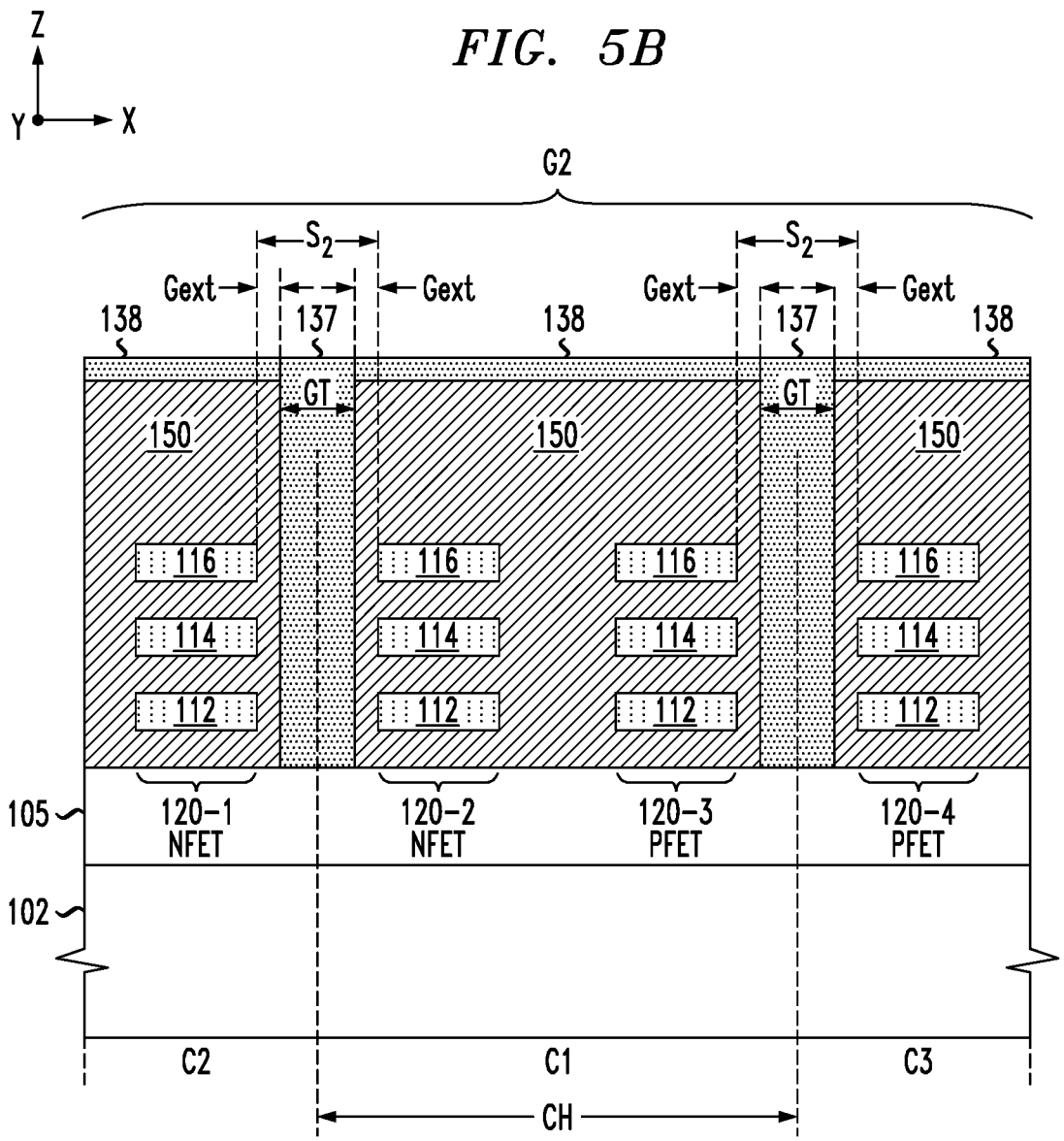

Next, FIGS. 5A and 5B are schematic views of a next intermediate structure of the semiconductor integrated circuit device, which is constructed by forming an interlayer dielectric layer, performing a gate cut process, and performing replacement metal gate process, according to an exemplary embodiment of the disclosure. More specifically, FIGS. 5A and 5B are schematic cross-sectional side views of the intermediate structure shown in FIGS. 4B and 4C, respectively, after forming the first ILD layer 140, after performing a gate cut process to form the gate cut elements 137 in the cell boundary regions between adjacent cell to cut (isolate) the gates G1, G2, and G3, and after forming high-k metal gates 150 in place of the dummy gates 130 and the sacrificial nanosheet layers 111, 113, 115 and 117. The intermediate device structure shown in FIGS. 5A and 5B is formed using known techniques. For example, following formation of the source/drain elements 122 and 124, the process flow continues with forming the first ILD layer 140 to encapsulate the NFET devices 120-1 and 120-2, and the PFET devices 120-3 and 120-4 of the cells C1, C2, and C3. In some embodiments, the ILD layer 140 is formed by depositing a blanket layer of dielectric/insulating material over the semiconductor structure and planarizing the layer of dielectric/insulating material down to the gate capping layers 132 to thereby form the first ILD layer 140.

The first ILD layer 140 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material of the ILD layer 140 is deposited using known deposition techniques, such as, for example, ALD, CVD, PECVD, PVD, or spin-on deposition. In some embodiments, the layer of dielectric/insulating material is planarized using a standard planarization process such as CMP to remove the overburden dielectric/insulating down to the upper surface of the gate capping layers 132.

Following the formation of the ILD layer 140, a gate cut process is performed to cut the gates G1, G2, and G3 in the cell boundary regions to isolate the gate structure between adjacent cells. In some embodiments, the gates G1, G2, and G3 are cut using conventional lithography and etch processes, followed by a dielectric fill process and planarizing process (e.g., CMP). The gate cut process results in the formation of the gate cut elements 137, as shown in FIG. 5B. The gate cut elements 137 are formed with a target width GT to ensure that a sufficient amount of space (gate extension regions Gext) exist between the width ends of the nanosheet channel structures (e.g., the stacks of active nanosheet channel layers 112, 114, and 116). In some embodiments, the gate cut elements 137 are formed of the same or similar dielectric materials as the gate capping layer 132 and/or the gate sidewall spacers 134.

Following the gate cut process, a replacement metal gate process is performed to replace the dummy gates 130 and the sacrificial nanosheet layers 111, 113. 115 and 117 with the high-k_metal gates 150 (e.g., HKMG structures) using known techniques. For example, in some embodiments, the dummy gates 130 are removed using a process flow which comprises removing the gate capping layers 132 to expose the dummy gates 130, and performing several etch processes to remove the dummy gates 130. More specifically, in some embodiments, the gate capping layers 132 are removed by planarizing (e.g., via CMP) the surface of the semiconductor structure down to the upper surface of the dummy gates 130. In other embodiments, the dielectric material of the gate capping layers 132 (e.g., SiN) can be etched away selective to the materials of the gate sidewall spacers 134 (e.g., SiBCN), the gate cut elements 137, and the ILD layer 140 (e.g., silicon oxide) to expose the underlying dummy gates 130. As noted above, in some embodiments where the dummy gates 130 each comprise a dummy gate electrode layer (e.g., sacrificial polysilicon layer, or amorphous silicon layer) and a dummy gate oxide layer, the dummy gate electrode and gate oxide layers are etched away using known etching techniques and etch chemistries.

For example, the sacrificial polysilicon material of the gate electrode layer can be removed using a selective dry etch or wet etch process with suitable etch chemistries, including ammonium hydroxide ($NH_4OH$), tetramethylammonium hydroxide (TMAH), or SF6 plasma. The etching of the dummy poly gate layer is selective to, e.g., the dummy gate oxide layer, to thereby protect the active nanosheet channel layers 112, 114, 116 from being etched during the poly etch process. After the polysilicon material is removed, an oxide etch process is performed to etch away the dummy gate oxide layer selective to, e.g., the active nanosheet channel layers 112, 114, and 116. In this manner, the sacrificial materials (e.g., dummy polysilicon and oxide layers) of the dummy gates 130 can be etched away without damaging the active nanosheet channel layers 112, 114, and 116.

After removing the dummy gates 130, an etch process is performed to selectively etch away the sacrificial nanosheet layers 111, 113, 115, and 117 of the nanosheet channel structures of the NFET and PFET devices to thereby release the active nanosheet channel layers 112, 114, and 116 of the nanosheet channel structures, and thereby form an open gate region in the area between the sidewall spacers 134 and in the spaces between and adjacent to the active nanosheet channel layers 112, 114, and 116. The sacrificial nanosheet layers 111, 113, 115, and 117 (e.g., epitaxial SiGe layers) can be etched away selective to the active nanosheet channel layers 112, 114, and 116 (e.g., epitaxial Si layers). In some embodiments, SiGe material of the sacrificial nanosheet layers 111, 113, 115, and 117 can be selectively etched (with high etch selectivity) using a gas phase HCl (hydrochloric acid) or wet etch solution containing hydrogen peroxide ($H_2O_2$) to etch the epitaxial SiGe material of the sacrificial nanosheet layers 111, 113, 115, and 117 highly selective to the epitaxial Si material of the active nanosheet channel layers 112, 114, and 116. The gas phase HCl (hydrochloric acid) provides high etch selectivity when, for example, the active nanosheet channel layers 112, 114, and 116 are formed of epitaxial Si or epitaxial SiGe with a lower Ge concentration than the epitaxial SiGe material of the sacrificial nanosheet layers 111, 113, 115, and 117.

Next, the replacement metal gates 150 (e.g., high-k metal gates) are formed by a process which comprises (i) depositing one or more conformal layers of high-k gate dielectric material over the exposed surfaces of the semiconductor structure to conformally cover the surfaces of the active nanosheet channel layers 112, 114, and 116 and (ii) depositing one or more layers of work function metal to cover the high-k gate dielectric and fill the remaining spaces in the open gate regions to form a metal gate electrode layer. In some embodiments, the high-k gate dielectric layer is preferably formed of a high-k dielectric material having a dielectric constant of about 3.9 or greater. For example, the gate dielectric material can include but is not limited to metal oxides such as hafnium oxide, hafnium silicon oxide, hafnium silicon oxynitride, hafnium zirconium oxide, and nitride films thereof. In other embodiments, the high-k dielectric may comprise lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal high-k gate dielectric layer is formed with a thickness in a range of about 0.5 nm to about 2.0 nm, which will vary depending on the target application. The conformal layer of high-k gate dielectric material is deposited using known methods such as ALD, for example, which allows for high conformality of the gate dielectric material.

As is known in the art, the use of high-k gate dielectric materials can be problematic in that such dielectric materials typically do not interface well with silicon layers. For example, high-k gate dielectric materials do not passivate a silicon surface, which results in a large number of interface traps and charges and other issues which can degrade device performance. As such, in one exemplary embodiment, before depositing the high-k dielectric material to form the high-k gate dielectric layer, a channel pre-clean process is performed to clean the exposed silicon surfaces of the active nanosheet channel layers 112, 114, and 116, which is then followed by an oxidation process to grow ultra-thin interfacial silicon oxide layers on the exposed surfaces of the active nanosheet channel layers 112, 114, 116. It is to be understood that the formation of the interfacial silicon oxide layers is an optional step and that in other embodiments of the invention, a high-k dielectric material of the HKMG structures can be formed on the exposed silicon surfaces of the active nanosheet channel layers without initially forming the thin interfacial oxide layers.

In some embodiments, the interfacial silicon oxide layers are formed using a chemical oxidation process in an ozonated deionized water comprising ozone, and a suitable oxidation temperature, ozone concentration in the deionized water, and chemical oxidation process time to form thin interfacial silicon oxide layers. The interfacial layers are formed by oxidizing the exposed silicon surfaces of the active nanosheet channel layers 112, 114, and 116 to form thin interfacial silicon oxide layers with a thickness in a range of about 5 angstroms to about 10 angstroms (i.e., about 0.5 nm to about 1 nm).

In some embodiments, the metal gates 150 are formed with one or more work function metal layers which are conformally deposited over the high-k gate dielectric layers. The work function metal layer(s) may comprise one or more types of metallic materials, including, but not limited to, titanium nitride (TiN), tantalum nitride (TaN), and an Al-containing alloy (e.g., TiAlC, TiAl, and AlC, or nitrided alloys thereof). In other embodiments, the work function metal layer(s) may comprise a metallic material which comprises a composition or alloy of Zr, W, Hf, Ti, Al, Ru, Pa, ZrAl, WAl, TaAl, HfAl, TaC, TiC, TaMgC, and other types, compositions, or alloys of work function metals that are commonly used to obtain target work functions for the FET devices. The work function metal layers are conformally deposited using known methods such as ALD, CVD, etc., which allow for high conformality of the deposited work function metal layers.

In some embodiments, the work function metal layers completely fill the spaces above and below the active nanosheet channel layers 112, 114, and 116. Indeed, in instances where the initial spacing between the active nanosheet channel layers 112, 114, and 116 is relatively small (e.g., 7 nm to 10 nm), after formation of the high-k dielectric layer, the conformal deposition of a stack of two or more work function metal layers can result in filling (i.e., pinch-off) the spaces above and below the active nanosheet channel layers 112, 114, and 116 such that the spaces are filled with gate dielectric material and work function metal. This is sufficient for short-channel length nanosheet FET devices where $L_G$ is about 15 nm or less.

Furthermore, in some embodiments, the remaining portions of the open gate regions above the active nanosheet channel layers 116 of the FET devices can be filled with work function metal by continuing the deposition process for the last deposited work function metal layer until the open gate regions above the active nanosheet channel layers 116 are completely filled with the work function metal layer. In other embodiments, the remaining portion of the open gate regions can be filled with a low-resistance metallic material such as tungsten, ruthenium, cobalt, copper, aluminum, etc. to form a metallic gate electrode apart from the work function metal.

Following the deposition of the dielectric and metallic materials that form the metal gates 150 (e.g., HKMG structure), a CMP process is performed to polish the surface of the semiconductor structure down to the ILD layer 140, thereby removing overburden portions of the gate dielectric, work function, and gate electrode layers on the ILD layer 140. Following formation of the metal gates 150, in some embodiments, prior to forming the second ILD layer 142, gate capping layers 138 are formed to cover the upper surfaces of the metal gates 150. For example, following the formation of the metal gates 150, an etch process can be performed to recess an upper surface of the metal gates 150 down to a target level below the upper surface of the ILD layer 140. A layer of dielectric material is then deposited over the surface of the semiconductor device structure to fill the area above the recessed surface of the metal gates 150 with dielectric material, and the semiconductor device structure is planarized down to the surface of the ILD layer 140 to remove the overburden dielectric material, and thereby form the gate capping layers 138, as shown in FIGS. 5A and 5B. The gate capping layers 138 can be formed of a dielectric material such as SiN or SiBCN, etc.

Figure 6A:
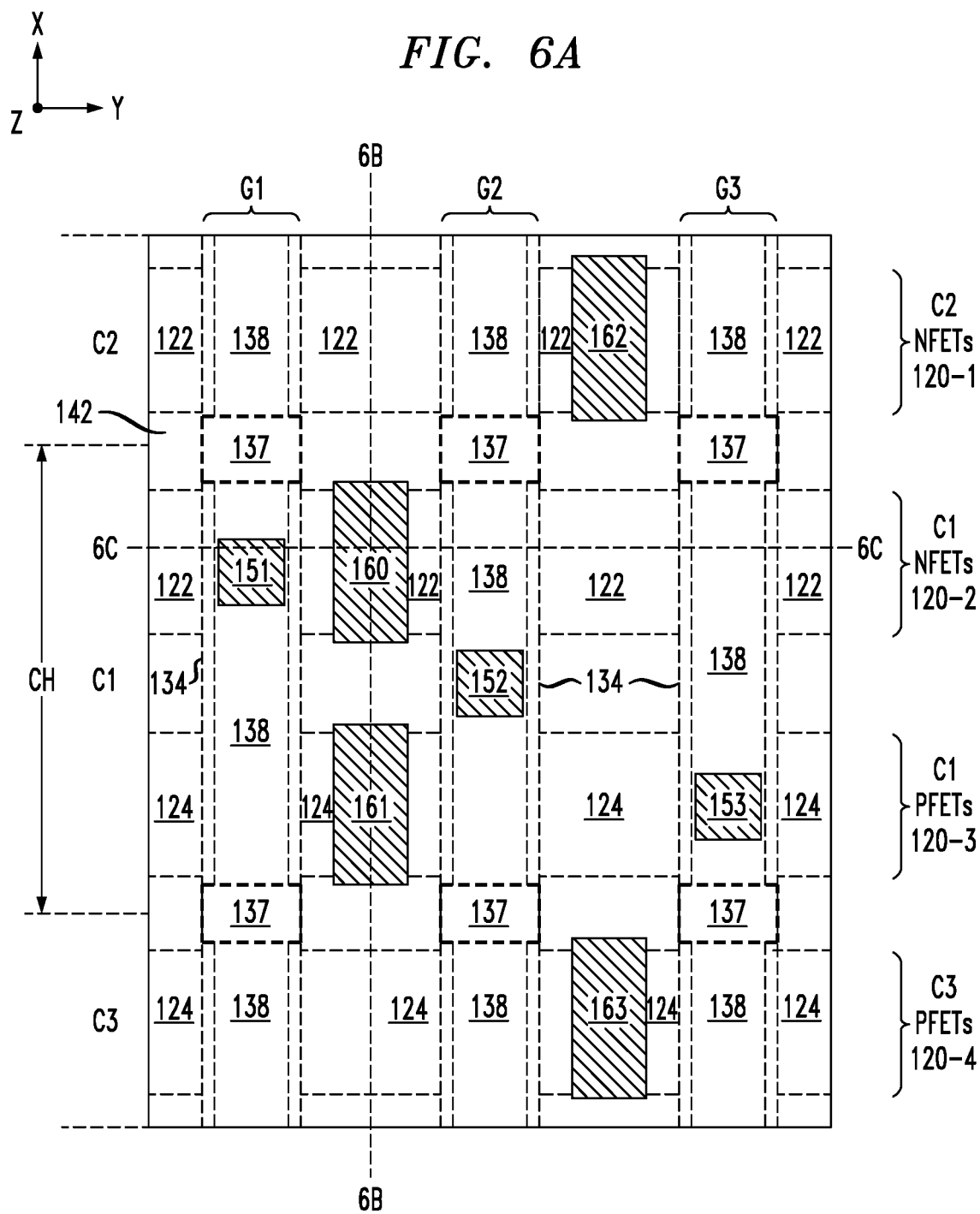
FIGS. 6A, 6B, and 6C are schematic views of a next intermediate structure of the semiconductor integrated circuit device, which is constructed by forming frontside gate contacts and source/drain contacts, according to an exemplary embodiment of the disclosure.
Figure 6B:
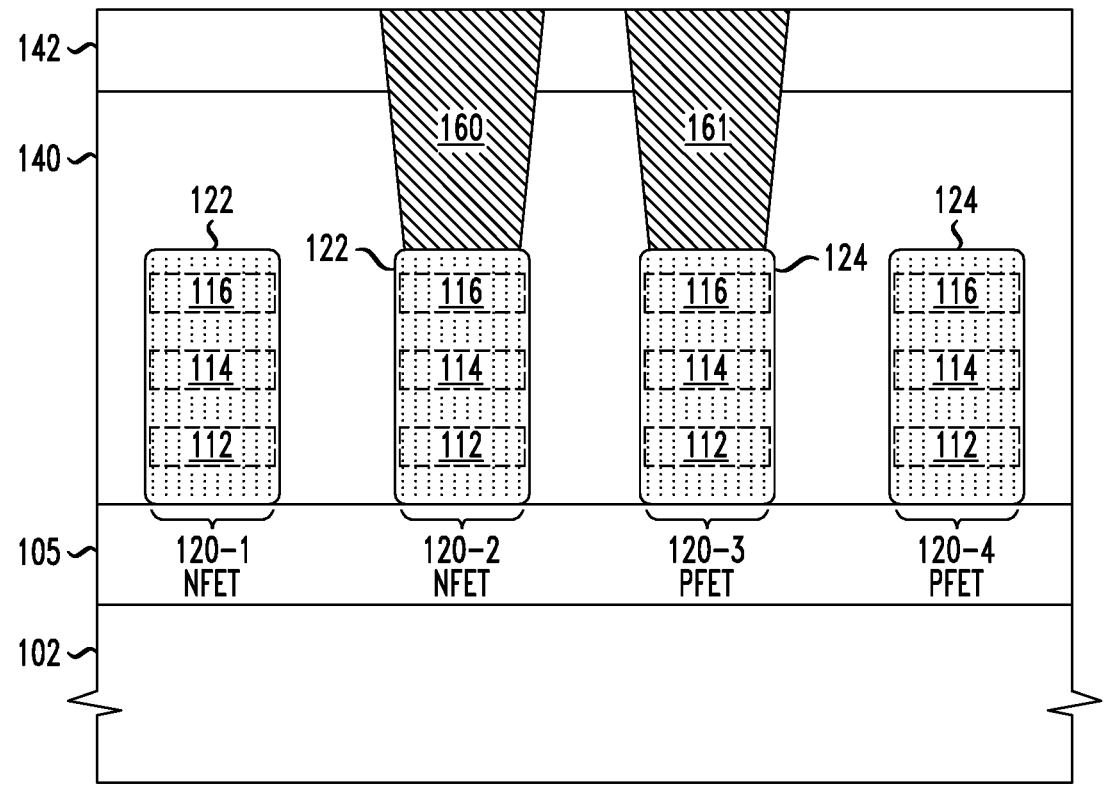
Figure 6C:
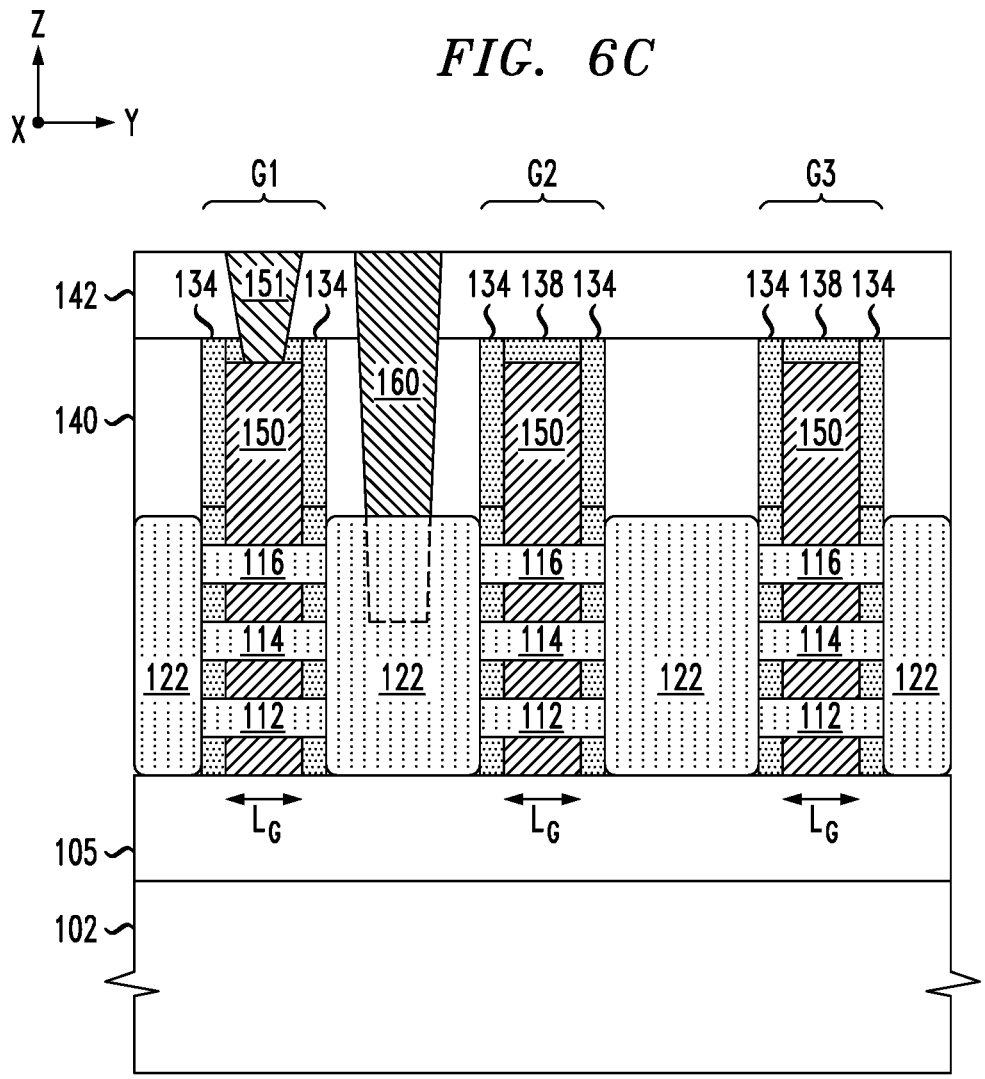

Next, FIGS. 6A, 6B, and 6C are schematic views of a next intermediate structure of the semiconductor integrated circuit device, which is constructed by forming frontside gate contacts and source/drain contacts, according to an exemplary embodiment of the disclosure. FIG. 6A is a schematic top plan view of the intermediate device structure which results from forming the second ILD layer 142 on the first ILD layer 140, and forming the gate contacts 151, 152, and 153 to respective metal gate structures in the cell C1, and forming the frontside source/drain contacts 160, 161, 162, and 163. FIG. 6B is a schematic cross-sectional side view of the intermediate device structure along line 6B-6B in FIG. 6A, and FIG. 6C is a schematic cross-sectional side view of the intermediate device structure along line 6C-6C in FIG. 6A. As shown in FIG. 6A, the gate contacts 151, 152, and 153 are formed offset from each other to allow the gate contacts 151, 152, and 153 to connect to desired ones of the metal tracks T1-T8 (FIG. 1A) which extend in the Y-direction across the gate structures G1, G2, and G3. The intermediate device structure shown in FIGS. 6A, 6B, and 6C is formed using any suitable middle-of-the-line (MOL) process module and materials to form the MOL frontside gate contacts 151, 152, and 153, and the frontside source/drain contacts 160, 161, 162, and 163.

For example, the frontside gate contacts 151, 152, and 153, and the frontside source/drain contacts 160, 161, 162, and 163 are formed by a process which comprises patterning/etching the first and second ILD layers 140 and 142 to form via openings in the ILD layer 142 down to the metal gates 150, and via openings in the ILD layers 142 and 140 to expose portions of the source/drain elements 122 and 124 (and etching away exposed portions of the protective liners over the source/drain elements 122 and 124), and then filling the via openings with metallic material to form the frontside gate contacts 151, 152, and 153, and the frontside source/drain contacts 160, 161, 162, and 163. In some embodiments, prior to forming the source/drain contacts 160, 161, 162, and 163, a salicidation process is performed to form silicide contact layers on the exposed surfaces of epitaxial source/drain elements in the via openings prior to filling the via openings with metallic material. In general, a salicide process involves the reaction of thin metal film with epitaxial material of the source/drain elements to form metal silicide contacts through an annealing process.

In some embodiments, the gate contacts 151, 152, and 153, and the source/drain contacts 160, 161, 162, and 163 are formed by depositing a thin conformal diffusion barrier layer to line the surfaces of the via openings, followed by depositing metallic material over the diffusion barrier layer to fill the via openings. In some embodiments, the metallic material comprises any suitable material for forming MOL contacts including, but not limited to, tungsten or cobalt. The diffusion barrier layer prohibits the diffusion of metallic material of the contacts into the surrounding material of the ILD layers 140 and 142, as well as preventing out diffusion of, e.g., oxygen from the ILD layers 140 and 142 which could oxidize the metallic material that is used to form the frontside MOL contacts. For example, a diffusion barrier layer can be thin conformal layer titanium (Ti), titanium nitride (TiN), tantalum (Ta), tantalum nitride (TaN), tungsten (W), tungsten nitride (WN), or any other material that is suitable for use as a diffusion barrier to prohibit out diffusion of the metallic material which forms the frontside MOL contacts.

Figure 7:
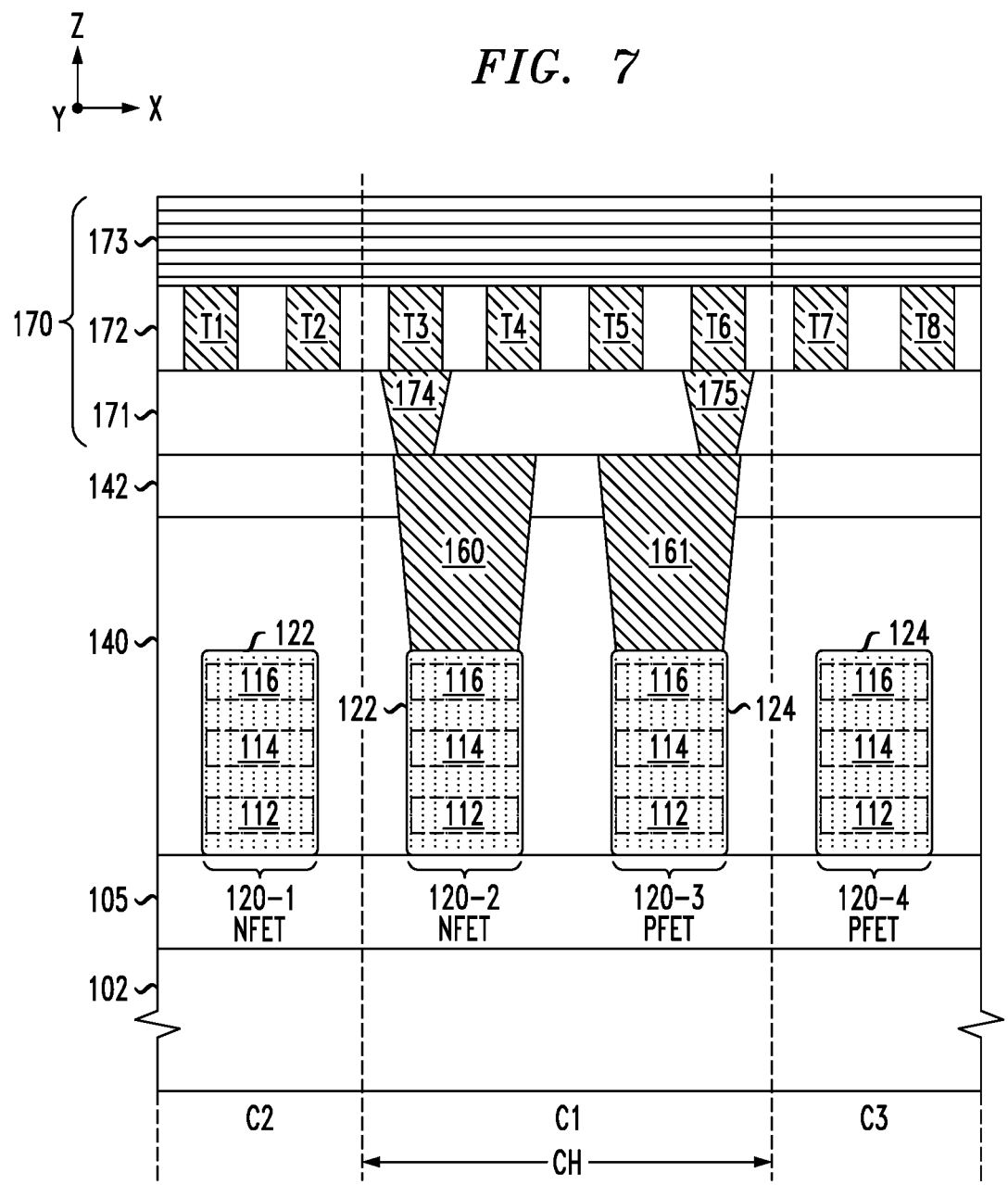

Next, FIG. 7 is a schematic cross-sectional side view of a next intermediate structure of the semiconductor integrated circuit device, which is constructed by forming an interconnect structure (e.g., BEOL interconnect structure) on a frontside of the intermediate device structure of FIGS. 6A, 6B, and 6C, according to an exemplary embodiment of the disclosure. More specifically, FIG. 7 schematically illustrates a next stage of the fabrication process in which the BEOL interconnect structure 170 is formed on the ILD layer 142. As noted above, the BEOL interconnect structure 170 comprise multiple levels of wiring, and via structures which connect the wiring between different wiring levels. For example, the BEOL interconnect structure 170 comprises dielectric layers 171 and 172 in which the first level vias 174 and 175, and metal (signal) tracks T1-T8 are formed, as well as higher BEOL metallization levels 173 disposed over the first level of metallization. The BEOL interconnect structure can be fabricated using any suitable BEOL process module, the details of which are well known to those of ordinary skill in the art.

Figure 8:
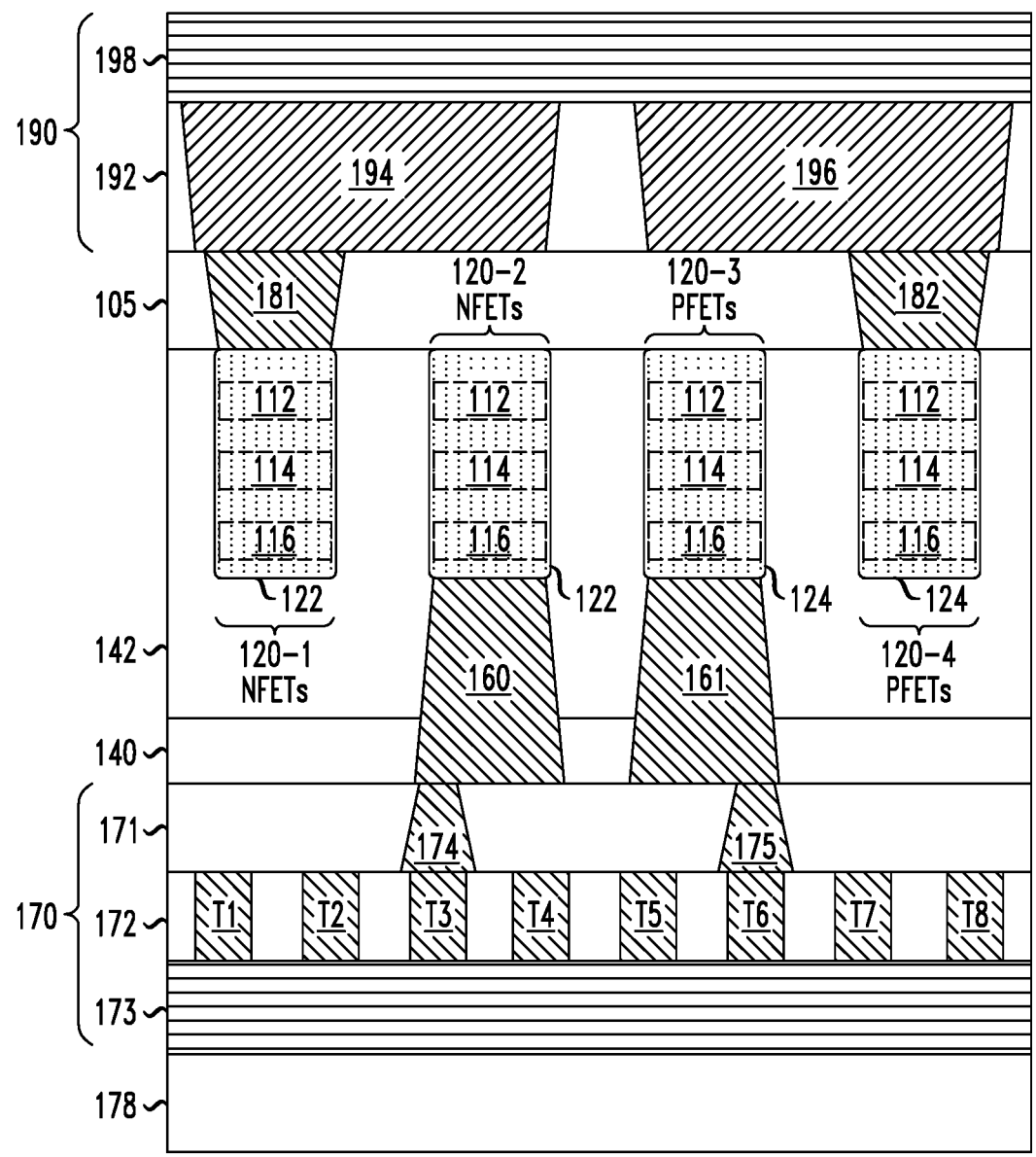

Next, FIG. 8 is a schematic cross-sectional side view of a next intermediate structure of the semiconductor integrated circuit device, which is constructed by performing a backside process module to form backside source/drain contacts and a backside interconnect structure comprising a full backside power delivery structure on a backside of the intermediate device structure of FIG. 7, according to an exemplary embodiment of the disclosure. The backside process module begins by bonding a handler substrate 178 (e.g., handler wafer) to the BEOL interconnect structure 170 to facilitate backside processing. In some embodiments, the handler substrate 178 is temporarily bonded to the BEOL interconnect structure 170 using a polymeric bonding technique (e.g., contact bonding or thermo-compression bonding), or other suitable techniques. The handler substrate 178 may comprise a semiconductor substrate or a glass substrate, or any type of substrate material which is suitable for the given application.

A next stage of the backside process module comprises removing the semiconductor substrate 102 to expose a backside surface of the BOX layer 105. The semiconductor substrate 102 is removed using known techniques such as mechanical grinding, polishing, etching, or any combination of grinding, polishing, and etching. For example, a backside grinding/polishing process is first performed to remove bulk of the semiconductor substrate 102, followed by an etch process which is performed to selectively etch the remaining portion of the semiconductor substrate 102 to expose the backside surface of the BOX layer 105.

Next, the BOX layer 105 is patterned to form via holes to expose some source/drain elements 122 of some NFET devices, and to expose some source/drain elements 134 of some PFET devices of the cells C1, C2, and C2. The via holes are filled with metallic material to form, e.g., the backside source/drain contacts 181 and 182. The backside power delivery structure 190 is then constructed by a process which comprises forming the backside dielectric layer 192 (e.g., silicon oxide, low-k dielectric material, etc.) on the BOX layer 105, patterning the backside dielectric layer 192 to form trenches and filling the trenches with metallic material to form, e.g., the backside power rails 194 and 195. The backside source/drain contacts 181 and 182 and backside power rails 194 and 195 can be formed using any suitable metallic material. In addition, the etched via holes and trenches can be lined with one or more thin conformal liner layers that serve as diffusion barrier layers and adhesion layers. The backside power distribution network 198 is formed over backside dielectric layer 192 and backside power rails using, e.g., BEOL fabrication techniques. In some embodiments, the backside power distribution network 198 configured to distribute positive and negative power supply voltage active components of the FEOL layer. The formation of the backside power distribution network 198 results in the semiconductor integrated circuit device 100 as shown in FIGS. 1A and 1B. In some embodiments, the handler substrate 178 is not removed and remains as part of the final structure.

Figure 9:
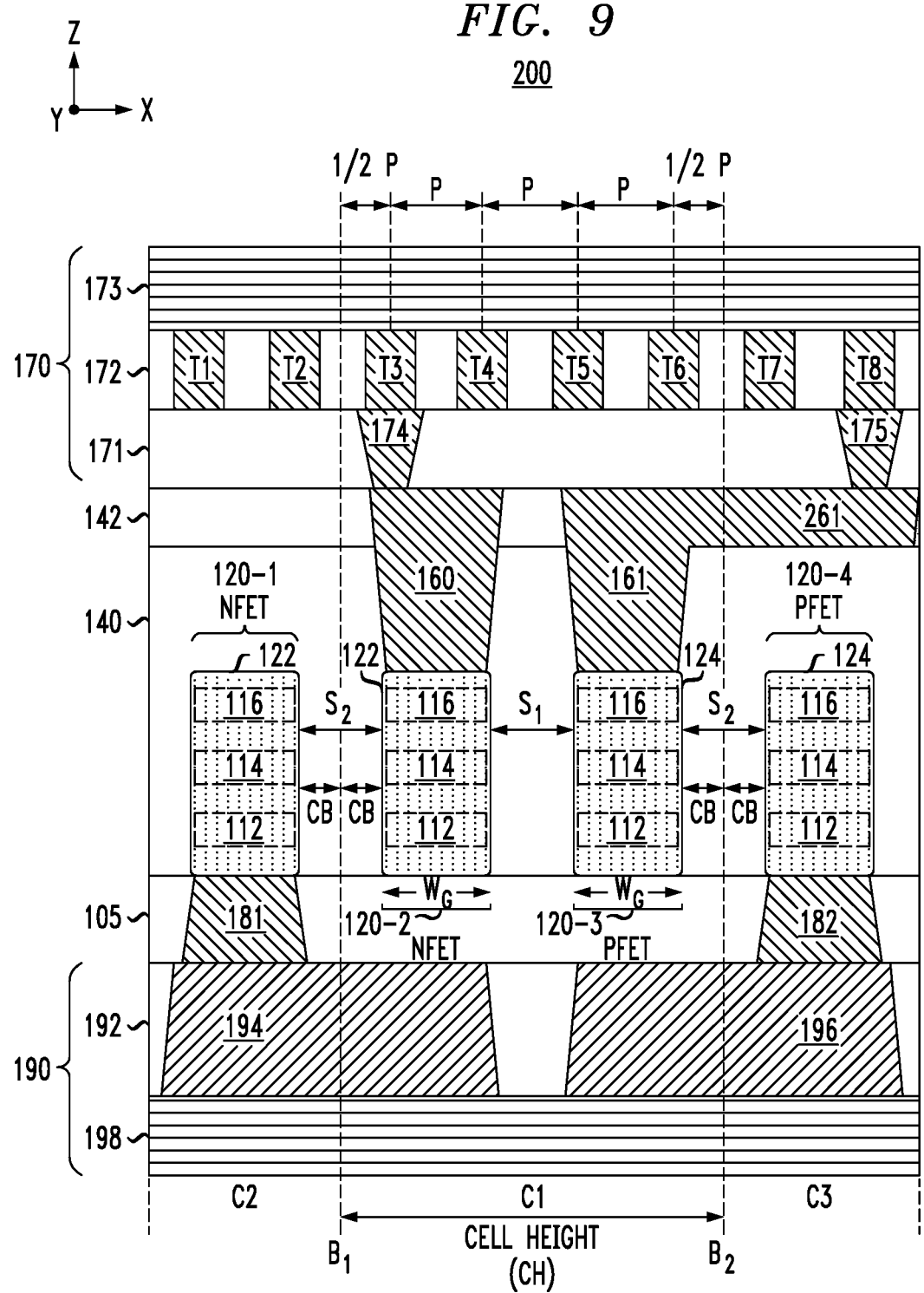
FIG. 9 is a schematic cross-sectional side view of a semiconductor integrated circuit device which implements backside power rails and a backside power distribution network to enable density scaling, according to another exemplary embodiment of the disclosure.

FIG. 9 is a schematic cross-sectional side view of a semiconductor integrated circuit device which implements backside power rails and a backside power distribution network to enable density scaling, according to another exemplary embodiment of the disclosure. More specifically, FIG. 9 is schematic cross-sectional side view of a semiconductor integrated circuit device 200 which is similar to the semiconductor integrated circuit device 100 of FIGS. 1A and B, except that the frontside source/drain contact 161 is connected to a local (lateral) interconnect wire 261 to allow the source/drain element 124 of the PFET device 120-3 of the cell C1 to be connected to a metal track T8 in the adjacent cell C3.

The exemplary embodiment of FIG. 9 utilizes the unused space that exists in the frontend MOL layer above source/drain elements which are connected to the backside power delivery structure 190 by backside source/drain contacts (and thus have no frontside source/drain contacts). In this regard, the cells C1, C2, and C3 can be formed with lateral wiring in the MOL layer which extends across the cell boundaries (e.g., boundaries $B_1$ and $B_2$) to enable the source/drain element of one cell to be connected to the metal (signal) track of an adjacent cell. The embodiment of FIG. 9 provides a flexible framework for local interconnect routing to avoid local MOL congestions, wherein the 4-track cells C1, C2, and C3 can utilize additional signal tracks in other adjacent cells.

As discussed above, exemplary embodiments of the disclosure implement backside source/drain contacts in conjunction with a full backside power delivery framework to eliminate the use of FEOL via contacts for connecting frontside source/drain contact to buried power lines, which enables significant scaling of the cell-to-cell spacing $S_2$ between the adjacent cells, and thus reduced cell height. A further challenge to further aggressive scaling of the cell-to-cell spacing $S_2$ between the adjacent cells are the limitations associated with gate cut tolerance and "gate extension" requirements. As is known in the art, for nanosheet FET devices, a gate extension ($G_{ext}$) refers to the distance/length of the gate material which extends past the sides of the stacked nanosheet channel structure which define the gate width $W_G$ (or nanosheet width).

For example, as discussed above, FIG. 5B illustrates that the gate extension $G_{ext}$ of a nanosheet FET device denotes the length of the space that exists between the width ends of the nanosheet stack structures and the sidewalls of the gate cut elements 137. The gate extension $G_{ext}$ depends on the size (GT) and alignment of the gate cut element 137 which are formed by the gate cut process. As further shown in FIG. 5B, the cell-to-cell spacing $S_2$ between the NFET devices 120-1 and 120-2 in the adjacent cells C2 and C1 is equal to the width (GT) of the gate cut element 137 and the gate extensions $G_{ext}$ of the adjacent NFET devices 120-1 and 120-2. Similarly, the cell-to-cell spacing $S_2$ between the PFET devices 120-3 and 120-4 in the adjacent cells C1 and C3 is equal to the width (GT) of the gate cut element 137 and the gate extensions $G_{ext}$ of the adjacent PFET devices 120-3 and 120-4.

As the cell-to-cell spacing $S_2$ scales, it becomes more difficult to properly align the gate cut GT to ensure that a sufficient gate extension $G_{ext}$ exists for proper operation of the nanosheet FET devices. Ideally, a cell-to-cell spacing of about 35 nm would be desirable with gate extensions $G_{ext}$ of 10 nm, and a gate cut GT of 15 nm. However, due to the tolerances of the gate cut GT with respect to size and alignment of the gate cut elements 137 that are formed as a result of the gate cut process, a target cell-to-cell spacing of, e.g., about 43 nm would be needed with target gate extensions $G_{ext}$ of 14 nm, and a target gate cut GT of 15 nm, to ensure that the gate extensions are no less than 10 nm in the event of a slightly misaligned gate cut GT. As explained in further detail below, exemplary embodiments of the disclosure include techniques for precisely controlling the sizes of the gate extensions $G_{ext}$ and alignment of the dielectric isolation between the nanosheet stacks of adjacent nanosheet FET devices.

Figure 10A:
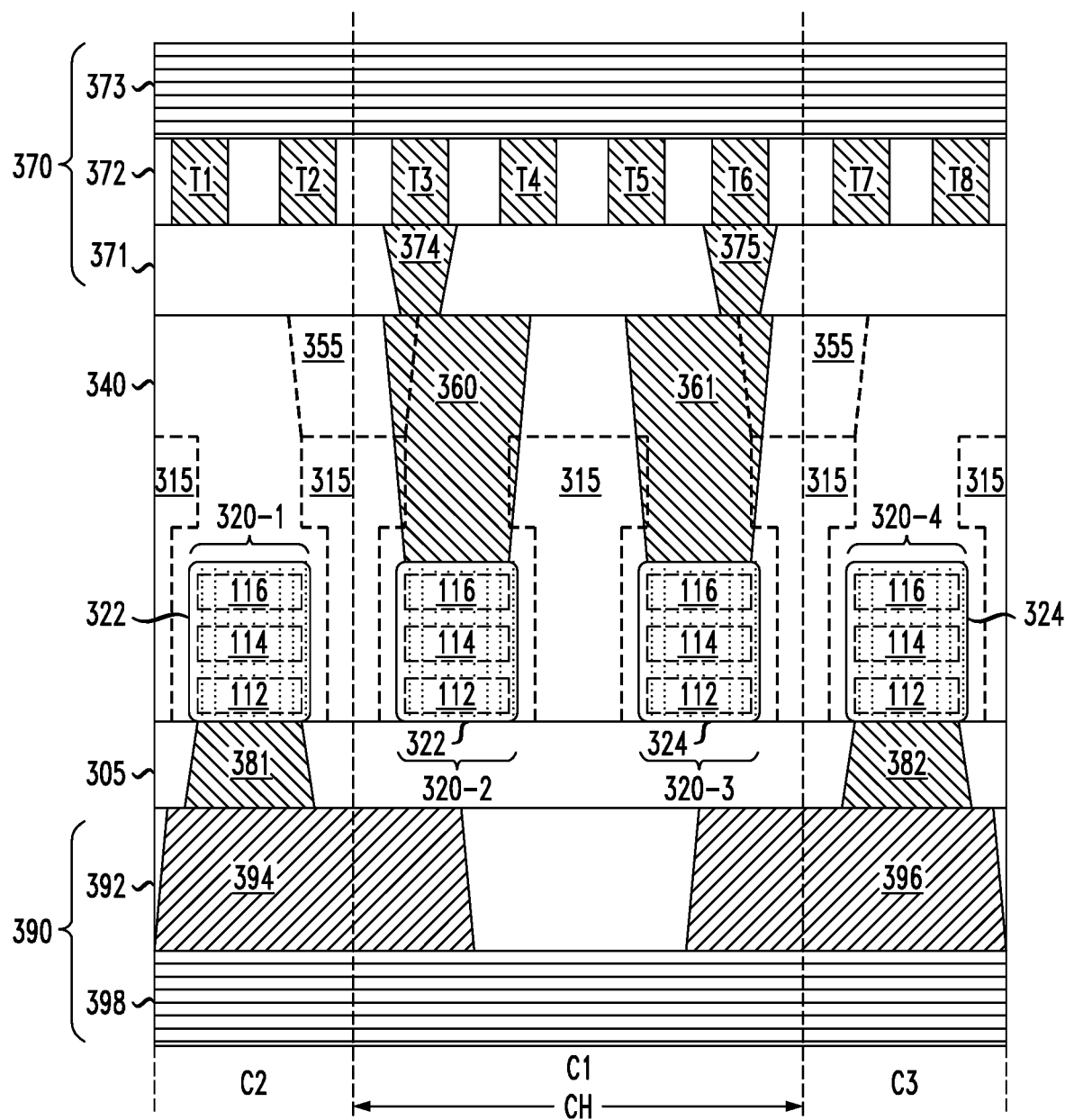
FIGS. 10A and 10B are schematic views of a semiconductor integrated circuit device which implements backside power rails and a backside power distribution network to enable density scaling, according to another exemplary embodiment of the disclosure.
Figure 10B:
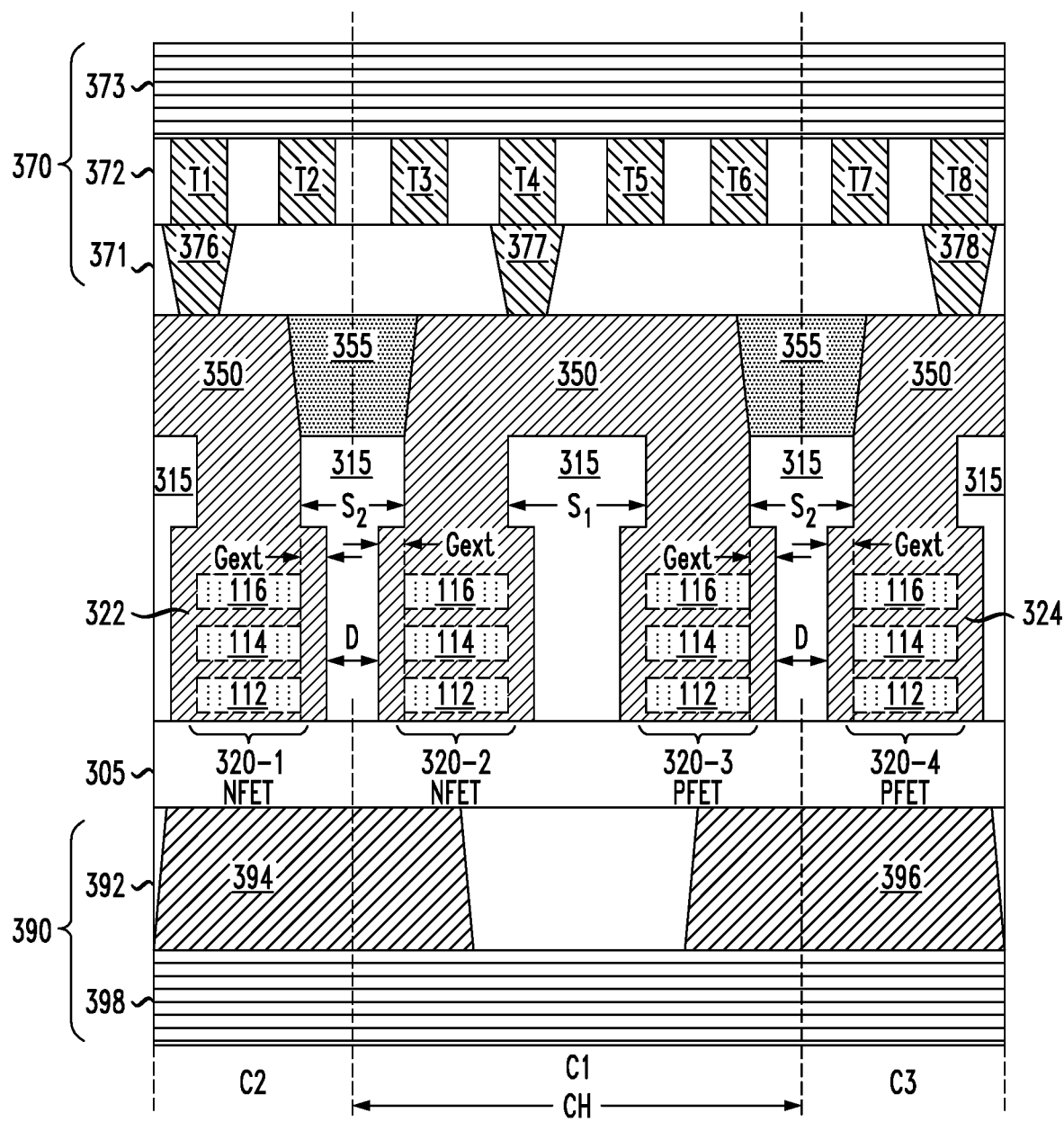

FIGS. 10A and 10B are schematic views of a semiconductor integrated circuit device 300 which implements backside power rails and a backside power distribution network to enable density scaling, according to another exemplary embodiment of the disclosure. The semiconductor integrated circuit device 300 is similar to the semiconductor integrated circuit device 100 (FIGS. 1A and 1B) as discussed above, except that the semiconductor integrated circuit device 300 comprises self-aligned dielectric isolation structures for precisely controlling the sizes of the gate extensions $G_{ext}$ of adjacent FET devices of adjacent cells, and the size of the dielectric isolation between the nanosheet channel stacks of adjacent FET devices of adjacent cells, to thereby precisely control cell-to-cell spacing between adjacent cells.

Similar to the exemplary semiconductor integrated circuit 100 of FIG. 1A, the semiconductor integrated circuit device 300 comprises a plurality of cells C1, C2, and C3, wherein the cells C1, C2, and C3 comprise a plurality of nanosheet FET devices 320-1, 320-2, 320-3, and 320-4, which are disposed on a BOX layer 305. In some embodiments, the nanosheet FET devices 320-1 and 320-2 comprise NFET devices, and the nanosheet FET devices 120-3 and 120-4 comprise PFET devices. The NFET devices 320-1 and 320-2 comprise source/drain elements 322, and the PFET devices 320-3 and 320-3 comprises source/drain elements 324. Further, in an exemplary embodiment, the nanosheet FET devices 320-1, 320-2, 320-3, and 320-4 each comprise a stacked nanosheet channel structure comprising three active nanosheet channel layers 112, 114, and 116.

In addition, similar to the exemplary semiconductor integrated circuit 100 of FIG. 1A, a frontside of the semiconductor integrated circuit device 300 shown in FIGS. 10A and 10B further comprises an ILD layer 340, high-k metal gates 350 (which encapsulate the stacked nanosheet channel structures of the nanosheet FET devices 320-1, 320-2, 320-3, and 320-4), frontside source/drain contacts 360 and 361, and a BEOL interconnect structure 370. The BEOL interconnect structure 370 comprises dielectric layers 371 and 372 which comprise a first metallization level, and additional BEOL metallization levels 373 disposed over the first level of metallization. The dielectric layer 371 comprises a plurality of via contacts 374, 375, 376, 377, and 378 formed therein, and the dielectric layer 472 comprises a first metallization level M1 (or initial metallization level sometimes denoted M0 or Mint) which comprises a plurality of metal tracks T1, T2, T3, T4, T5, T6, T7, and T8. In some embodiments, the metal tracks T1-T8 provide local interconnects that distribute signals to, from, and between the nanosheet FET devices 320-1, 320-2, 320-3, and 320-4, while the upper metal levels 373 of the BEOL interconnect structure 370 comprise semi-global and global wiring. As shown in FIG. 10A, the via contacts 374 and 375 connect the respective frontside source/drain contacts 360 and 361 to the respective metal tracks T3 and T6 the first metallization level. In addition, as shown in FIG. 10B, the via contacts 376, 377, and 378 connect the respective metal gates 150 to respective metal tracks T1, T4, and T8 of the first metallization level. In some embodiments, the metal gates 350 comprise high-k metal gate structures.

Further, similar to the exemplary semiconductor integrated circuit 100 of FIG. 1A, a backside of the semiconductor integrated circuit device 300 shown in FIGS. 10A and 10B comprises backside source/drain contacts 381 and 382 (which are formed in the BOX layer 105), and a full backside power delivery structure 390. The full backside power delivery structure 390 comprises a backside dielectric layer 392 formed on the BOX layer 305, a plurality of backside power rails 394 and 396 formed in the backside dielectric layer 392, and a backside power distribution network 398. The backside source/drain contact 381 connects the source/drain element 322 of the NFET device 320-1 of the cell C2 to the backside power rail 394, and the backside source/drain contact 382 connects the source/drain element 324 of the PFET device 320-4 of the cell C3 to the backside power rail 394. The backside power distribution network 398 comprises one or more levels wiring that is configured to distribute positive power supply voltage (e.g., VDD) and negative power supply voltage (e.g., VSS, ground (GND)=0V) to the backside power rails 394 and 396. For example, in an exemplary embodiment, the backside power distribution network 398 connects negative supply voltage (VSS) to the backside power rail 394, and connects positive supply voltage (VDD) to the backside power rail 396.

As further shown in FIGS. 10A and 10B, the semiconductor integrated circuit device 300 comprises a plurality of self-aligned dielectric isolation elements 315, and upper gate cut elements 355, which collectively serve to isolate the gate structures 350 of the nanosheet FET devices in adjacent cells. The self-aligned dielectric isolation elements 315 have wider upper portions disposed above the stacks of nanosheet channel layers, 112, 114, and 116, and narrower lower portions that are disposed between the stacks of nanosheet channel layers 112, 114, and 116. The upper gate cut elements 355 are formed in alignment with the self-aligned dielectric isolation elements 315 in the cell boundary regions between adjacent cells, and are formed on the wider upper portions of the self-aligned dielectric isolation elements 315 in the cell boundary regions to isolate the metal gate electrodes 350 in the different cells.

As shown in FIG. 10B, the self-aligned dielectric isolation elements 315 serve to precisely control the size of the gate extensions $G_{ext}$ of the nanosheet FET devices 320-1, 320-2, 320-3, and 320-4. In addition, as shown in FIG. 10B, the wider upper portions of the self-aligned dielectric isolation elements 315 in the cell boundary regions have a width that is equal to the cell-to-cell spacing S2 between adjacent cells, and the narrower lower portions of the self-aligned dielectric isolation elements 315 in the cell boundary regions provide a well-defined dielectric isolation (or lower gate cut) of the metal gate material between the adjacent stacks of nanosheet channel layers of adjacent FET devices of adjacent cells. The narrower lower portions of the self-aligned dielectric isolation elements 315 in the cell boundary regions provide a controlled spacing D of dielectric isolation between the adjacent FET devices of adjacent cells, wherein D represents a lower gate cut size which can have a smaller critical dimension (e.g., 8 nm) that is smaller than the upper gate cut size defined by the width of the upper gate cut elements 355. This configuration allows for aggressive scaling of the cell-to-cell spacing $S_2$, where $S_2=D+2G_{ext}$, because $G_{ext}$ can be precisely controlled using techniques as will be discussed in further detail below. For example, in a non-limiting exemplary embodiment, $G_{ext}$ is about 10 nm (or less) and D is about 8 nm (or less), resulting in a cell-to-cell spacing $S_2$ of about 28 nm (or less).

Figure 11:
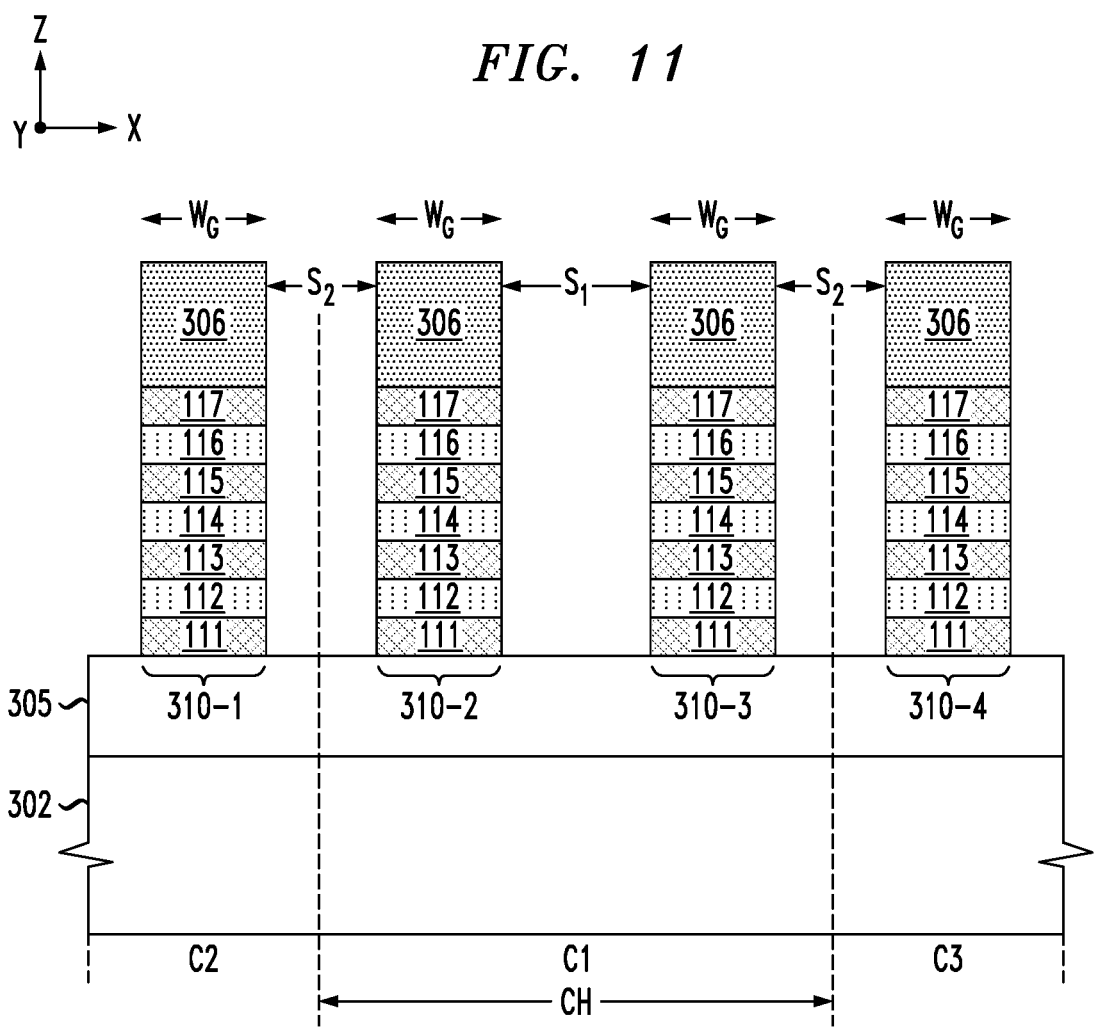

FIGS. 11-16C schematically illustrate a method for fabricating the semiconductor integrated circuit device 300 of FIGS. 10A and 10B, according to another exemplary embodiment of the disclosure. To begin, FIG. 11 is a schematic cross-sectional side view (X-Z plane) of intermediate device structure of the semiconductor integrated circuit device 300 at an intermediate stage of fabrication, which comprises a semiconductor substrate 302, an insulating layer 305, a plurality of patterned nanosheet stack structures 310-1, 310-2, 310-3, and 310-4 disposed on the insulating layer 305, and hard mask layers 306 disposed on top of the patterned nanosheet stack structures 310-1, 310-2, 310-3, and 310-4. Similar to the exemplary embodiments discussed above, the patterned nanosheet stack structures 310-1, 310-2, 310-3, and 310-4 each comprise a stack of epitaxial semiconductor layers 111, 112, 113, 114, 115, 116, and 117, including sacrificial nanosheet layers 111, 113, 115, and 117, and active nanosheet channel layers 112, 114, and 116.

The hard mask layers 306 are utilized to pattern an initial nanosheet stack structure (e.g., nanosheet stack structure 110, as shown in FIG. 2), to form the patterned nanosheet stack structures 310-1, 310-2, 310-3, and 310-4, which define a gate width $W_G$ of the FET devices within the cells. In the exemplary embodiment of FIG. 11, the cell-to-cell spacing $S_2$ in the cell boundaries between the patterned nanosheet stack structures 310-1 and 310-2, and between the patterned nanosheet stack structure 310-3 and 310-4 can be scaled to about 28 nm (or less). The intermediate structure of FIG. 11 is formed using the same or similar materials and techniques as discussed above in conjunction with FIGS. 2, 3A, and 3B, the details of which will not be repeated.

Figure 12:
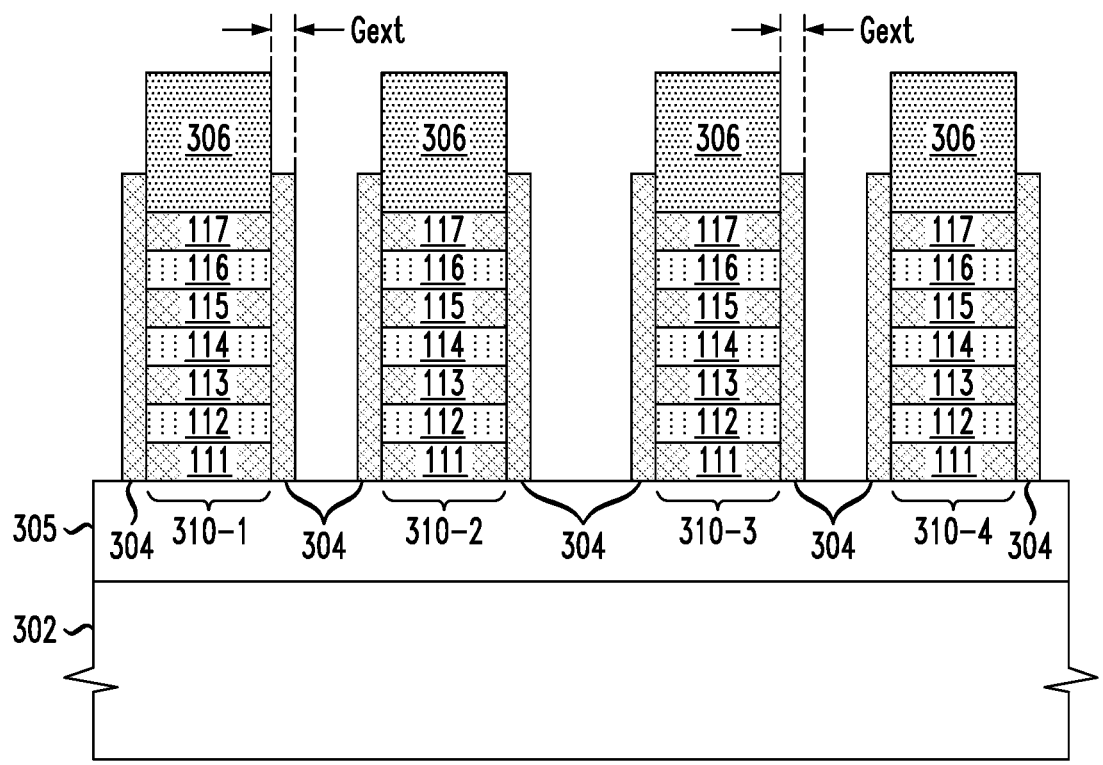

Next, FIG. 12 is a schematic cross-sectional side view of a next intermediate structure of the semiconductor integrated circuit device, which is constructed by forming sacrificial spacer layers 304 on sidewalls of the patterned nanosheet stack structures 310-1, 310-2, 310-3, and 310-4, according to an exemplary embodiment of the disclosure. The sacrificial spacer layers 304 are formed with a thickness that is equal to a target gate extension length $G_{ext}$. In some embodiments, the sacrificial spacer layers 304 are formed by a process which comprises (i) depositing a conformal layer of sacrificial material over the intermediate device structure of FIG. 11, (ii) anisotropically etching the conformal layer sacrificial material to form the sacrificial spacer layers 304.

In some embodiments, the conformal layer of sacrificial material comprises a SiGe alloy material, which is deposited using an atomic layer deposition (ALD) process. The use of SiGe material allows the sacrificial spacer layers 304 to be selectively etched away along with the sacrificial nanosheet layers 111, 113, 115, and 117 during a subsequent process to release the active nanosheet channel layers 112, 114, and 116 and form the metal gates 350. The use of ALD enables deposition of a highly conformal layer of sacrificial material and, thus, precisely control the thickness of the conformal layer of sacrificial material to the target gate extension length $G_{ext}$. For example, in some embodiments, the sacrificial spacer layers 304 are formed with a thickness of about 10 nm. Following the deposition of the conformal layer of sacrificial material having a thickness equal to the target gate extension length $G_{ext}$, an anisotropic etch process (e.g., reactive ion etch (RIE) process) is performed to completely remove the horizontal portions of the conformal layer of sacrificial material on the lateral surfaces of the structures, and to recess the vertical portions of the conformal layer of sacrificial material on the hard mask layers 306 down to a target level which is above the top of the patterned nanosheet stack structures 310-1, 310-2, 310-3, and 310-4, as shown in FIG. 12.

Figure 13:
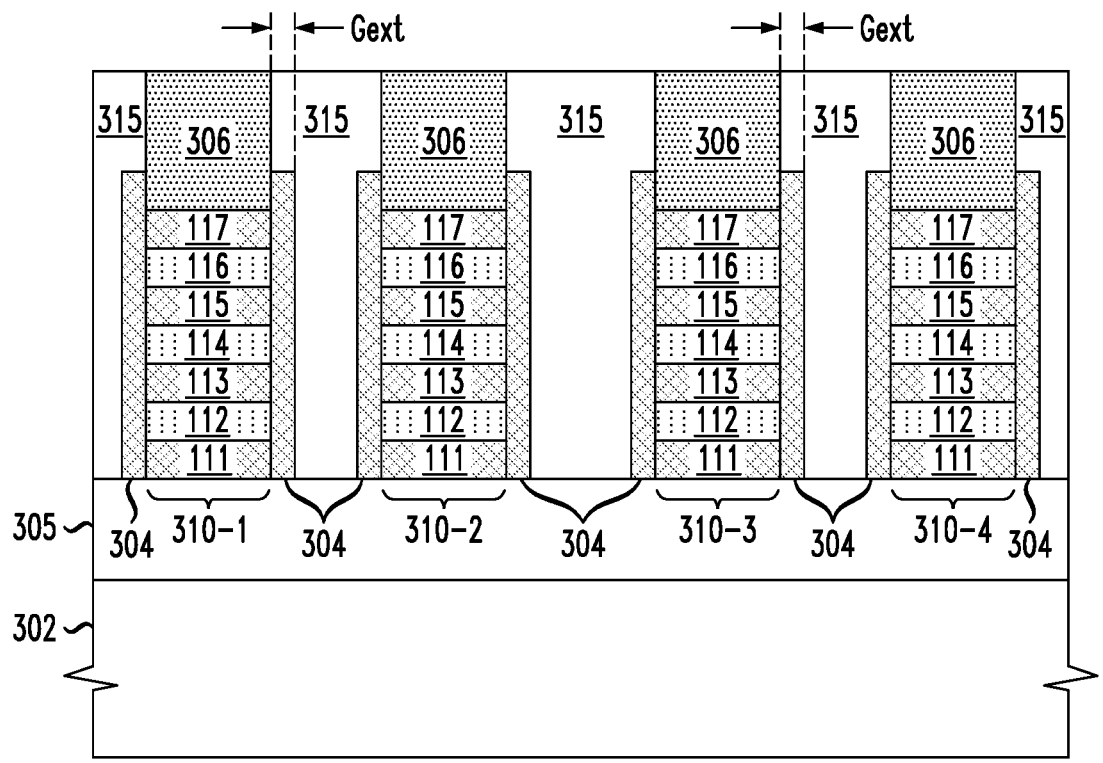

Next, FIG. 13 is a schematic cross-sectional side view of a next intermediate structure of the semiconductor integrated circuit device, which is constructed by forming the self-aligned dielectric isolation elements 315 between the patterned nanosheet stack structures 310-1, 310-2, 310-3, and 310-4, according to an exemplary embodiment of the disclosure. In some embodiments, the self-aligned dielectric isolation elements 315 are formed by depositing a layer of dielectric material to fill the spaces between patterned nanosheet stack structures 310-1, 310-2, 310-3, and 310-4 with the dielectric material, followed by a planarizing process (e.g., CMP) to remove the overburden dielectric material down to the upper surfaces of the hard mask layers 302, as shown in FIG. 13. In some embodiments, the self-aligned dielectric isolation elements 315 are formed of a different dielectric material that has etch selectivity with respect to the dielectric material of the hard mask layers. For example, assuming the hard mask layers 302 are formed of SiN, the self-aligned dielectric isolation elements 315 can be formed using a low-k SiC material or a low-k SiOC material, etc.

Figure 14A:
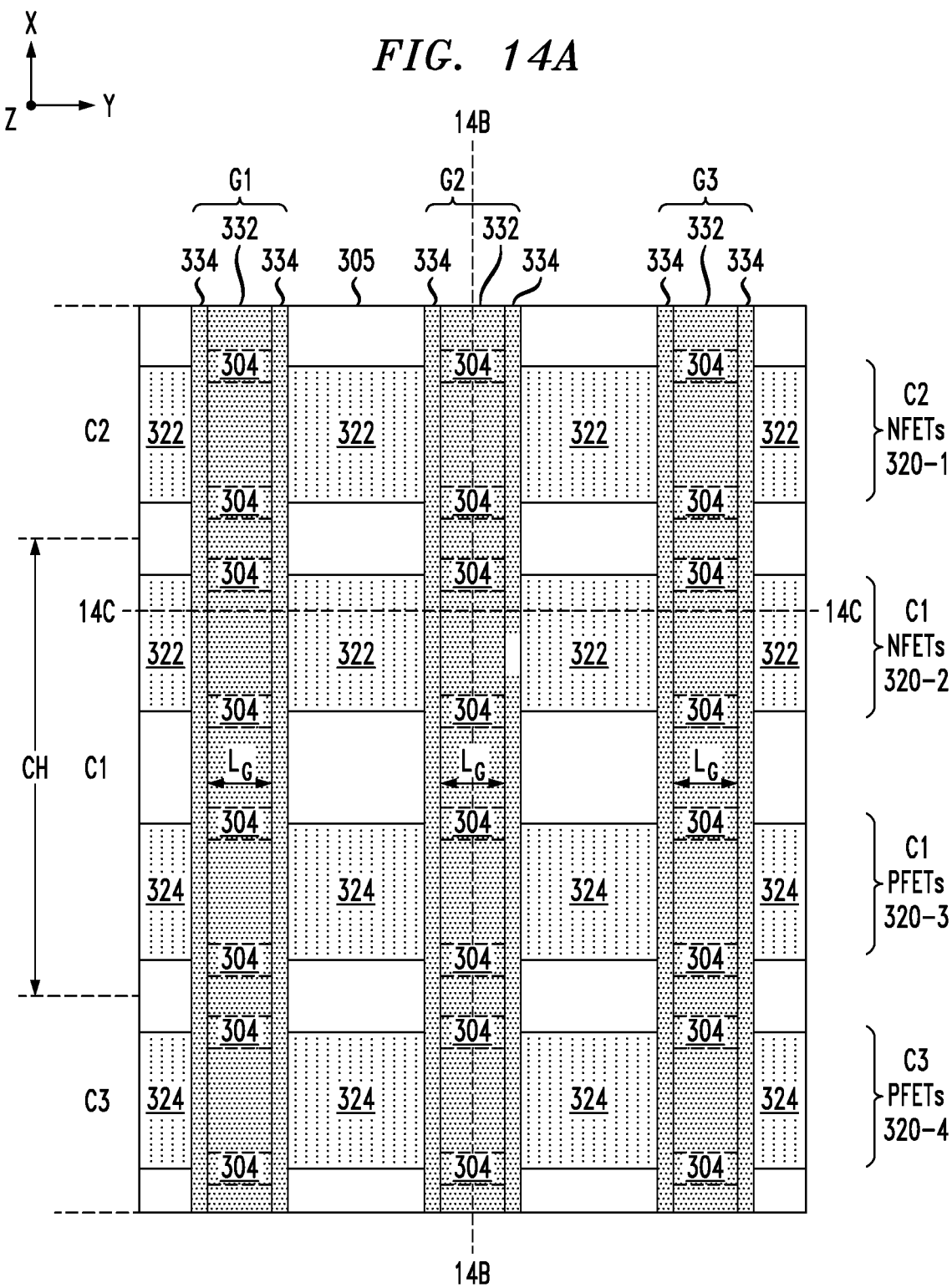
FIGS. 14A, 14B, and 14C are schematic views of a next intermediate structure of the semiconductor integrated circuit device, which is constructed by forming dummy gate structures, and forming source/drain elements of transistor devices, according to an exemplary embodiment of the disclosure.
Figure 14B:
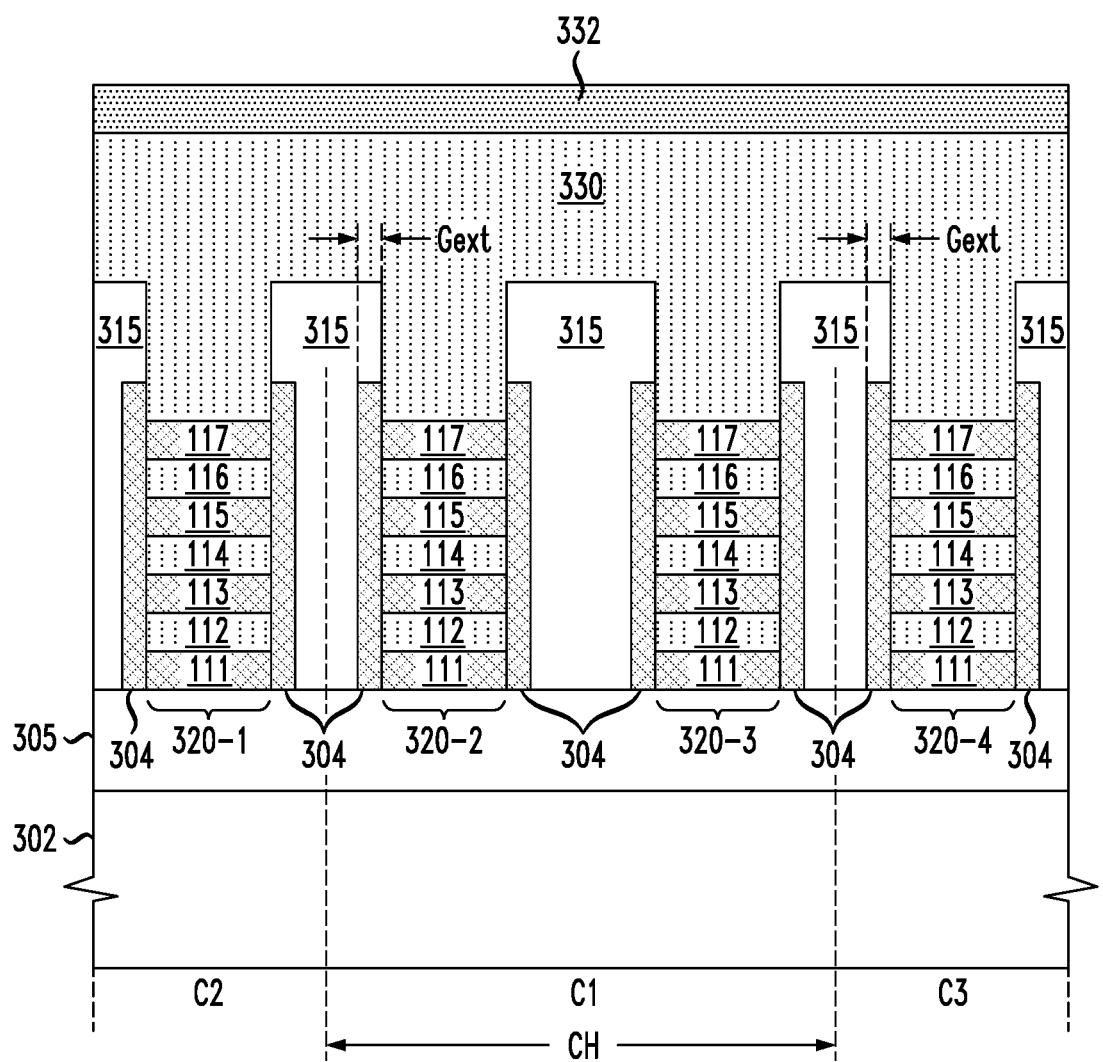
Figure 14C:
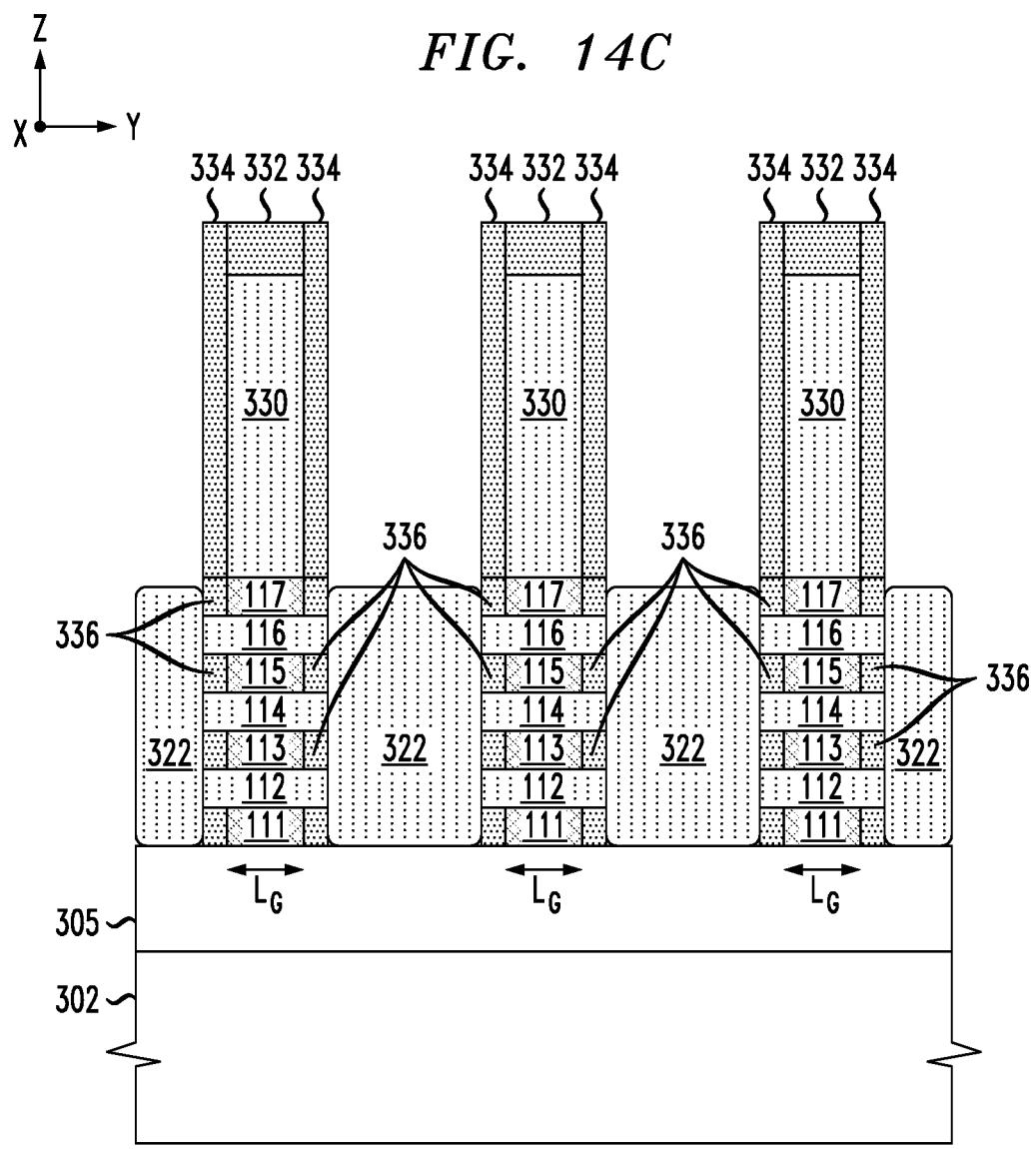

Next, FIGS. 14A, 14B, and 14C are schematic views of a next intermediate structure of the semiconductor integrated circuit device, which is constructed by forming dummy gate structures, and forming source/drain elements of the FET devices, according to an exemplary embodiment of the disclosure. In particular, FIG. 14A is a schematic top plan view (X-Y plane) of the intermediate device structure, FIG. 14B is a schematic cross-sectional side view (X-Z plane) of the intermediate device structure along line 14B-14B shown in FIG. 14A, and FIG. 14C is a schematic cross-sectional side view (Y-Z plane) of the resulting semiconductor structure along line 14C-14C shown in FIG. 14A. In particular, as schematically shown in FIG. 14A, a plurality of dummy gate structures G1, G2, and G3 are formed across the cells. As compared to the exemplary embodiment shown in FIGS. 4A-4C above, the gate structures G1, G2, G3 are not yet cut in the cell boundary regions to form separate gate structures. During the gate formation process, the patterned nanosheet stack structures 310-1, 310-2, 310-3, and 310-4 (as shown in FIG. 13) are further patterned (in the Y-direction) to form individual nanosheet stack structures for the individual NFET devices 320-1 and 320-2 in the cells C1 and C2, and individual nanosheet stack structures for the individual PFET devices 320-3 and 320-4 in the cells C1 and C3. The additional patterning of the nanosheet stack structures 310-1, 310-2, 310-3, and 310-4 defines a gate length $L_G$ of the transistors within the cells, as shown in FIGS. 14A and 14C.

As shown in FIGS. 14A, 14B, and 14C, the gate structures G1, G2, and G3 comprise dummy gates 330 (e.g., conformal oxide layer and a dummy gate electrode layer (e.g., sacrificial polysilicon or amorphous silicon material). In addition, the gate structures G1, G2, and G3 comprise gate capping layers 332, gate sidewall spacers 334, and embedded sidewall spacers 336. Following formation of the embedded gate sidewall spacers 136, the source/drain elements 322 of the NFET devices 320-1 and 320-2 are epitaxially grown on the exposed sidewall surfaces of the active nanosheet channel layers 112, 114, and 116 of the NFET devices 320-1 and 320-2 using a first epitaxy process, and the source/drain elements 324 of the PFET devices 320-3 and 320-4 are epitaxially grown on the exposed sidewall surfaces of the active nanosheet channel layers 112, 114, and 116 of the PFET devices 320-3 and 320-4 using a second epitaxy process. It is to be understood that the intermediate device structure shown in FIGS. 14A, 14B, and 14C can be fabricated using the same or similar methods as discussed above in conjunction with FIGS. 4A, 4B, and 4C, the details of which will not be repeated.

The process flow to form the intermediate device structure shown in FIGS. 14A, 14B, and 14C varies from the process flow described above in conjunction with FIGS. 4A, 4B, and 4C, to the extent that the gate cut process is not yet performed on the gate structures G1, G2, and G3 across the cell boundaries to form separate the dummy gate structures. For example, as compared to the exemplary embodiment shown in FIG. 4C where the cells C1, C2, and C3 have separate dummy gate structures 130, the exemplary embodiment of FIG. 14B shows that the cells C1, C2, and C3 have separate dummy gate structures 130 resulting from gate cut process. However, as shown in FIG. 14B, the self-aligned dielectric isolation elements 315 essentially provide (i) a well-defined gate cut between the stacked nanosheet channel layers of the adjacent NFET devices 320-1 and 320-2 of the adjacent cells C2 and C1, and (ii) a well-defined gate cut between the stacked nanosheet channel layers of the adjacent PFET devices 320-3 and 320-4 of the adjacent cells C1 and C3, despite the cells C1, C2, and C3 sharing an uncut dummy gate 330 at this stage of the fabrication process.

Figure 15A:
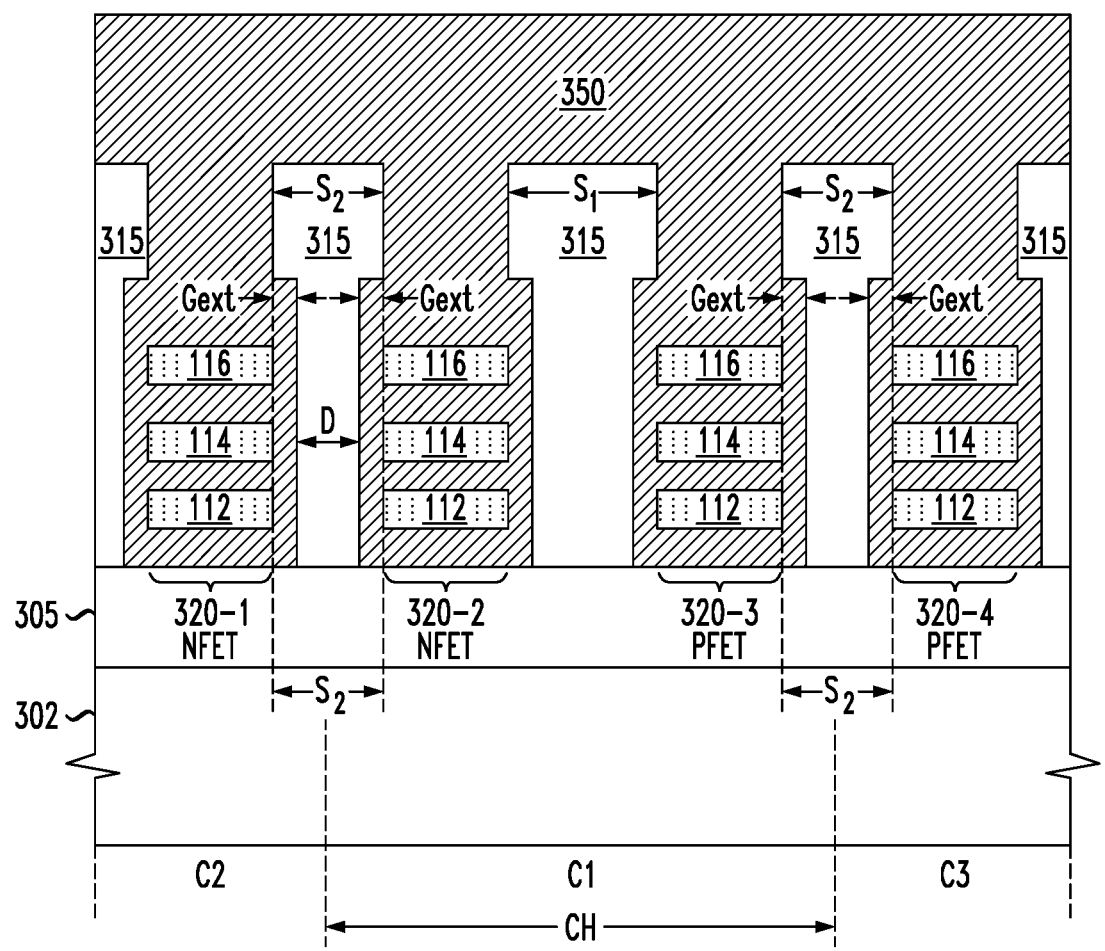
FIGS. 15A and 15B are schematic views of a next intermediate structure of the semiconductor integrated circuit device, which is constructed by forming an interlayer dielectric layer, and performing replacement metal gate process to replace the dummy gates with metal gates, according to an exemplary embodiment of the disclosure.
Figure 15B:
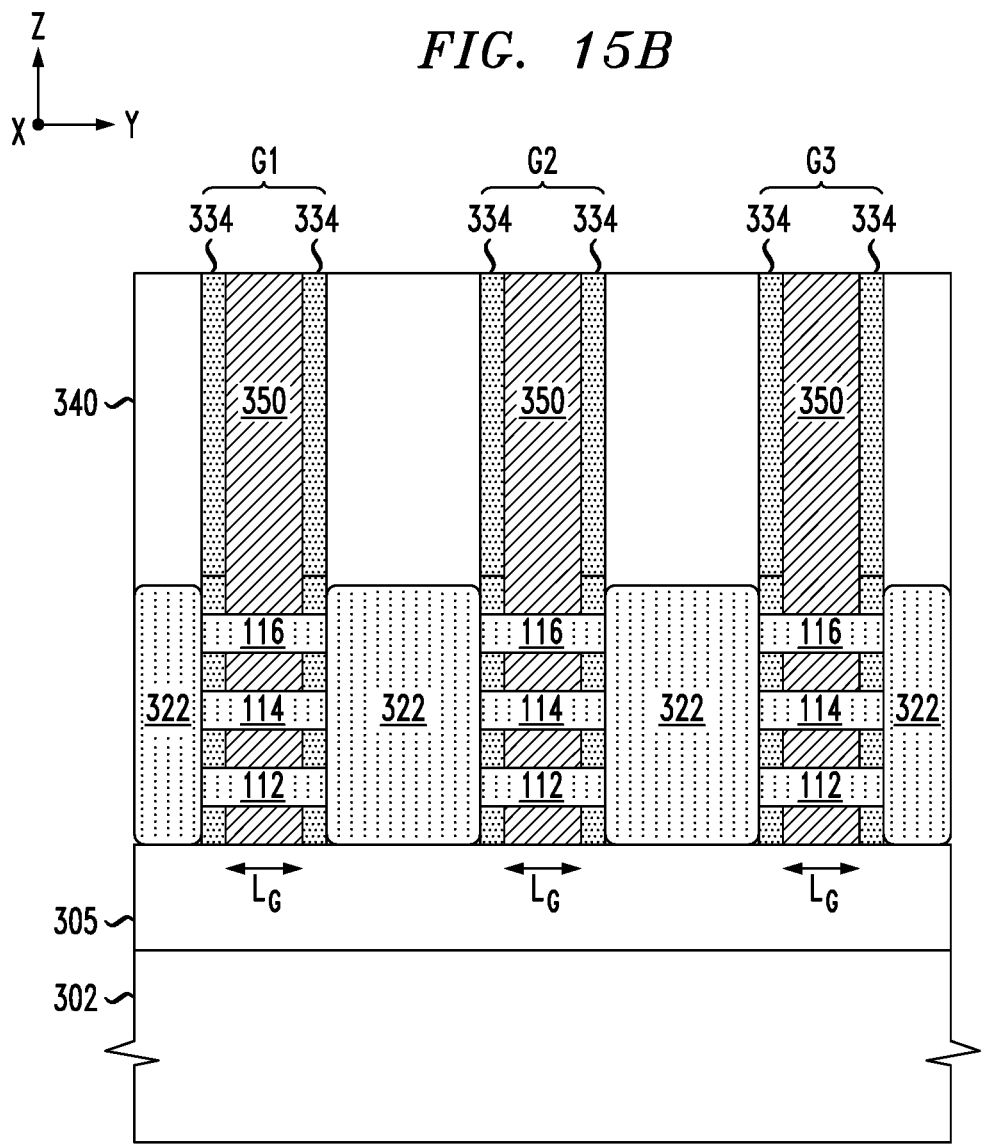

Next, FIGS. 15A and 15B are schematic views of a next intermediate structure of the semiconductor integrated circuit device, which is constructed by forming an interlayer dielectric layer, and performing replacement metal gate process to replace the dummy gates with metal gates, according to an exemplary embodiment of the disclosure. More specifically, FIGS. 15A and 15B are schematic cross-sectional side views of the intermediate structure shown in FIGS. 14B and 14C, respectively, after forming the first ILD layer 340, and forming metal gates 350 in place of the dummy gates 330. In some embodiments, the intermediate device structure shown in FIGS. 15A and 15B is formed using the same materials and process flow as described above in conjunction with FIGS. 5A and 5B, the details of which will not be repeated.

As shown in FIG. 15A, during the replacement metal gate process, prior to forming the metal gate 350, the sacrificial spacer layers 304 are etched away along with the sacrificial nanosheet layers 111, 113, 115, and 117 to release the active nanosheet channel layers 112, 114, and 116, and form a well-defined gate extension region $G_{ext}$ which is filled with metallic material to form the metal gate 350 which encapsulates the active nanosheet channel layers 112, 114, and 116. In this configuration, as noted above, a well-defined and highly scaled cell-to-cell spacing $S_2$ is achieved between the adjacent cells C1 and C2, and C1 and C3, by virtue of formation of the self-aligned dielectric isolation elements 315 and sacrificial spacer layers 304. Following the replacement metal gate process, as shown in FIG. 15A, the cells C1, C2, and C3 share an uncut metal gate 350 at this stage of the fabrication process.

Figure 16A:
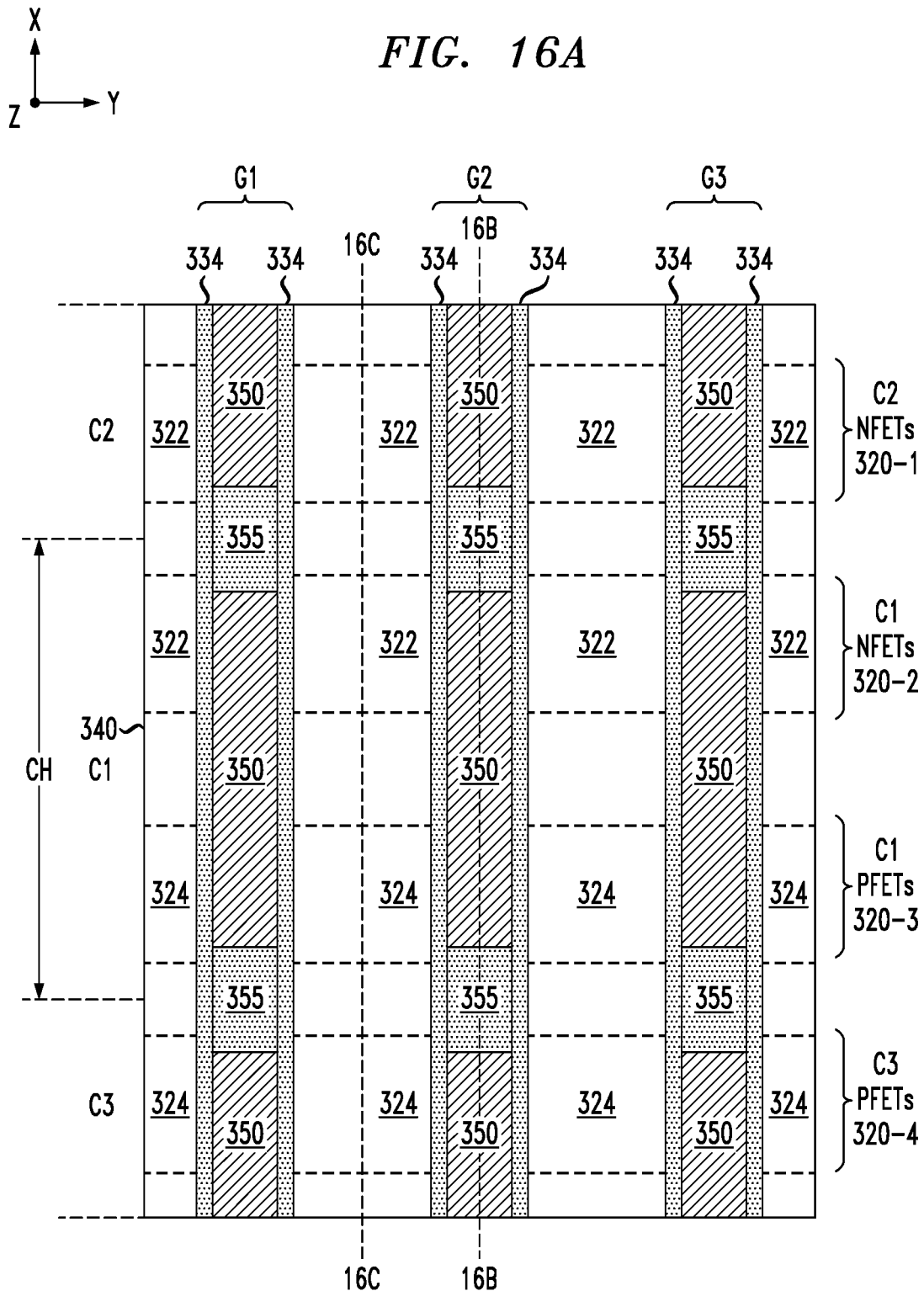
Figure 16B:
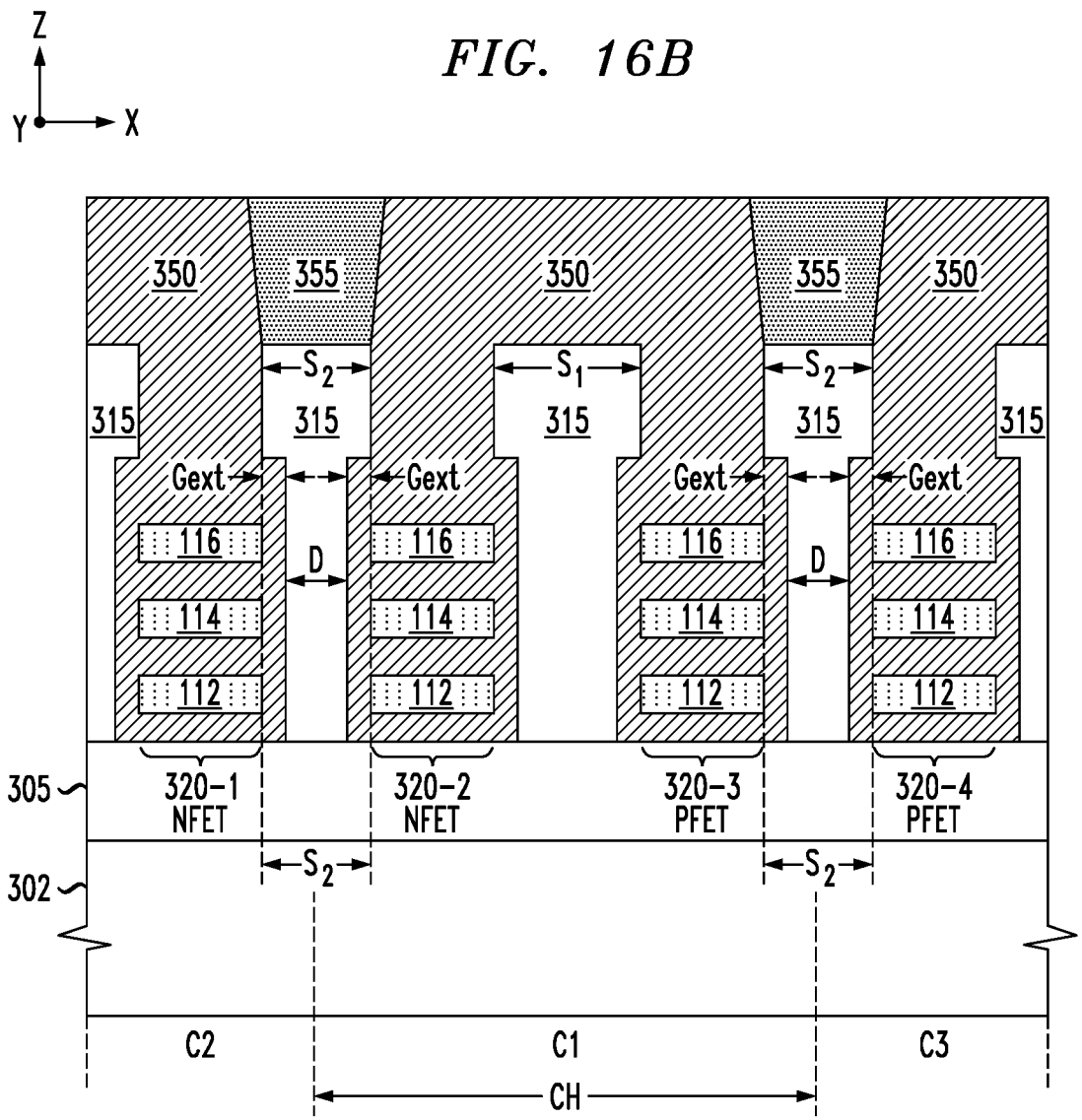
Figure 16C:
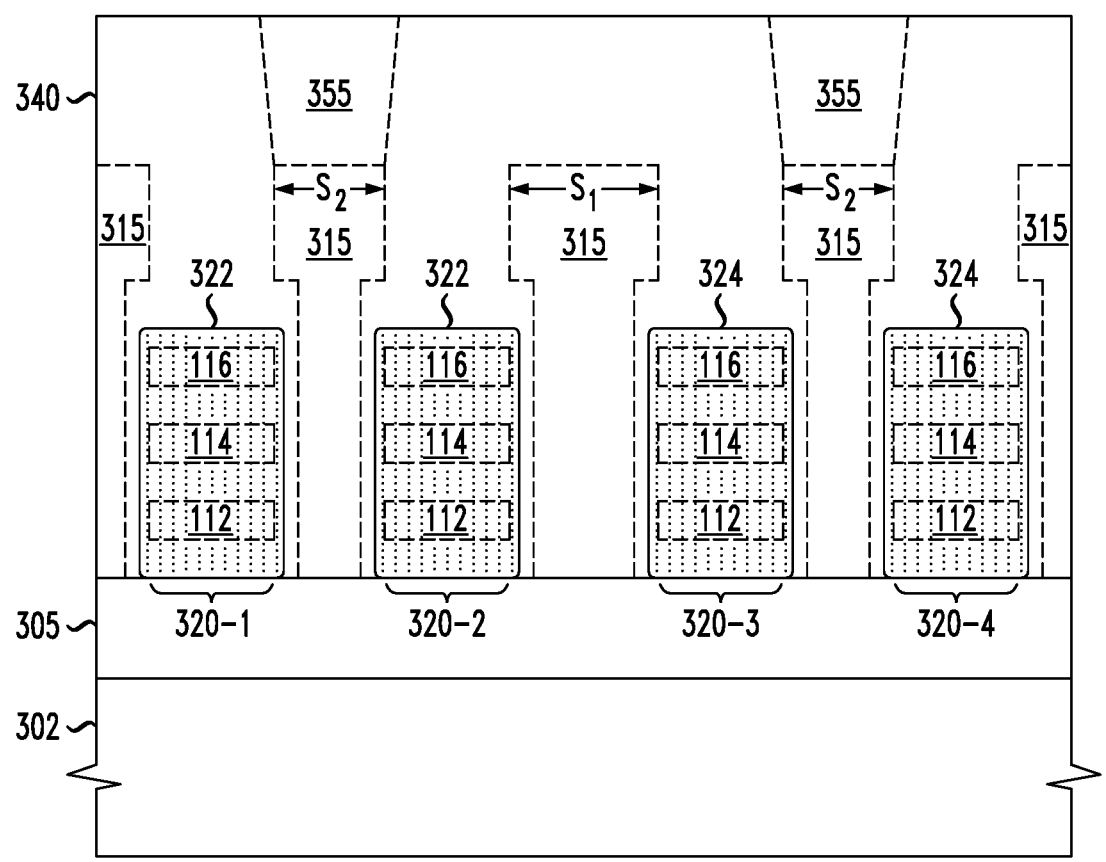

Next, FIGS. 16A, 16B, and 16C are schematic views of a next intermediate structure of the semiconductor integrated circuit device, which is constructed by performing a late gate process to form upper gate cut elements to isolate metal gate structures of the nanosheet FET devices in adjacent cells, according to an exemplary embodiment of the disclosure. More specifically, FIG. 16A is a schematic top plan view of the intermediate device structure which illustrates a plurality of upper gate cut elements 355 that are formed in the cell boundary regions of the gate structures G1, G2, and G3 to isolate the metal gates 350 in the different cells C1, C2, and C3. FIG. 16B is a schematic cross-sectional side view of the intermediate device structure along line 16B-16B in FIG. 16A, and FIG. 16C is a schematic cross-sectional side view of the intermediate device structure along line 16C-16C in FIG. 16A.

As shown in FIGS. 16B and 16C, the upper gate cut elements 355 are formed in alignment with self-aligned dielectric isolation elements 315 in the cell boundary regions. The upper gate cut elements 355 are configured to cut the continuous metal gate electrodes 350 that are formed along the gate structures G1, G2, and G3 following the replacement metal gate process to thereby form separate metal gate electrodes, as shown in FIGS. 16A and 16B. With this late gate cut process, the upper gate cut elements 355 serve to isolate the gate electrodes 350 in adjacent cells, without affecting the well-defined and highly scaled cell-to-cell spacing $S_2$ that exists between the adjacent cells C1 and C2, and C1 and C3 by virtue of the lower narrower portions of the self-aligned dielectric isolation elements 315 and the well-defined gate extension regions $G_{ext}$. As such, the upper gate cut elements 355 can be fabricated with relaxed tolerances.

In some embodiments, the upper gate cut elements 355 are formed by a process which comprises (i) forming an etch mask over the intermediate device structure shown in FIGS. 15A and 15B, wherein the etch mask comprises openings that are aligned to the upper portions of the self-aligned dielectric isolation elements 315 in the cell boundary regions, (ii) etching exposed portions of the metal gate 350 (which are exposed through the etch mask openings) down to the upper surface of the self-aligned dielectric isolation elements 315 in the cell boundary regions, (iii) depositing a layer of dielectric material over the ILD layer 340 to fill the etched trenches in the metal gate 350 with the dielectric material, and (iv) performing a planarizing process (e.g., CMP) to remove the overburden dielectric material down to ILD layer 340. In some embodiments, the upper gate cut elements 355 are formed of a dielectric material such as SiN, SiOCN, SiBCN, SiC or SiOC, or other suitable dielectric materials, etc.

Following the late gate cut process, additional frontside processing is performed to form the frontside MOL source/drain contacts 360 and 361, and the BEOL interconnect structure 370, followed by backside processing to form the backside source/drain contacts 381 and 382 in the BOX layer 105, and the full backside power delivery structure 390, resulting in the semiconductor integrated circuit device 300 shown in FIGS. 10A and 10B. In some embodiments, the frontside and backside processing is performed using the same or similar materials and techniques as discussed above in conjunction with FIGS. 6A-6C, 7, 8, and 9, the details of which will not be repeated.

Figure 17A:
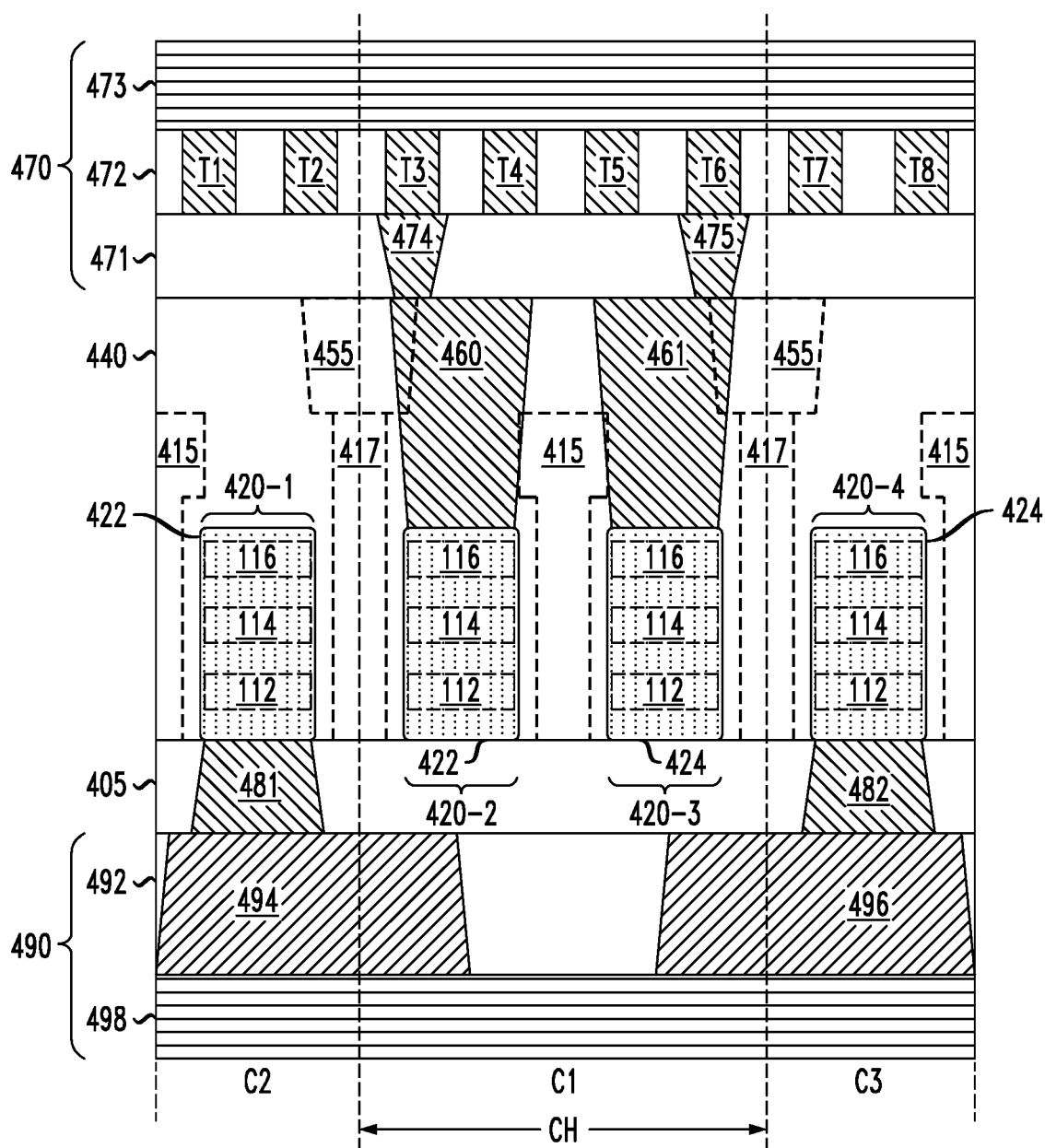
FIGS. 17A and 17B are schematic views of a semiconductor integrated circuit device which implements backside power rails and a backside power distribution network to enable density scaling, according to another exemplary embodiment of the disclosure.
Figure 17B:
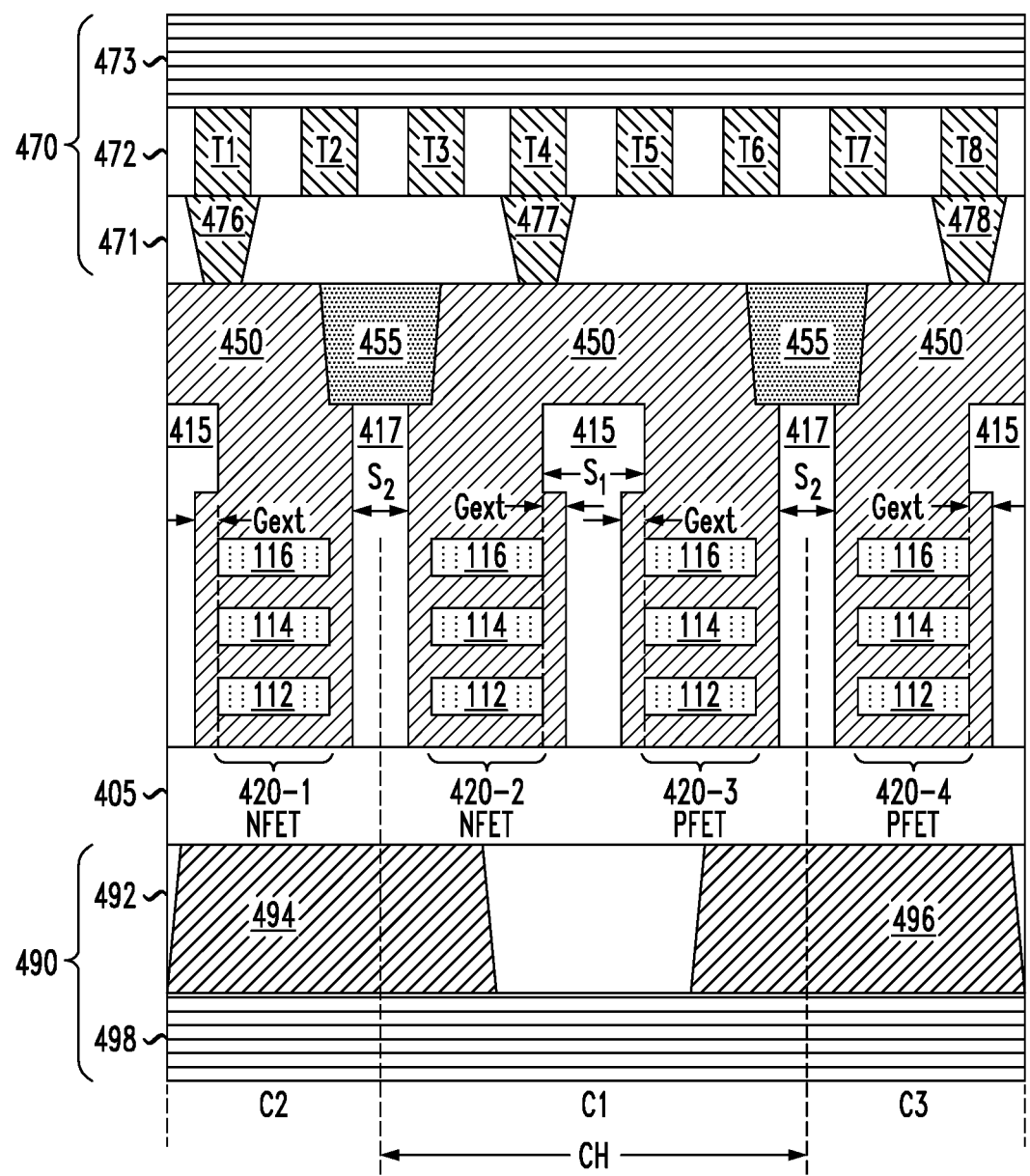

FIGS. 17A and 17B are schematic views of a semiconductor integrated circuit device 400 which implements backside power rails and a backside power distribution network to enable density scaling, according to another exemplary embodiment of the disclosure. The semiconductor integrated circuit device 400 is similar to the semiconductor integrated circuit device 300 (FIGS. 10A and 10B) as discussed above, except that the semiconductor integrated circuit device 400 enable further scaling of the cell-to-cell spacing by utilizing forksheet FET devices in conjunction with self-aligned dielectric isolation structures for (i) precisely controlling the sizes of the gate extensions $G_{ext}$ of FET devices and (ii) precising controlling the size of the dielectric isolation that is formed in the cell boundary regions between N-type forksheet FET pairs and P-type forksheet FET pairs of adjacent FET devices of adjacent cells, to thereby precisely control cell-to-cell spacing between adjacent cells.

Similar to the exemplary semiconductor integrated circuit 300 of FIGS. 10A and 10B, the semiconductor integrated circuit device 400 comprises a plurality of cells C1, C2, and C3, wherein the cells C1, C2, and C3 comprise a plurality of nanosheet FET devices 420-1, 420-2, 420-3, and 420-4, which are disposed on a BOX layer 405. In some embodiments, the nanosheet FET devices 420-1 and 420-2 comprise NFET devices, and the nanosheet FET devices 420-3 and 420-4 comprise PFET devices. The NFET devices 420-1 and 420-2 comprise source/drain elements 422, and the PFET devices 420-3 and 420-4 comprises source/drain elements 424. Further, in an exemplary embodiment, the nanosheet FET devices 420-1, 420-2, 420-3, and 420-4 each comprise a stacked nanosheet channel structure comprising three active nanosheet channel layers 112, 114, and 116.

In addition, similar to the exemplary semiconductor integrated circuit device 300 of FIGS. 10A and 10B, a frontside of the semiconductor integrated circuit device 400 shown in FIGS. 17A and 17B further comprises an ILD layer 440, metal gates 450 (which encapsulate the stacked nanosheet channel structures of the nanosheet FET devices 420-1, 420-2, 420-3, and 420-4), frontside source/drain contacts 460 and 461, and a BEOL interconnect structure 470. The BEOL interconnect structure 470 comprises dielectric layers 471 and 472 which comprise a first metallization level, and additional BEOL metallization levels 473 disposed over the first level of metallization. The dielectric layer 471 comprises a plurality of via contacts 474, 475, 476, 477, and 478 formed therein, and the dielectric layer 472 comprises a first metallization level M1 (or initial metallization level sometimes denoted M0 or Mint) which comprises a plurality of metal tracks T1, T2, T3, T4, T5, T6, T7, and T8. In some embodiments, the metal tracks T1-T8 provide local interconnects that distribute signals to, from, and between the nanosheet FET devices 420-1, 420-2, 420-3, and 420-4, while the upper metal levels 473 of the BEOL interconnect structure 470 comprise semi-global and global wiring. As shown in FIG. 17A, the via contacts 474 and 475 connect the respective frontside source/drain contacts 460 and 461 to the respective metal tracks T3 and T6 the first metallization level. In addition, as shown in FIG. 17B, the via contacts 476, 477, and 478 connect the respective metal gates 450 to respective metal tracks T1, T4, and T8 of the first metallization level. In some embodiments, the metal gates 4350 comprise high-k metal gate structures.

Further, similar to the exemplary semiconductor integrated circuit device 300 of FIGS. 10A and 10B, a backside of the semiconductor integrated circuit device 400 shown in FIGS. 17A and 17B comprises backside source/drain contacts 481 and 482 (which are formed in the BOX layer 405), and a full backside power delivery structure 490. The full backside power delivery structure 490 comprises a backside dielectric layer 492 formed on the BOX layer 405, a plurality of backside power rails 494 and 496 formed in the backside dielectric layer 492, and a backside power distribution network 498. The backside source/drain contact 481 connects the source/drain element 422 of the NFET device 420-1 of the cell C2 to the backside power rail 494, and the backside source/drain contact 482 connects the source/drain element 424 of the PFET device 420-4 of the cell C3 to the backside power rail 494. The backside power distribution network 498 comprises one or more levels wiring that is configured to distribute positive power supply voltage (e.g., VDD) and negative power supply voltage (e.g., VSS, ground (GND)=0V) to the backside power rails 494 and 496. For example, in an exemplary embodiment, the backside power distribution network 498 connects negative supply voltage (VSS) to the backside power rail 494, and connects positive supply voltage (VDD) to the backside power rail 496.

As further shown in FIGS. 17A and 17B, the semiconductor integrated circuit device 400 comprises a plurality of self-aligned dielectric isolation elements 415 and 417, and upper gate cut elements 455 which are formed in alignment with the self-aligned dielectric isolation elements 417 in the cell boundary regions to isolate the metal gates 450 of the nanosheet FET devices in adjacent cells. The self-aligned dielectric isolation elements 415 have wider upper portions disposed above the stacks of nanosheet channel layers, 112, 114, and 116, and narrower lower portions that are disposed between the stacks of nanosheet channel layers 112, 114, and 116. As shown in FIG. 17B, the self-aligned dielectric isolation elements 415 serve to precisely control the size of gate extensions $G_{ext}$ of the nanosheet FET devices 420-1, 420-2, 420-3, and 420-4, as discussed above.

On the other hand, the self-aligned dielectric isolation elements 417 serve as dielectric walls of a forksheet FET device formed by an adjacent pair of NFET devices 420-1 and 420-2 of the adjacent cells C2 and C1, and a forksheet FET device formed by an adjacent pair of PFET devices 420-3 and 420-4 of the adjacent cells C1 and C3. With this exemplary structure configuration, the self-aligned dielectric isolation elements 417 (alternatively, forksheet dielectric walls 417) are formed to have a controlled thickness which defines the cell-to-cell spacing $S_2$ between the adjacent cells C1 and C2, and C1 and C3, which allows tighter spacing between the adjacent NFET devices 420-1 and 420-2, and between the adjacent PFET devices 420-3 and 420-4, and thus reduced cell height and reduced cell-to-cell spacing. For example, in a non-limiting exemplary embodiment, the cell-to-cell spacing $S_2$ as shown in FIG. 17B can be scaled down to about 10 nm. The aggressive scaling in this regard is further facilitated by the implementation of the full backside power delivery structure 490 as shown in FIG. 17A, wherein the source/drain elements 422 of the adjacent pair of NFET devices 420-1 and 420-2 are connected to the backside source/drain contact 481 and the frontside source/drain contact 460, respectively, which avoids shorting of the source/drain contacts for reasons as discussed above.

Figure 18:
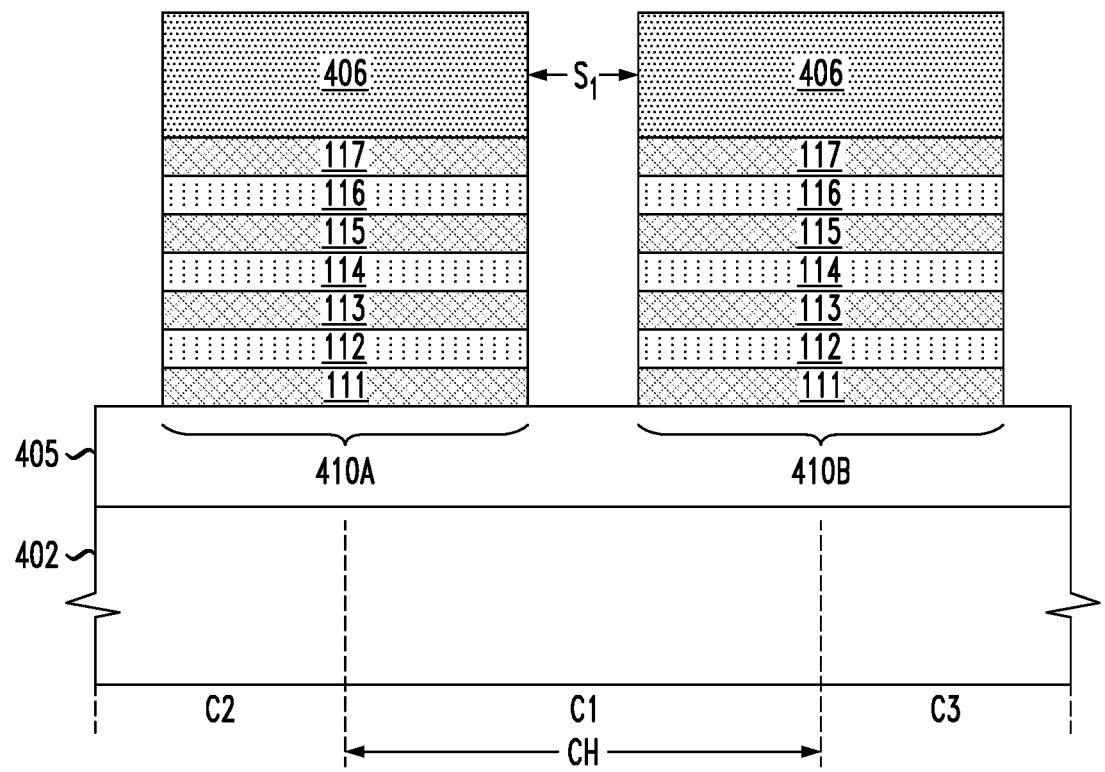
Figure 19:
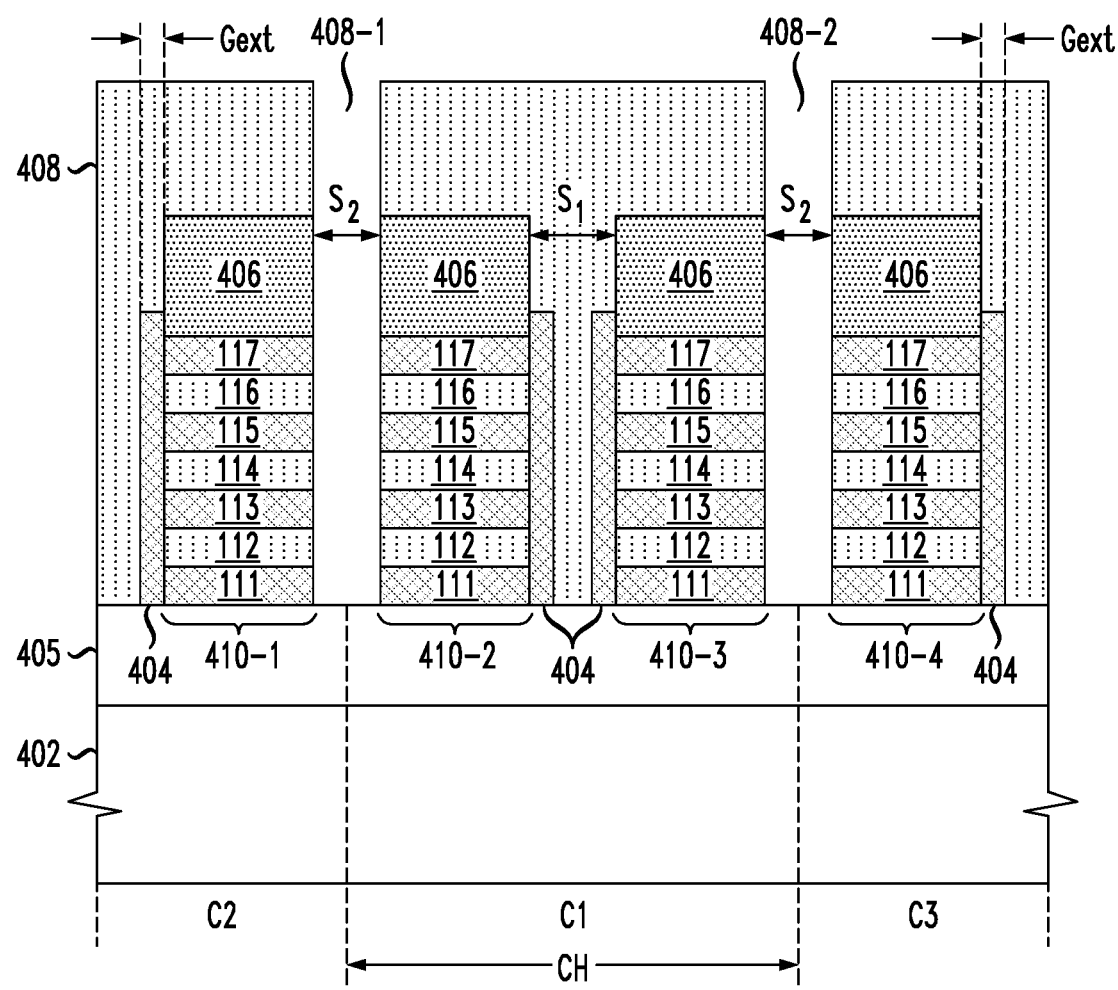
Figure 20:
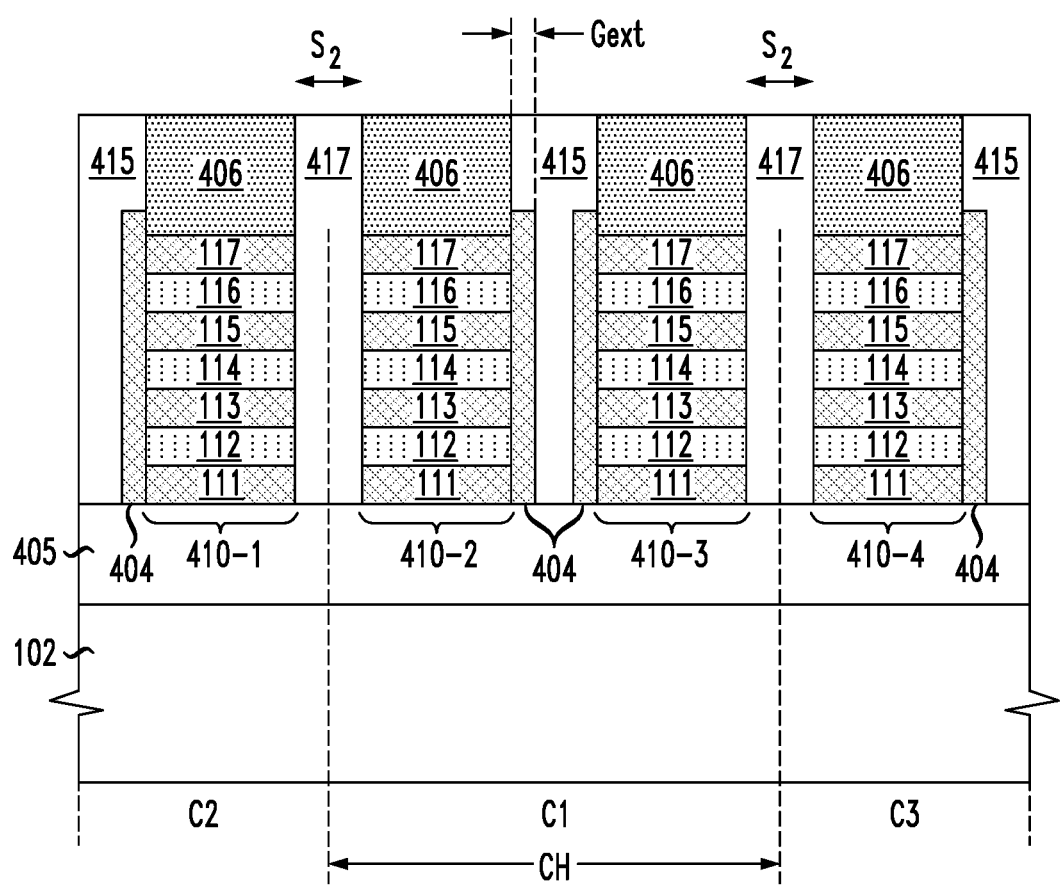

FIGS. 18-20 schematically illustrate a method for fabricating the semiconductor integrated circuit device 400 of FIGS. 17A and 17B, according to another exemplary embodiment of the disclosure. It is to be understood that the process for fabricating the semiconductor integrated circuit device 400 is the same or similar to the process flow for fabricating the semiconductor integrated circuit devices 10 and 300 as discussed above, the details of which will not be repeated. Instead, the process flow schematically shown in FIGS. 18-20 show additional or slightly varied process steps that are utilized in conjunction with the previous process flows as discussed above, for fabricating the semiconductor integrated circuit device 400.

To begin, FIG. 18 is a schematic cross-sectional side view (X-Z plane) of an intermediate structure of the semiconductor integrated circuit device 400 at an intermediate stage of fabrication, which comprises a semiconductor substrate 402, an insulating layer 405 (e.g., BOX layer 405), a plurality of patterned nanosheet stack structures 410A and 410B disposed on the insulating layer 405, and hard mask layers 406 disposed on top of the patterned nanosheet stack structures 410A and 410B. With this fabrication process, a first nanosheet patterning process is performed to define the N-to-P spacing, $S_1$ of the complementary FET devices in the cells. In the exemplary embodiment of FIG. 18, the patterned nanosheet stack structures 410A and 410B comprise nanosheet stacks that are utilized to form the N-N forksheet FET devices and the P-P forksheet FET devices, respectively, which span the cell boundaries.

Next, FIG. 19 is a schematic cross-sectional side view of a next intermediate structure of the semiconductor integrated circuit device, which is constructed by forming sacrificial spacer layers 404 on sidewalls of the patterned nanosheet stack structures 410A and 410B, and further patterning the nanosheet stack structures 410A and 410B to form patterned nanosheet stack structures 410-1, 410-2, 410-3, and 410-4, according to an exemplary embodiment of the disclosure. The sacrificial spacer layers 404 are formed using the same or similar materials and techniques as discussed above in conjunction with FIG. 12. The sacrificial spacer layers 404 are formed with a thickness that is equal to a target gate extension length $G_{ext}$.

Following formation of the sacrificial spacer layers 404 on sidewalls of the patterned nanosheet stack structures 410A and 410B, another nanosheet patterning process is performed to form trenches in the patterned nanosheet stack structures 410A and 410B and thereby the patterned nanosheet stack structures 410-1, 410-2, 410-3, and 410-4, which define the gate width $W_G$ of the FET devices of the cells. For example, in some embodiment as shown in FIG. 19, an organic planarizing layer 408 is deposited and patterned to form openings 408-1 and 408-2 that are used to etch down the exposed portions of the nanosheet stack structures 410A and 410B and form the patterned nanosheet stack structures 410-1, 410-2, 410-3, and 410-4. As shown in FIG. 19, the openings 408-1 and 408-2 have width that defines a thickness of the dielectric walls 417 of the forksheet FET devices, wherein thickness of the dielectric walls 417 defines the cell-to-cell spacing $S_2$ between adjacent cells.

Next, FIG. 20 is a schematic cross-sectional side view of a next intermediate structure of the semiconductor integrated circuit device, which is constructed by forming the self-aligned dielectric isolation elements 415 and 417 between the patterned nanosheet stack structures 410-1, 410-2, 410-3, and 410-4, according to an exemplary embodiment of the disclosure. In some embodiments, the self-aligned dielectric isolation elements 415 and 417 are formed using the same materials and process steps as discussed above in conjunction with FIG. 13. Following formation of the intermediate structure shown in FIG. 20, additional frontside and backside process modules are performed using the same or similar materials and process steps as discussed above to form the resulting semiconductor integrated circuit device 400 of FIGS. 17A and 17B.

It is to be understood that the exemplary methods discussed herein for fabricating stacked complementary transistor structures can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit as disclosed herein can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the exemplary embodiments described herein. Given the teachings of the invention provided herein, one of ordinary skill in the art will be able to contemplate other implementations and applications of the exemplary techniques disclosed herein.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A device comprising:
   a first cell comprising a first transistor;
   a second cell comprising a second transistor, wherein the first and second cells are disposed adjacent to each other with the first and second transistors disposed adjacent to each other; and
   an isolation structure disposed in a cell boundary region between the first and second cells;
   wherein the isolation structure comprises a first portion disposed above first and second active channel structures of the respective first and second transistors, and a second portion disposed between the first and second active channel structures;
   wherein the first portion of the isolation structure comprises a first width which is substantially equal to a spacing between the first and second active channel structures;
   wherein the second portion of the isolation structure comprises a second width which is less than the first width;
   wherein a first space between the second portion of the isolation structure and the first active channel structures of the first transistor comprises metallic material of a first metal gate structure of the first transistor, and a second space between the second portion of the isolation structure and the second active channel structures of the second transistor comprises metallic material of a second metal gate structure of the second transistor; and
   wherein the first space and the second space define respective gate extension lengths of the first and second transistors.

2. The device of claim 1, wherein the second width is no greater than about 10 nanometers, and wherein the gate extension lengths are no greater than about 10 nanometers.

3. The device of claim 1, further comprising a gate cut element disposed on the first portion of the isolation structure, wherein the gate cut element and the isolation structure are configured to isolate the first and second metal gate structures of the respective first and second transistors.

4. The device of claim 3, wherein the gate cut element is disposed within the metallic material of the first and second metal gate structures.

5. The device of claim 1, wherein the first and second transistors comprise one of an adjacent pair of N-type field-effect transistors and an adjacent pair of P-type field-effect transistors.

6. The device of claim 1, wherein the first and second active channel structures comprise stacked active nanosheet channel structures.

7. The device of claim 1, further comprising:
   a first interconnect structure;
   a second interconnect structure;
   a first contact connecting a source/drain element of the first transistor to the first interconnect structure; and
   a second contact connecting a source/drain element of the second transistor to the second interconnect structure;
   wherein the first and second cells are disposed between the first and second interconnect structures.

8. The device of claim 7, wherein:
   the first interconnect structure comprises a signal network; and
   the second interconnect structure comprises a power distribution network.

9. The device of claim 7, further comprising a lateral interconnect which extends from the first cell to the second cell, wherein the lateral interconnect is disposed between the first interconnect structure and the source/drain element of the second transistor in the second cell, and wherein the lateral interconnect connects the first contact to a signal track of the first interconnect structure in the second cell.

10. A device, comprising:
    a first cell comprising a first transistor which comprises a first stack of channel layers;
    a second cell comprising a second transistor which comprises a second stack of channel layers;
    wherein the first and second cells are disposed adjacent to each other;
    wherein the first and second transistors comprise a fork-sheet field-effect transistor pair with an insulating wall disposed between the first and second stack of channel layers of the respective first and second transistors;
    wherein the insulating wall is aligned to a cell boundary between the first and second cells; and
    wherein a width of the insulating wall disposed between the first and second stack of channel layers of the respective first and second transistors defines a cell-to-cell spacing between the first and second cells.

11. The device of claim 10, wherein the first and second transistors comprise one of a pair of N-type nanosheet field-effect transistors and a pair of P-type nanosheet field-effect transistors.

12. The device of claim 10, further comprising:
    a first interconnect structure;
    a second interconnect structure;
    a first contact connecting a source/drain element of the first transistor to the first interconnect structure; and
    a second contact connecting a source/drain element of the second transistor to the second interconnect structure;
    wherein the first and second cells are disposed between the first and second interconnect structures.

* * * * *